United States Patent
Yoshimura et al.

(10) Patent No.: US 8,169,051 B2
(45) Date of Patent: May 1, 2012

(54) SEMICONDUCTOR DEVICE INCLUDING CAPACITOR ELEMENT AND METHOD OF MANUFACTURING THE SAME

(75) Inventors: Tetsuo Yoshimura, Kawasaki (JP); Kenichi Watanabe, Kawasaki (JP); Satoshi Otsuka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 221 days.

(21) Appl. No.: 12/539,723

(22) Filed: Aug. 12, 2009

(65) Prior Publication Data

US 2009/0294902 A1 Dec. 3, 2009

Related U.S. Application Data

(63) Continuation of application No. PCT/JP2007/055673, filed on Mar. 20, 2007.

(51) Int. Cl.
*H01L 29/92* (2006.01)

(52) U.S. Cl. . 257/532; 257/534; 257/535; 257/E27.034; 257/E27.048

(58) Field of Classification Search ................ None
See application file for complete search history.

(56) References Cited

U.S. PATENT DOCUMENTS

| | | | |
|---|---|---|---|
| 5,717,236 A | 2/1998 | Shinkawata | |
| 6,614,643 B1 | 9/2003 | Morita et al. | |
| 6,717,193 B2 | 4/2004 | Olewine et al. | |
| 6,774,425 B2 | 8/2004 | Lachner et al. | |
| 6,998,712 B2 | 2/2006 | Okada et al. | |
| 7,008,841 B2 | 3/2006 | Kim et al. | |
| 7,084,042 B2 | 8/2006 | Olewine et al. | |
| 7,154,162 B2 | 12/2006 | Ahn et al. | |
| 7,183,170 B2 | 2/2007 | Nakamura et al. | |
| 7,190,045 B2 | 3/2007 | Egashira et al. | |
| 7,199,001 B2 | 4/2007 | Wu et al. | |
| 7,288,799 B2 | 10/2007 | Saigoh et al. | |
| 2003/0052335 A1 | 3/2003 | Lachner et al. | |
| 2004/0075131 A1 | 4/2004 | Ahn et al. | |
| 2004/0150070 A1 | 8/2004 | Okada et al. | |
| 2004/0219757 A1 | 11/2004 | Olewine et al. | |

(Continued)

FOREIGN PATENT DOCUMENTS

JP 8-316430 A 11/1996

(Continued)

OTHER PUBLICATIONS

Korean Office Action dated Mar. 21, 2011, issued in corresponding Korean Patent Application No. 10-2009-7017852.

(Continued)

*Primary Examiner* — Minh-Loan T Tran
(74) *Attorney, Agent, or Firm* — Westerman, Hattori, Daniels & Adrian, LLP

(57) ABSTRACT

A semiconductor device includes a substrate, an insulating film formed over the substrate, first and second conductive plugs formed in the insulating film, a capacitor element, and a wiring. The capacitor element includes a lower electrode, a dielectric film, and an upper electrode. The lower electrode is connected to an end of the first plug and formed on the insulating film, and includes a first barrier film. The dielectric film is formed on upper and side surfaces of the lower electrode. The upper electrode is formed on the dielectric film, and includes a second barrier metal film being wider than the lower electrode. The wiring is connected to an end of the second plug and formed on the insulating film, and includes a first layer and a second layer formed on the first layer. The first and second layers include the first and second barrier metal films, respectively.

8 Claims, 41 Drawing Sheets

U.S. PATENT DOCUMENTS

| | | |
|---|---|---|
| 2004/0253783 A1 | 12/2004 | Egashira et al. |
| 2005/0098893 A1 | 5/2005 | Tsutsue et al. |
| 2005/0118762 A1 | 6/2005 | Nakamura et al. |
| 2005/0127395 A1 | 6/2005 | Saigoh et al. |
| 2005/0130369 A1 | 6/2005 | Kim et al. |
| 2005/0215004 A1 | 9/2005 | Wu et al. |
| 2006/0060972 A1 | 3/2006 | Kim et al. |
| 2006/0289917 A1 | 12/2006 | Fujiwara et al. |
| 2007/0072319 A1 | 3/2007 | Ahn et al. |

FOREIGN PATENT DOCUMENTS

| | | |
|---|---|---|
| JP | 2000-183312 A | 6/2000 |
| JP | 2002-217373 A | 8/2002 |
| JP | 2003-526927 A | 9/2003 |
| JP | 2003-318269 A | 11/2003 |
| JP | 2004-297022 A | 10/2004 |
| JP | 2004-303908 A | 10/2004 |
| JP | 2005-128299 A | 5/2005 |
| JP | 2005-167198 A | 6/2005 |
| JP | 2005-175491 A | 6/2005 |
| JP | 2006-210952 A | 8/2006 |
| JP | 2006-253268 A | 9/2006 |
| JP | 2007-005719 A | 1/2007 |
| KR | 20050057705 A | 6/2005 |
| KR | 20050058182 A | 6/2005 |
| KR | 10-0688686 B1 | 2/2007 |
| TW | 231973 B | 5/2005 |
| TW | 236097 B | 7/2005 |
| TW | 248174 B | 1/2006 |
| TW | 256729 B | 6/2006 |

OTHER PUBLICATIONS

International Search Report of PCT/JP2007/055673, Mailing Date of Jun. 26, 2007.

Taiwanese Office Action dated Aug. 28, 2010, issued in corresponding Taiwanese Patent Application No. 096109529.

Korean Office Action dated Nov. 30, 2011, issued in corresponding Korean Patent Application No. 10-2009-7017852.

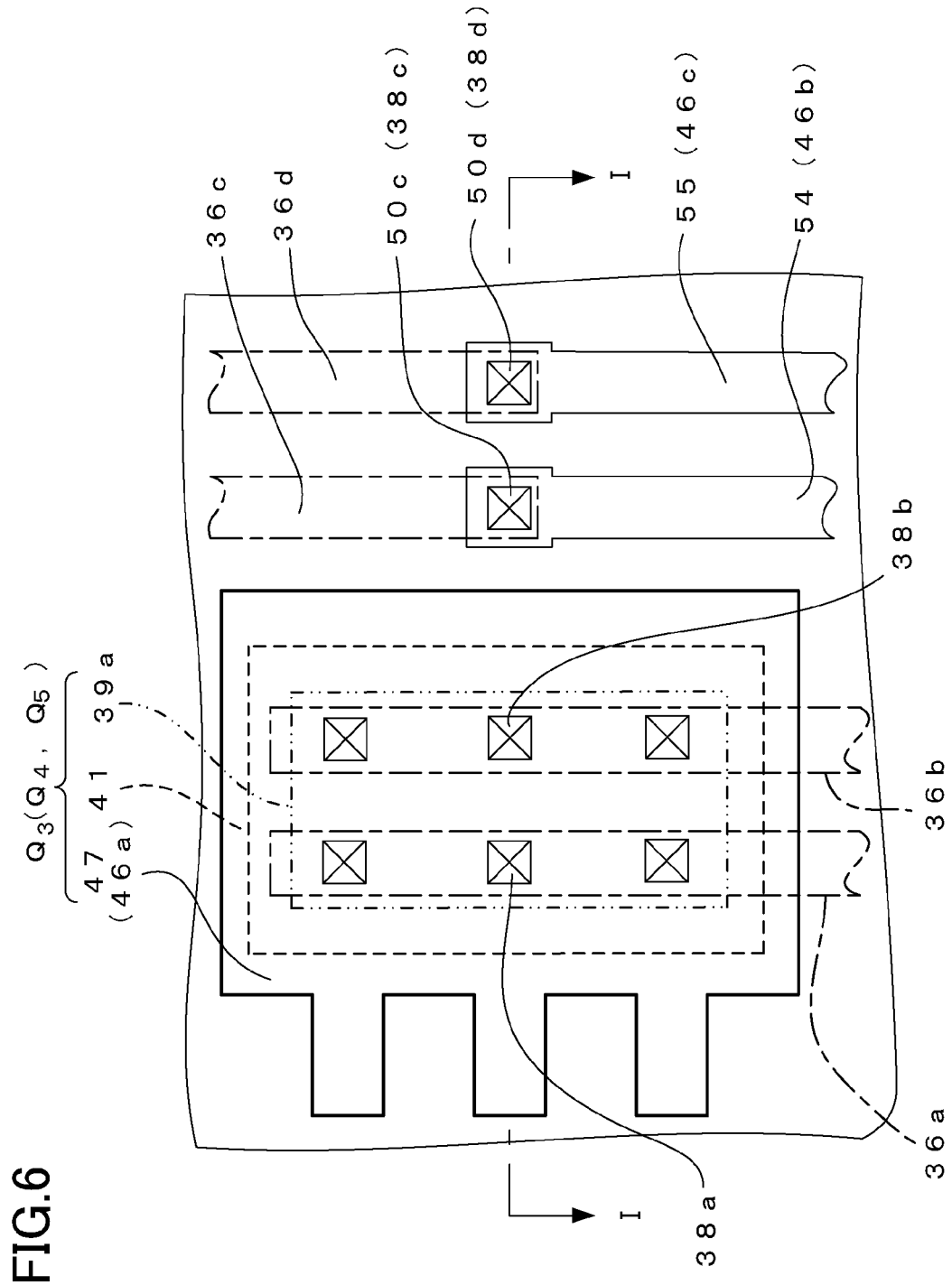

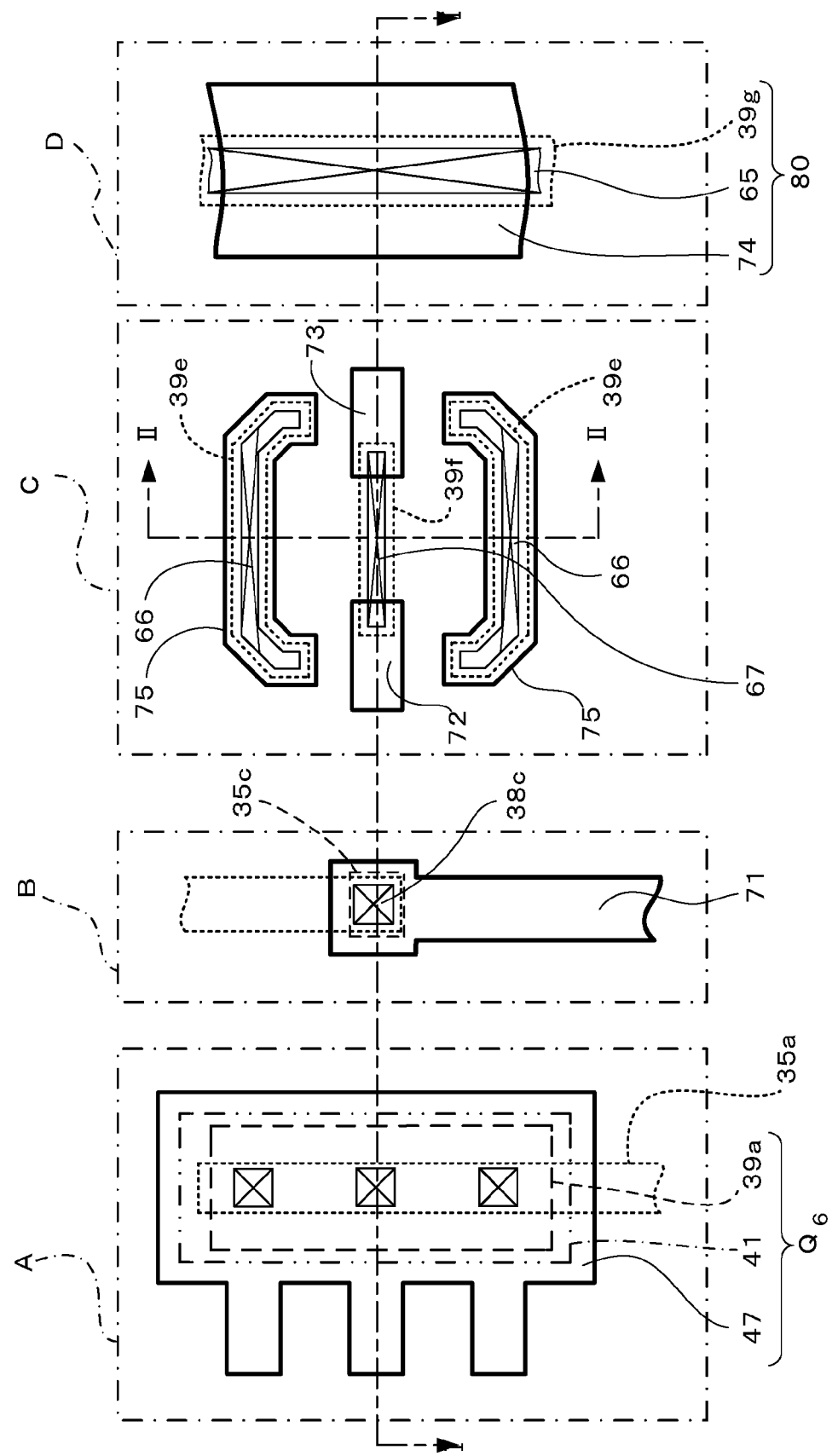

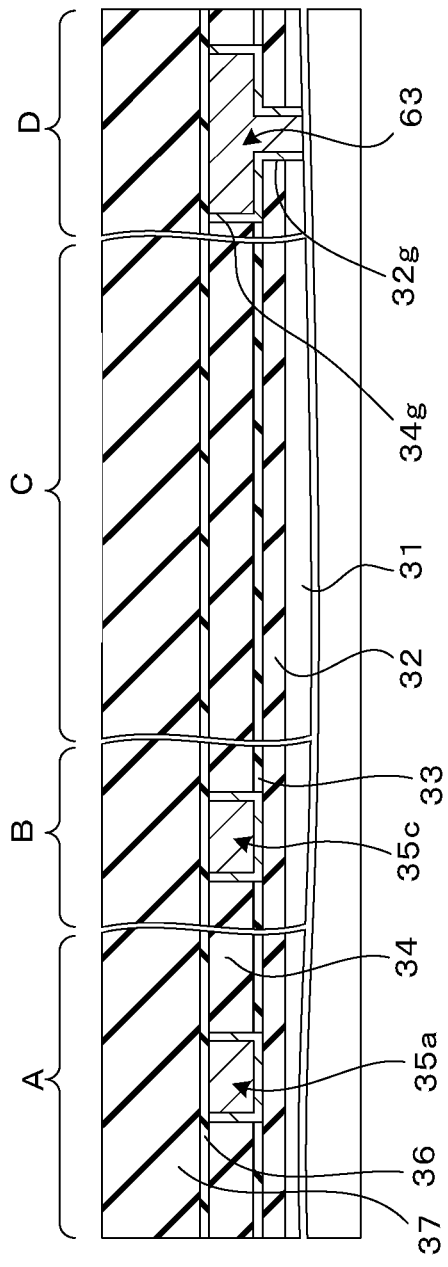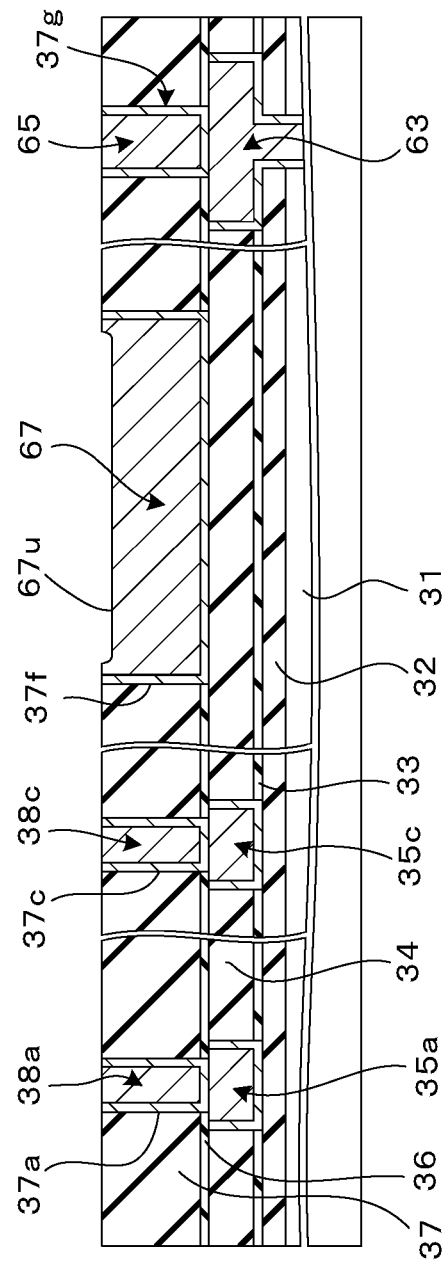
FIG.13A
FIG.13B

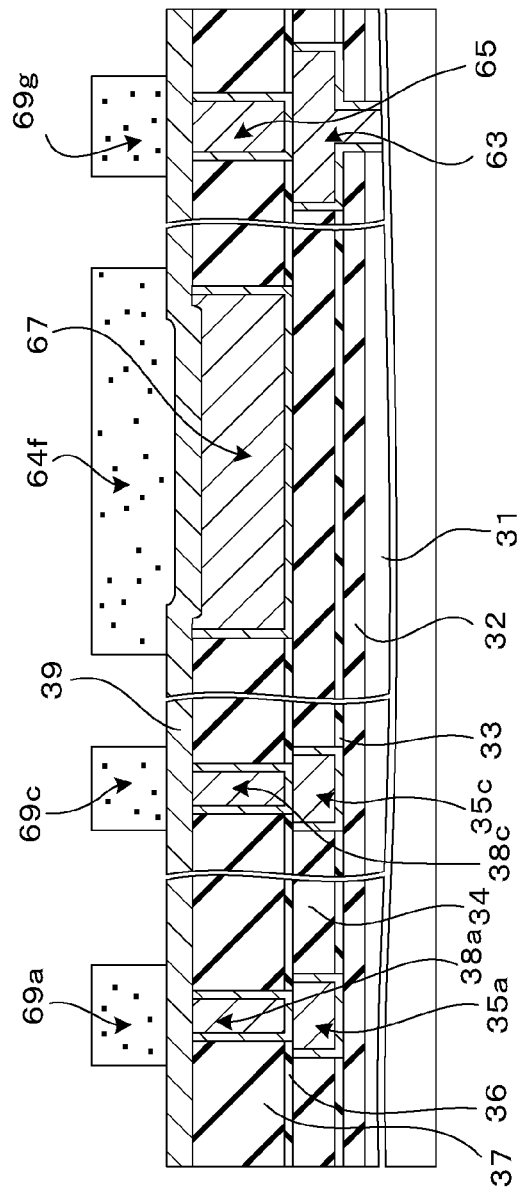
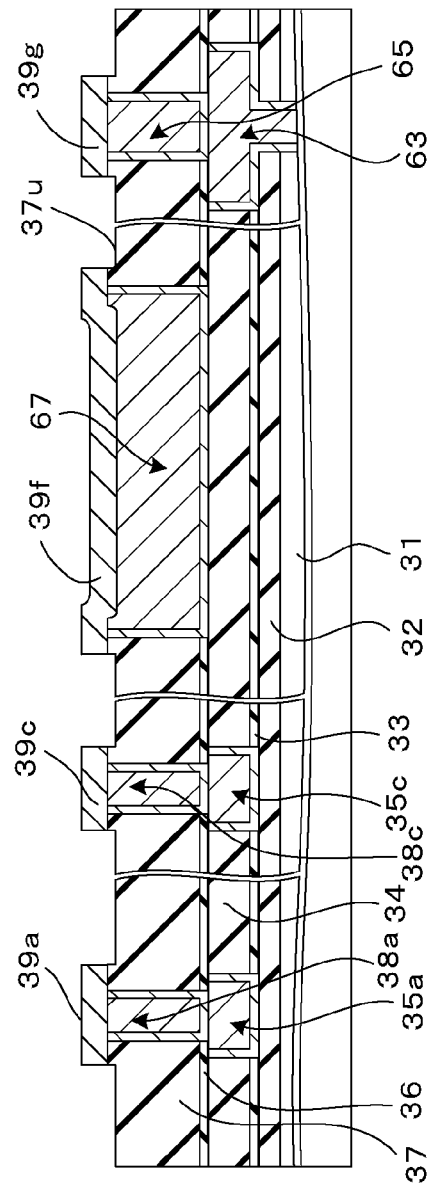
FIG.13C
FIG.13D

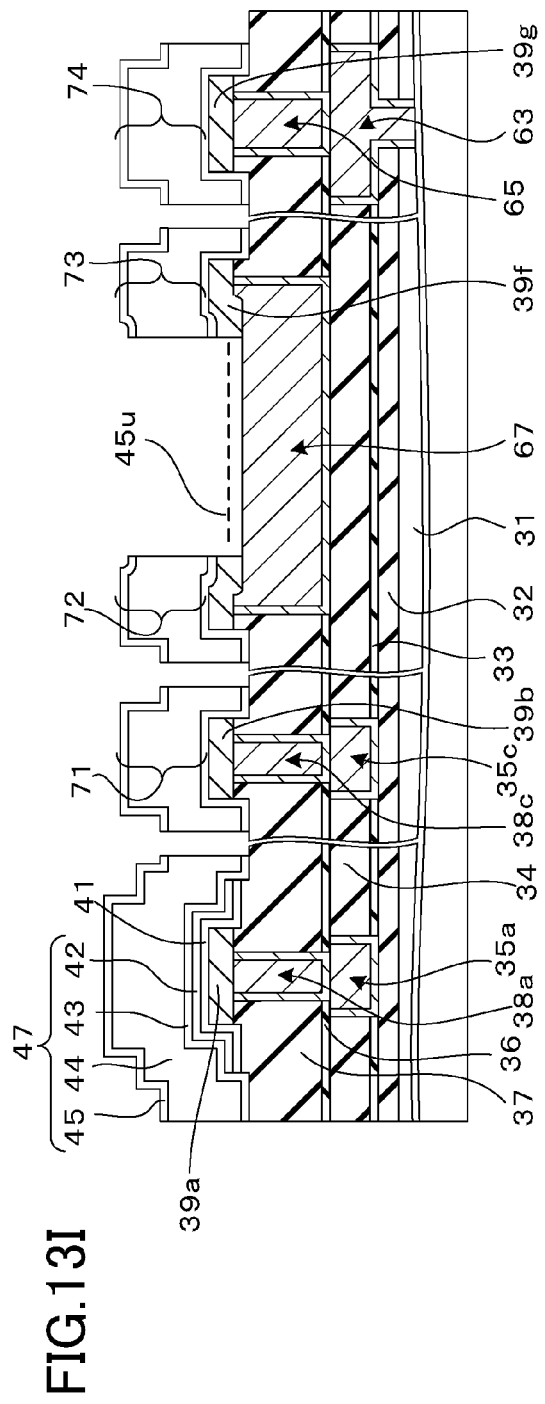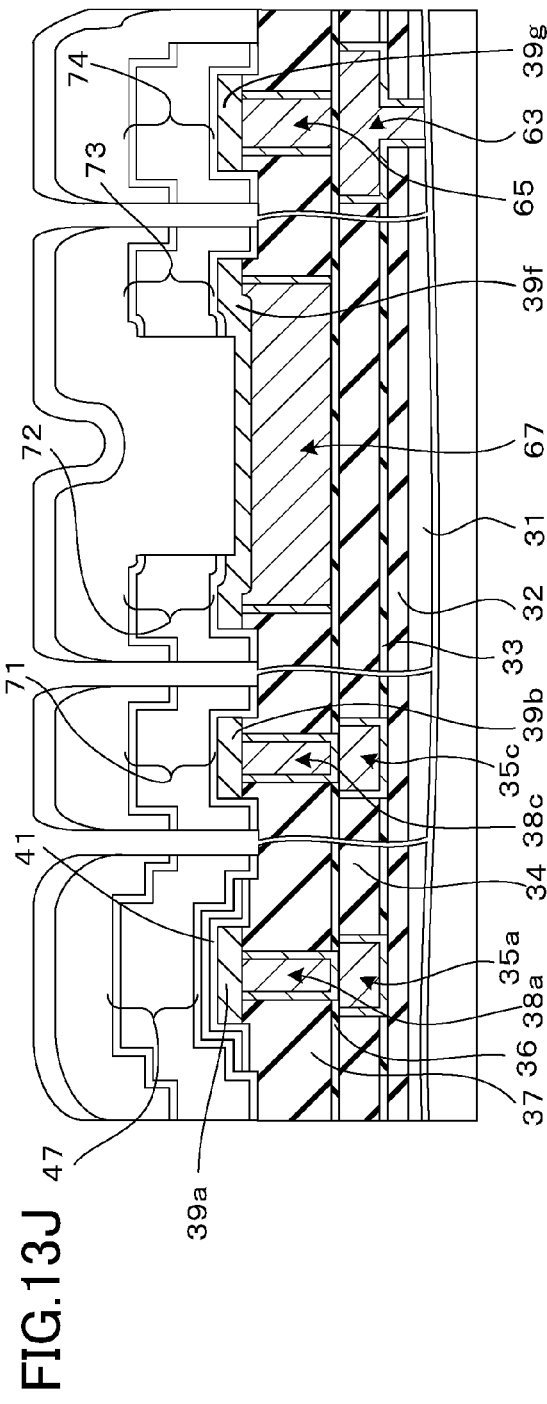

US 8,169,051 B2

SEMICONDUCTOR DEVICE INCLUDING CAPACITOR ELEMENT AND METHOD OF MANUFACTURING THE SAME

This application is a continuation application of international application PCT/JP2007/55673, filed on Mar. 20, 2007.

FIELD

A certain aspect of the embodiments discussed herein is related generally to a semiconductor device and a method of manufacturing the same, and in particular to a semiconductor device including an MIM capacitor element with such a structure that an insulating film is formed between a lower metal film and an upper metal film, and a method of manufacturing the same.

BACKGROUND

As a capacitor element for a high-frequency analog integrated circuit which is required to have a high-speed operation, an MIM (Metal-Insulator-Metal) capacitor element may be employed. The MIM capacitor element can have a more reduced parasitic resistance and parasitic capacitance than a MOS (Metal Oxide Semiconductor) capacitor element.

For example, Japanese Laid-open Patent Application Publication No. JP 2003-318269-A describes an MIM capacitor element. The MIM capacitor element includes a structure that has a lower electrode film made of aluminum copper (AlCu) formed on an interlayer insulating film, a dielectric film formed on the lower electrode film, and an upper electrode film formed on the dielectric film.

For example, Japanese Laid-open Patent Application Publication No. JP 2004-303908-A describes an MIM capacitor element. When an AlCu film formed on an interlayer insulating film that covers a substrate is patterned, wirings are formed on the interlayer insulating film and simultaneously an upper electrode of the MIM capacitor element is formed.

For example, Japanese Laid-open Patent Application Publication No. JP 2006-210952-A describes an MIM capacitor element with a structure similar to that described in Japanese Laid-open Patent Application Publication No. JP 2004-303908-A above. In the MIM capacitor element, a thickness of a capacitor lower electrode can be reduced thinner than a thickness of a capacitor upper electrode, and a contact connected to the capacitor lower electrode is formed in an underlying interlayer insulating film.

In the MIM capacitor elements described in Japanese Laid-open Patent Application Publications No. JP 2004-303908-A and No. JP 2006-210952-A above, the capacitor lower electrode, the capacitor insulating film, and the capacitor upper electrode have the same planar shape respectively.

Japanese Laid-open Patent Application Publication No. JP 2003-526927-A describes an MIM capacitor. The MIM capacitor has a capacitor lower electrode and a dielectric film, both having the same planar shape, and a capacitor upper electrode formed on the dielectric film to have a narrower planar shape than the dielectric film.

SUMMARY

According to an aspect of the embodiment, a semiconductor device includes a semiconductor substrate, an insulating film formed over the semiconductor substrate, a first conductive plug formed in the insulating film, a second conductive plug formed in the insulating film, a capacitor element, and a wiring. The capacitor element includes a capacitor lower electrode connected to one end of the first conductive plug and formed on the insulating film, a dielectric film formed on an upper surface and side surfaces of the capacitor lower electrode, and a capacitor upper electrode formed on the dielectric film. The capacitor lower electrode includes a first barrier film. The capacitor upper electrode includes a second barrier metal film that is wider than the capacitor lower electrode. The wiring is connected to one end of the second conductive plug and formed on the insulating film, and includes a first layer and a second layer formed on the first layer. The first layer includes the first barrier metal film. The second layer includes the second barrier metal film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 6 is an example of a plan view illustrating third to fifth semiconductor devices, according to the third embodiment of the invention;

FIG. 12 is an example of a plan view illustrating a semiconductor device, according to a sixth embodiment of the invention;

FIGS. 13A to 13J are an example of sectional views illustrating the semiconductor device and steps of forming the same, according to the sixth embodiment of the invention, when viewed from a I-I line in FIG. 12;

DESCRIPTION OF THE PREFERRED EMBODIMENTS

Figure 16:
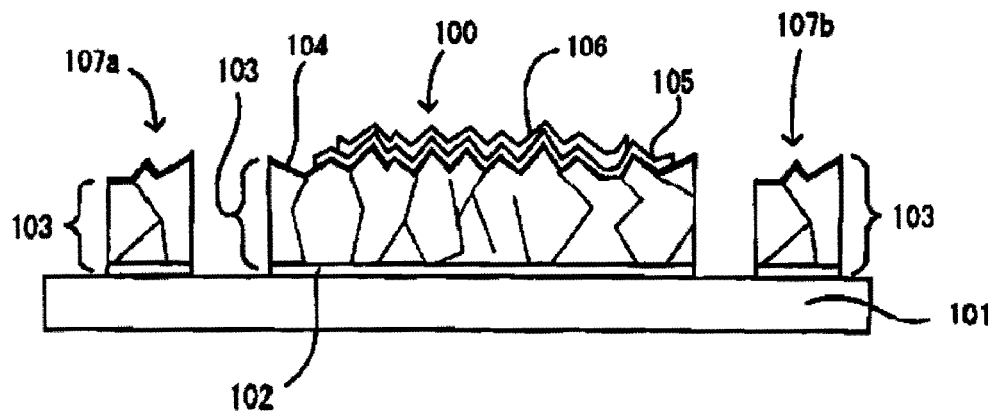
FIG. 16 is a sectional view illustrating a semiconductor device in the first prior art.

As illustrated in FIG. 16, for example, an MIM capacitor element 100 as described in Japanese Laid-open Patent Application Publication No. JP 2003-318269-A above may be formed via processes such that a first barrier metal film 102, an AlCu film 103, a second barrier metal 104, a dielectric film 105, and an upper electrode film 106 are formed in this order over an interlayer insulating film 101, and then the upper electrode film 106 and the dielectric film 105 are patterned separately.

Generally, the AlCu film 103 used as a lower electrode film of the MIM capacitor element 100 is formed by the sputtering, and has a polycrystalline structure. Thus, respective sizes of its crystals are non-uniform, and respective depths of pits formed by crystal grain boundaries are irregularly varied. Thus, irregular pits and projections are formed on a surface of the AlCu film 103. Such irregular pits and projections appear more significant, as the AlCu film 103 becomes thicker.

Meanwhile, wirings 107a and 107b are formed in side areas of the MIM capacitor element 100 by patterning the first barrier metal film 102, the AlCu film 103, and the second barrier metal 104. In this case, the AlCu film 103 is formed thicker to reduce resistances of the wirings 107a and 107b. Thus, differences between the irregular pits and the projections on the surface of the AlCu film 103 are increased.

As differences between the irregular pits and the projections on the AlCu film 103 are increased, a film thickness of the dielectric film 105 formed thereon becomes uneven. Thus, an electric field concentration may be occur at different portions of the film, so that leakage currents may flow through such portions or dielectric breakdown of the dielectric film 105 may occur at the projections.

Figure 17A:
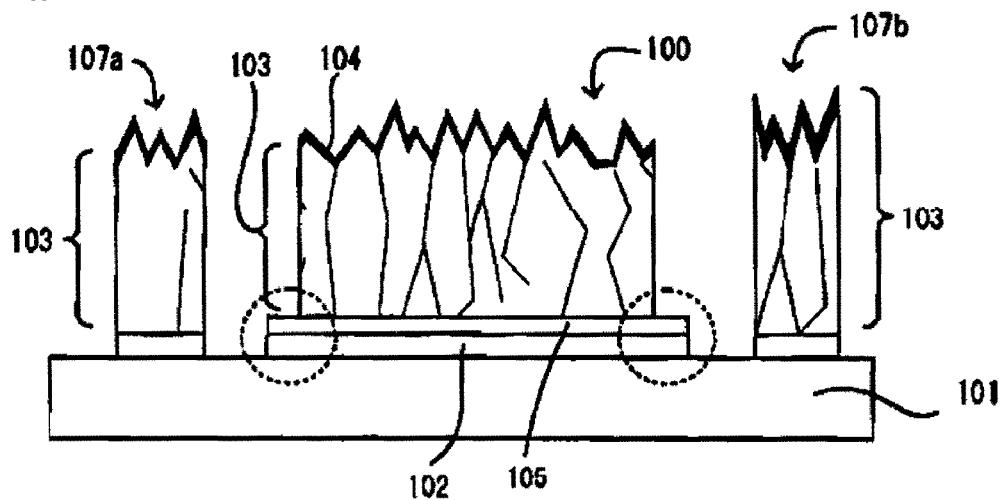
FIGS. 17A and 17B are sectional views illustrating a semiconductor device in the second and third prior arts, respectively.

In contrast, an MIM capacitor element 100 as described in Japanese Laid-open Patent Application Publications No. JP 2004-303908-A and No. JP 2006-210952-A above may have a structure as illustrated in FIG. 17A, such that a dielectric film 105 is formed between the AlCu film 103 and the underlying first barrier metal film 102. Thus, the dielectric film 105 is not adversely affected by an unevenness upper surface of the AlCu film 103. In this structure, the first barrier metal film 102 serves as the lower electrode and the AlCu film 103 serves as the upper electrode.

However, as a thickness of the AlCu film 103 is more increased, control of a terminating point of the etching on the AlCu film 103 becomes more difficult. In this case, when the AlCu film 103 is etched insufficiently, a leakage current may increase in the lateral direction.

Figure 17B:
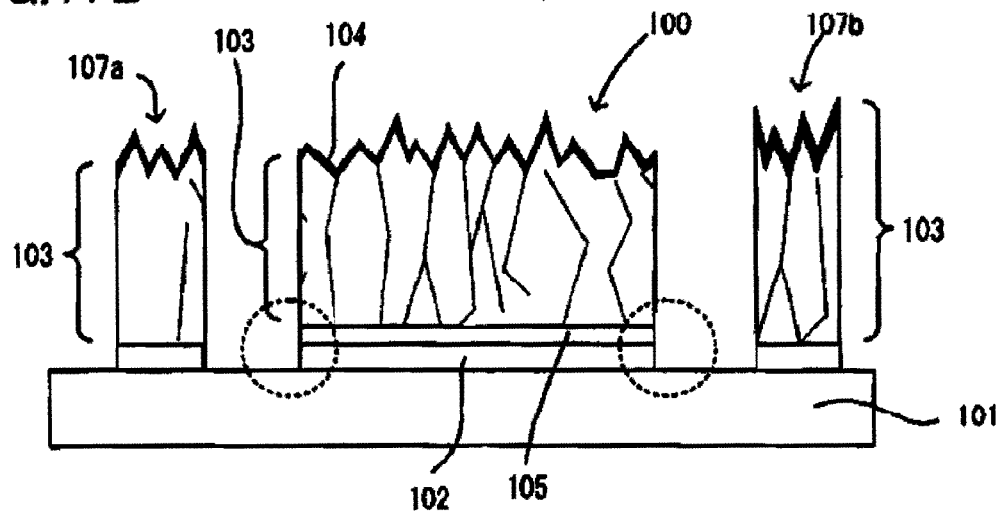

In contrast, when the AlCu film 103 is etched excessively, edge portions of the dielectric film 105 are also etched subsequently to the AlCu film 103 as illustrated in FIG. 17B, and hence the AlCu film 103 and the dielectric film 105 may caused to have the same shape. As a result, the AlCu film 103 as upper electrode comes close to the first barrier metal film 102 as a lower electrode at edge portions of the dielectric film 105, and hence a leakage current may flow between the electrodes at their edge portions.

In particular, as the dielectric film 105 is adapted to be thinner to increase the charge capacity of the MIM capacitor element 100, control of etching the dielectric film 105 also becomes more difficult. As a result, the AlCu film 103 and the first barrier metal film 102 may tend to have the same planar shape in the patterning of the MIM capacitor element 100.

It is an object in one aspect of the embodiment to provide a semiconductor device and a method of manufacturing a semiconductor device, capable of improving characteristics of a capacitor element of such a semiconductor device.

In a semiconductor device in an aspect of the embodiment, a capacitor upper electrode is formed of a pattern of a metal film for a wiring, the capacitor upper electrode is formed wider than a capacitor lower electrode, and a capacitor dielectric film covers an upper surface and side surfaces of the capacitor lower electrode.

Thus, even if the capacitor upper electrode is formed of the metal film for the wiring, a distance between the capacitor upper electrode and the capacitor lower electrode at their edge portions can be made equal to or larger than a thickness of the capacitor dielectric film. Thus, a leakage current of the capacitor element at the edge portions can be suppressed.

Non-limiting preferred embodiments of the present invention will be described with reference to the accompanying drawings. Throughout the drawings, similar symbols and numerals indicate similar items and functions.

(First Embodiment)

Figure 1A:
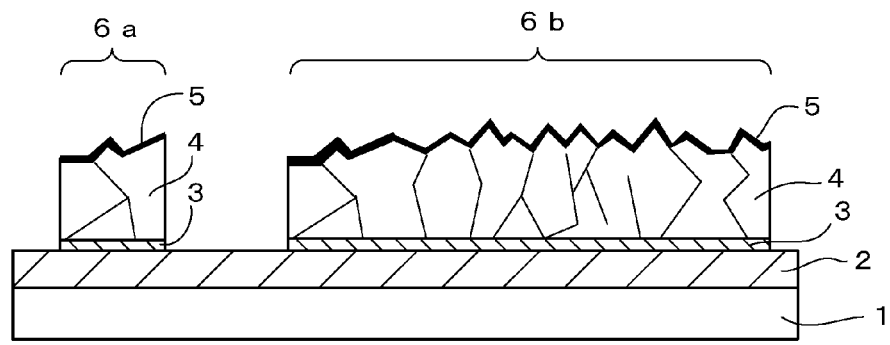
FIGS. 1A to 1M are sectional views illustrating an example of a semiconductor device and steps of forming the same, according to a first embodiment of the present invention.

FIGS. 1A to 1M are an example of sectional views illustrating steps of forming a semiconductor device according to a first embodiment of the present invention. FIGS. 2A to 2K are an example of plan views illustrating the steps of forming the semiconductor device according to the first embodiment of the invention. FIG. 1A is a sectional view taken along a V-V line in FIG. 2A.

Figure 2A:
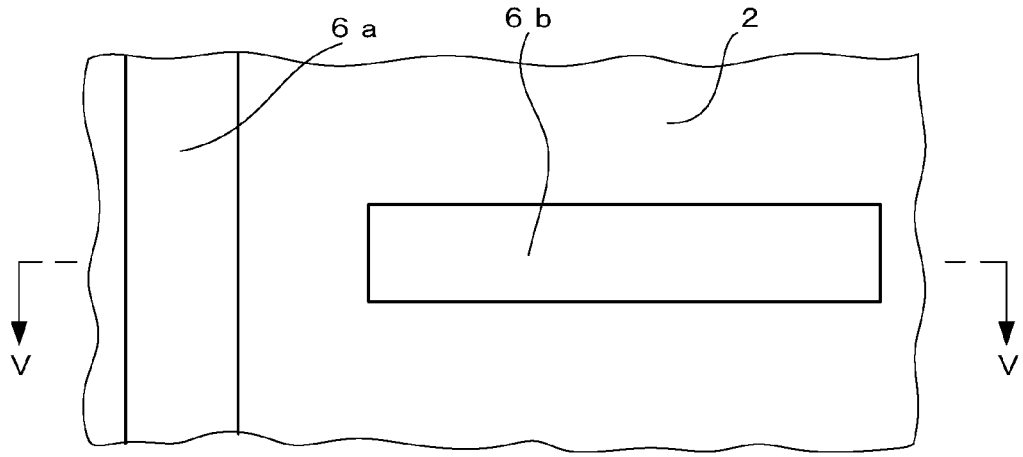
FIGS. 2A to 2K are an example of plan views illustrating the semiconductor device and the steps of forming the same, according to the first embodiment of the invention.

First, as illustrated in FIG. 1A and FIG. 2A, a first interlayer insulating film 2 made of a silicon oxide film is formed on a semiconductor substrate 1, such as a silicon substrate or the like. A first barrier metal film 3, a first main conductive film 4, and a second barrier metal film 5 are formed in this order on the first interlayer insulating film 2 by the sputtering.

Each of the first and second barrier metal films 3 and 5 may be formed to have a double-layered structure composed of a titanium (Ti) film with a thickness of 40 nm and a titanium nitride (TiN) film with a thickness of 100 nm, for example. An AlCu (aluminum copper) film with a thickness of 1 μm, for example, may be formed as the first main conductive film 4.

A photoresist is then coated on the second barrier metal film 5. A resist pattern (not illustrated) of a wiring shape is then formed by exposing and developing this photoresist. The respective films from the second barrier metal 5 to the first barrier metal film 3 are then etched by the reactive ion etching (RIE) method using a chlorine-based gas, while using the resist pattern as a mask. In this case, these films are overetched so as not to leave any undesired portion of the first barrier metal film 3 that is necessary to be etched.

Accordingly, portions of the first barrier metal film 3, the first main conductive film 4, and the second barrier metal 5 left under the resist pattern (not illustrated) are used as first-layer wirings 6a and 6b. The resist pattern on the first-layer wirings 6a and 6b is then removed.

Figure 1B:
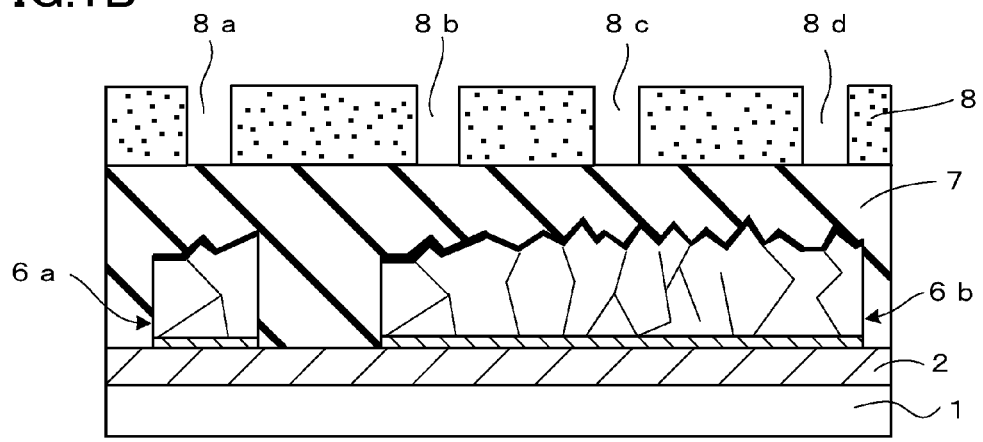
Figure 2B:
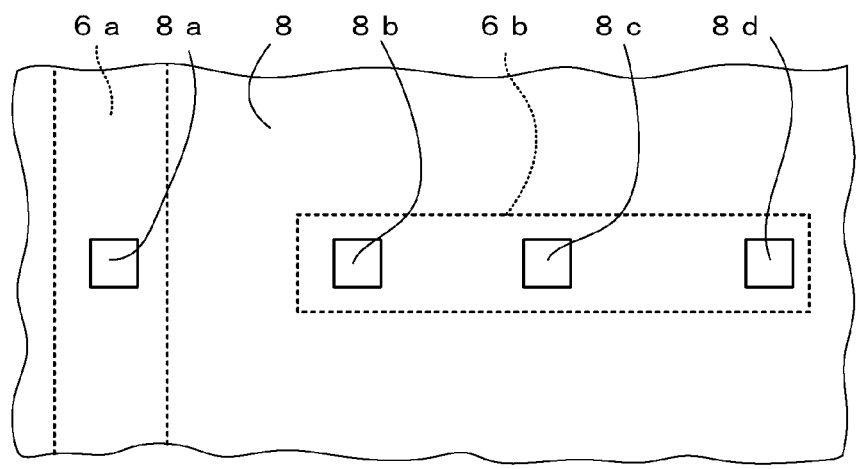

As illustrated in FIG. 1B and FIG. 2B, a second interlayer insulating film 7 is then formed to cover the first-layer wirings 6a and 6b on the first interlayer insulating film 2 by the CVD method. As the second interlayer insulating film 7, a silicon oxide film may be formed by growing it using a gas containing a TEOS-based (tetraethoxysilane-based) gas or a silane-based gas, for example.

An upper surface of the second interlayer insulating film 7 is then planarized by the chemical mechanical polishing (CMP) method. A resist 8 is then coated on the second interlayer insulating film 7. Opening portions 8a to 8d of the resist 8 are then formed on the wirings 6a and 6b by exposing and developing the resist 8.

Figure 1C:
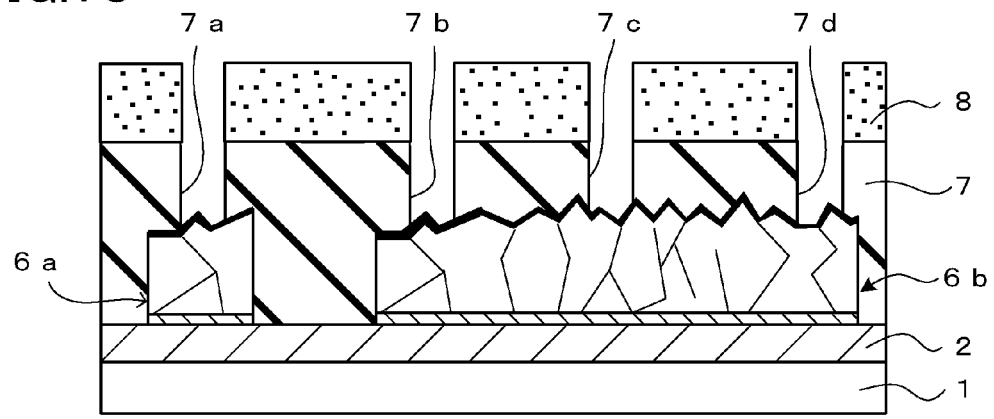
Figure 2C:
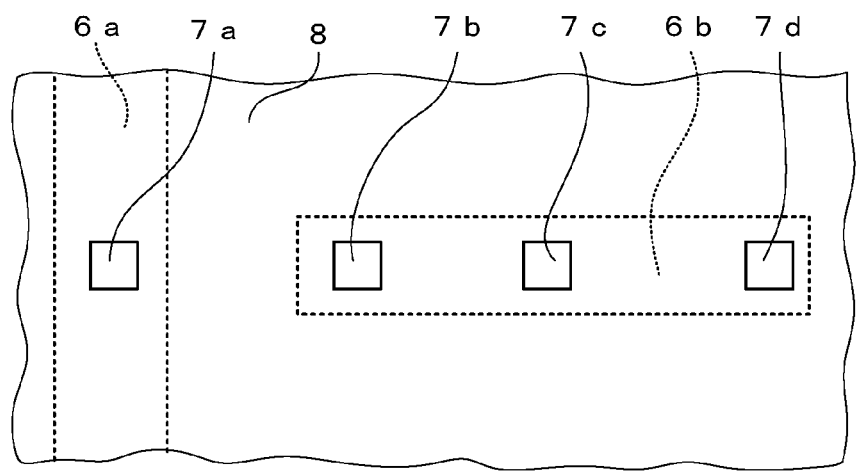

As illustrated in FIG. 1C and FIG. 2C, the second interlayer insulating film 7 is then etched anisotropically by the RIE method using a fluorine-based reaction gas, for example, while using the resist 8 as a mask. Thus, first-layer via holes 7a to 7d are formed on the wirings 6a and 6b.

Figure 1D:
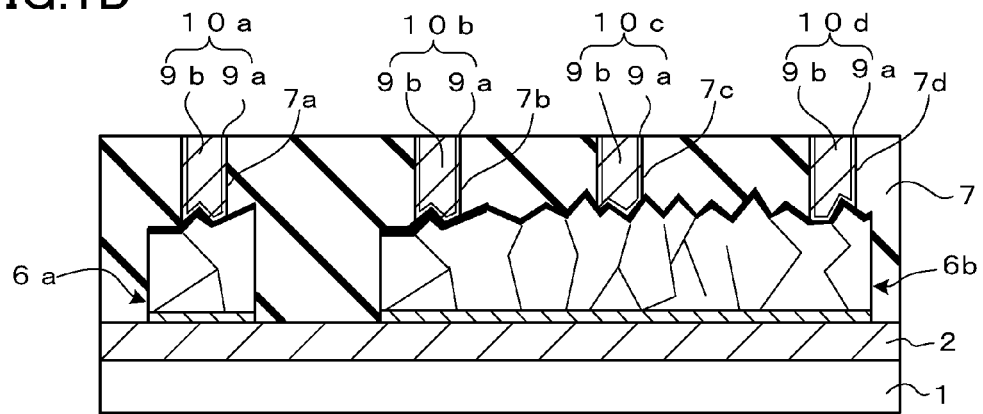
Figure 2D:
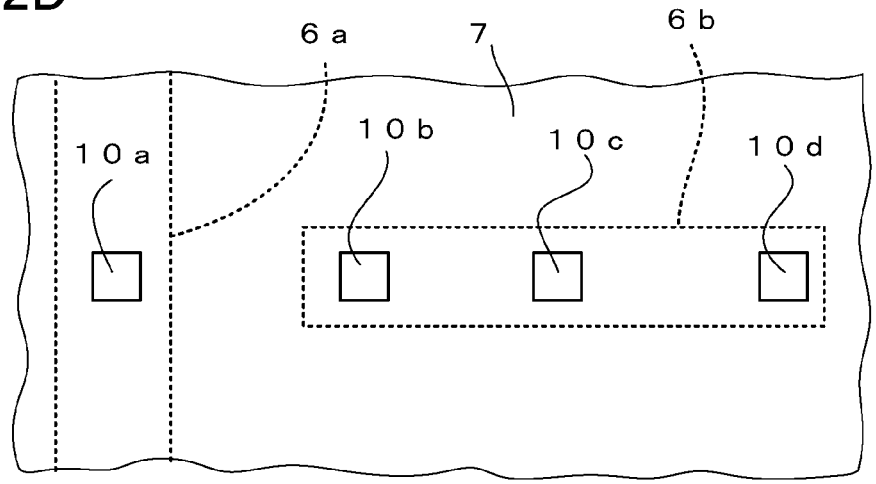

The resist 8 is then removed. As illustrated in FIG. 1D and FIG. 2D, first-layer via plugs 10a to 10d are then formed in the first-layer via holes 7a to 7d. The first-layer via plugs 10a to 10d are formed by steps as described below.

A via barrier metal film 9a formed of a TiN film, for example, is thus formed on bottom surfaces and inner wall surfaces of the via holes 7a to 7d and on the second interlayer insulating film 7 by the sputtering, and then a tungsten (W) film 9b is buried in the first-layer via holes 7a to 7d. The W film 9b may be grown by the CVD method using a gas containing tungsten hexafluoride, for example.

The W film 9b and the via barrier metal 9a are then polished by the CMP method, and removed from an upper surface of the second interlayer insulating film 7. Accordingly, the W film 9b and the via barrier metal 9a left in the first-layer via holes 7a to 7d are used as the first-layer via plugs 10a to 10d, respectively.

However, a metal such as tantalum (Ta), molybdenum (Mo), aluminum (Al), titanium (Ti), or the like may be used as an alternative to the tungsten (W).

Figure 1E:
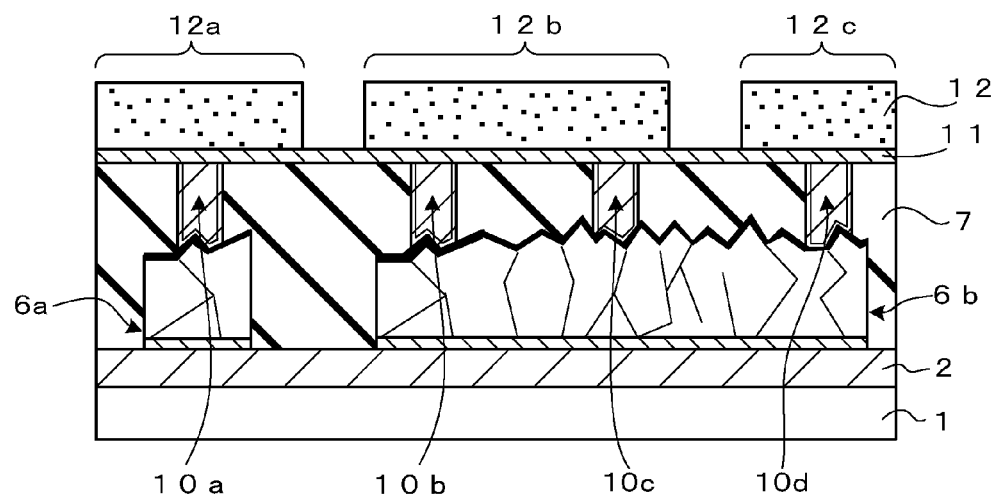
Figure 2E:
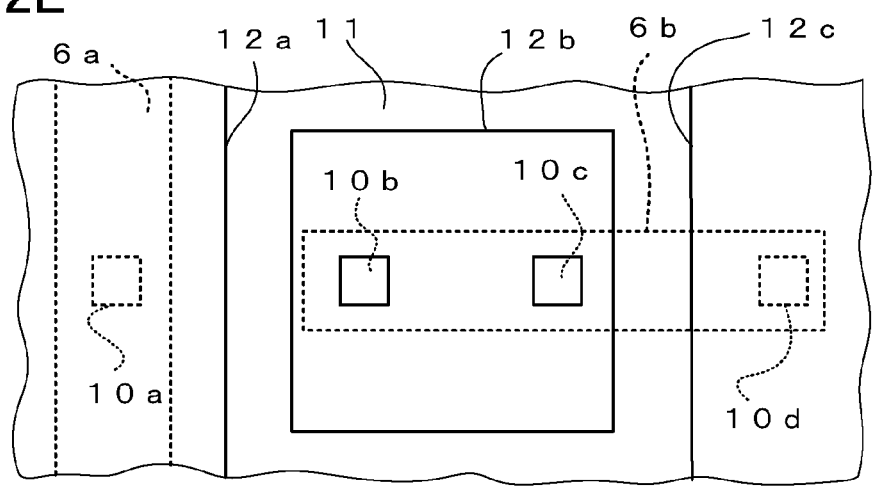

As illustrated in FIG. 1E and FIG. 2E, a third barrier metal film 11 is then formed on the first-layer via plugs 10a to 10d and the second interlayer insulating film 7. A Ti film with a thickness of 40 nm and a TiN film with a thickness of 100 nm, for example, may be formed in order as the third barrier metal film 11 by the sputtering. A Ta film may be formed as an alternative to the Ti film, and a TaN film may be formed as an alternative to the TiN film.

A resist 12 is then coated on the third barrier metal film 11. Resist patterns 12a and 12c for wirings and a resist pattern 12b for a capacitor lower electrode are then formed by exposing and developing the resist 12.

Portions of the respective wiring resist patterns 12a and 12c for the wirings are arranged in the respective positions that overlap with the respective first-layer via plugs 10a and 10d. The resist pattern 12b for the capacitor lower electrode has a quadrangular planar shape, for example, and is formed in the position that overlaps with the other first-layer via plugs 10b and 10c.

Figure 1F:
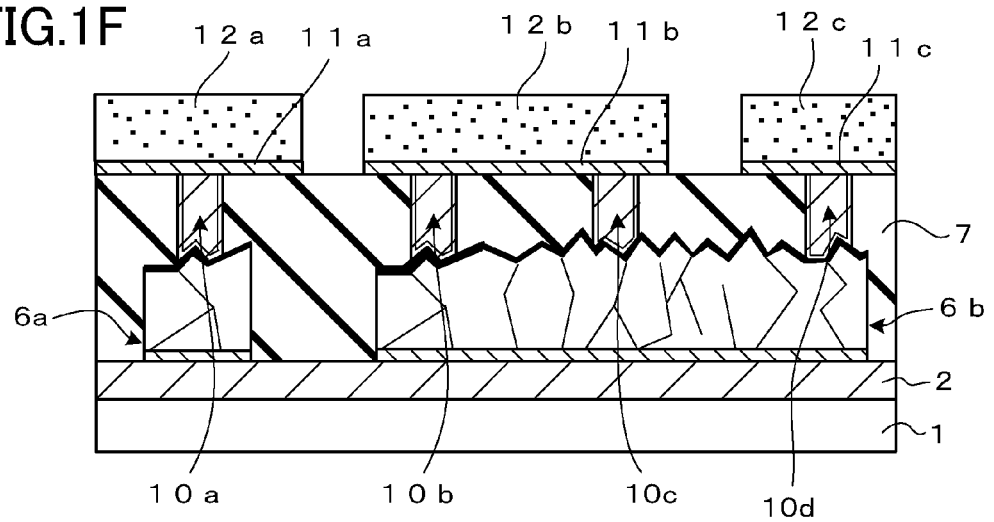
Figure 2F:
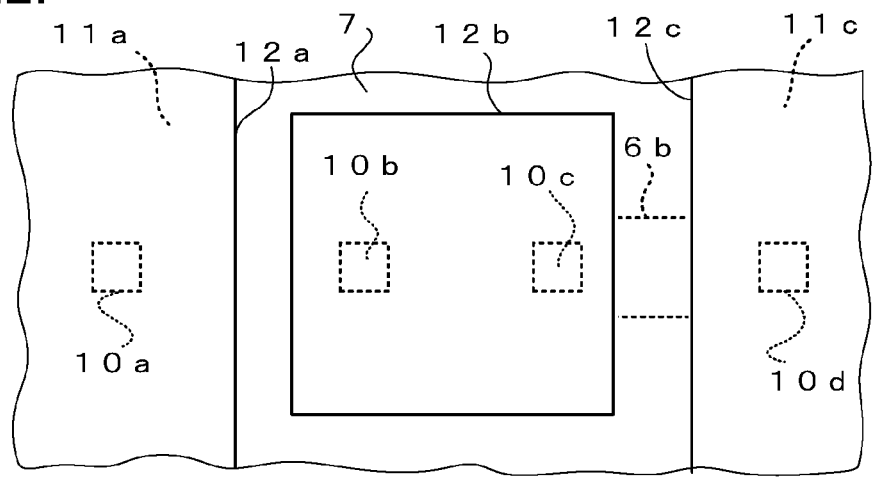

As illustrated in FIG. 1F and FIG. 2F, the third barrier metal film 11 is etched anisotropically by the RIE method using a chlorine-based gas. Accordingly, the third barrier metal film 11 left under the wiring resist patterns 12a and 12c forms lower wiring barrier metal films 11a and 11c, and also the third barrier metal film 11 left under the capacitor lower electrode resist pattern 12b forms a capacitor lower electrode 11b.

Figure 1G:
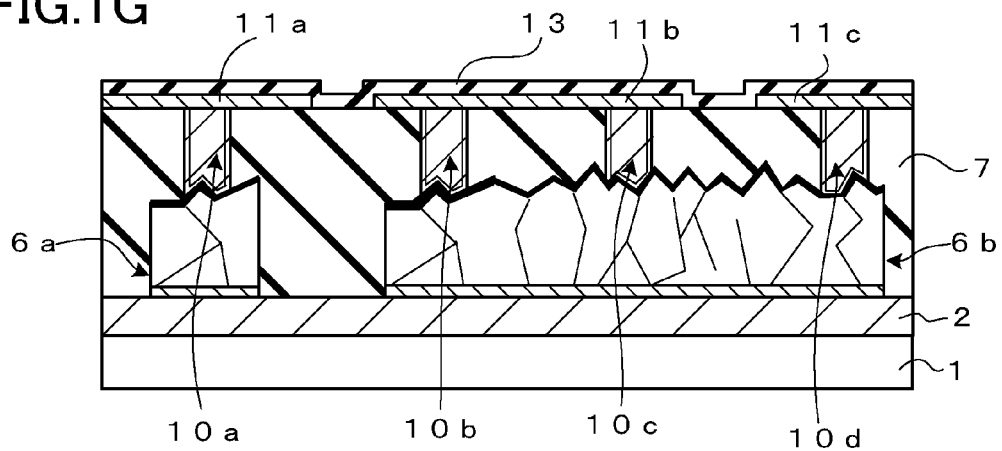
Figure 2G:
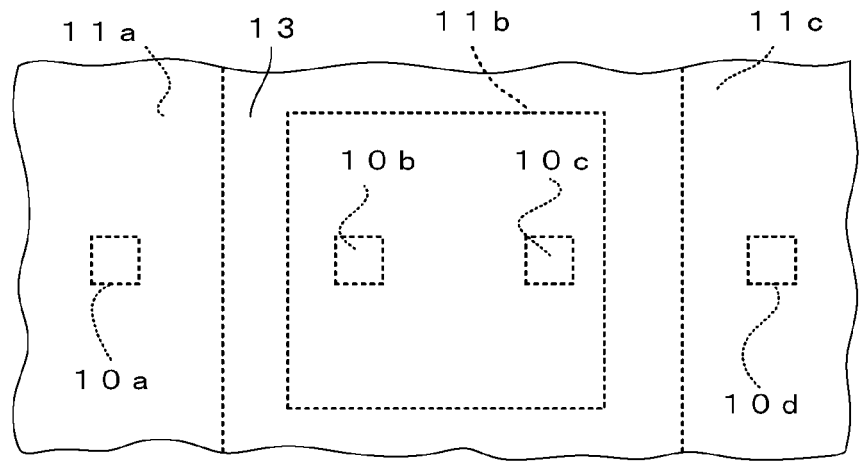

The resist patterns 12a to 12c are then removed. As illustrated in FIG. 1G and FIG. 2G, a dielectric film 13 is then formed on the lower wiring barrier metal films 11a and 11c, the capacitor lower electrode 11b, and the second interlayer insulating film 7. As the dielectric film 13, a silicon oxide film with a thickness of 40 nm may be formed by the CVD method. A reaction gas used for forming the silicon oxide film may be a silane-based gas or a gas containing TEOS, for example. As an alternative to the silicon oxide film, a silicon nitride film, a tantalum oxide film, or the like may be formed.

Figure 1H:
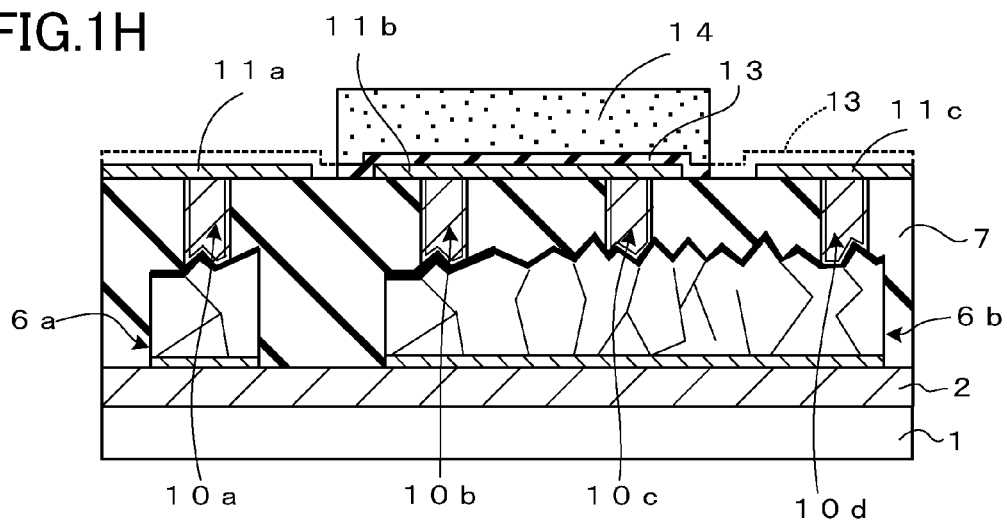
Figure 2H:
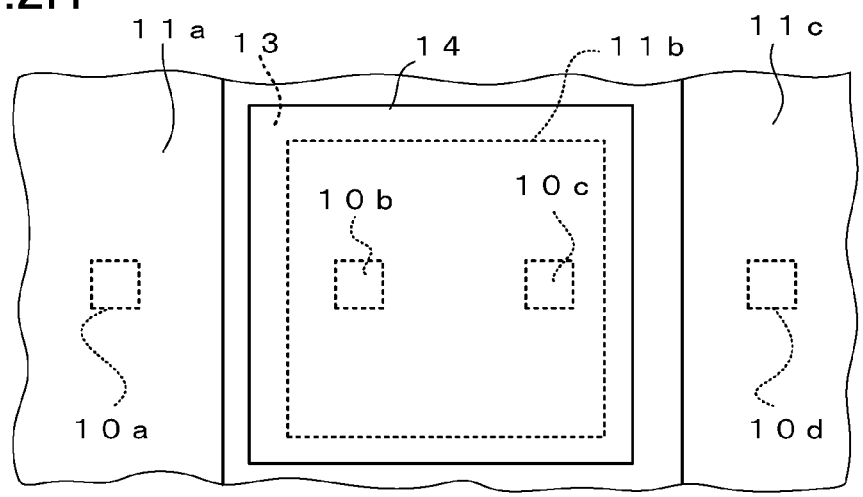

As illustrated in FIG. 1H and FIG. 2H, a photoresist is then coated on the dielectric film 13. A resist pattern 14 is then formed by exposing and developing the photoresist. The resist pattern 14 has a planar shape that overlaps with the capacitor lower electrode 11b and extends or protrudes toward the surroundings of the capacitor lower electrode 11b.

The dielectric film 13 is then anisotropically etched by the RIE method, while using the resist pattern 14 as a mask. When the dielectric film 13 is the silicon oxide film, for example, a fluorine-based gas may be employed as the etching gas.

Figure 1I:
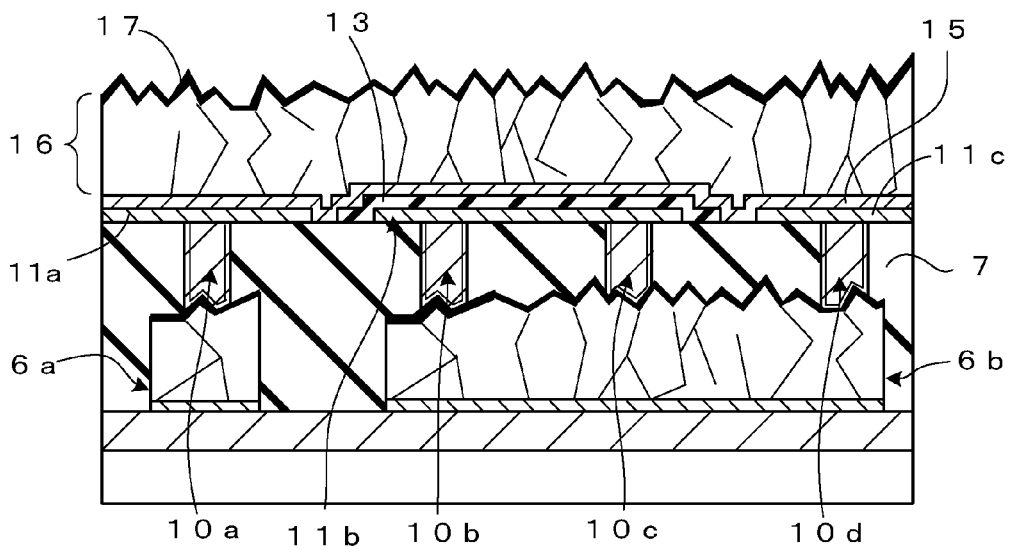
Figure 2I:
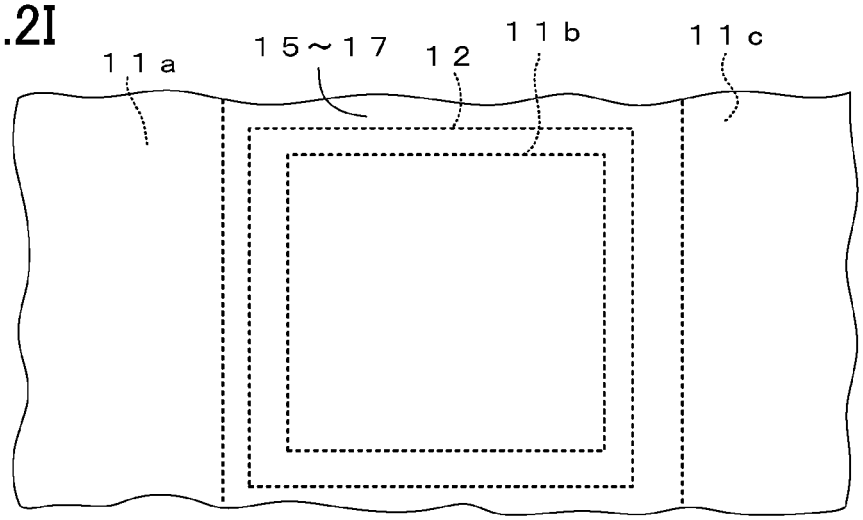

As illustrated in FIG. 1I and FIG. 2I, a fourth barrier metal film 15 formed of a TiN film with a thickness of 40 nm, a second main conductive film 16 formed of an AlCu film with a thickness of 1 μm, and a fifth barrier metal film 17 with a stacked layer structure composed of a Ti film with a thickness of 5 nm and a TiN film with a thickness of 100 nm, for example, are then formed in this order over the whole upper exposed surface of the combination of the dielectric film 13, the lower wiring barrier metal films 11a and 11c, and the second interlayer insulating film 7 by the sputtering.

As an alternative to the AlCu film, an AlSi film or an AlSiCu film may be employed as the second main conductive film 16. As an alternative to the TiN film, a TaN film may be employed as the fourth and fifth barrier metal films 15 and 17. As an alternative to the Ti film, a Ta film may be employed as the fifth barrier metal film 17.

Figure 1J:
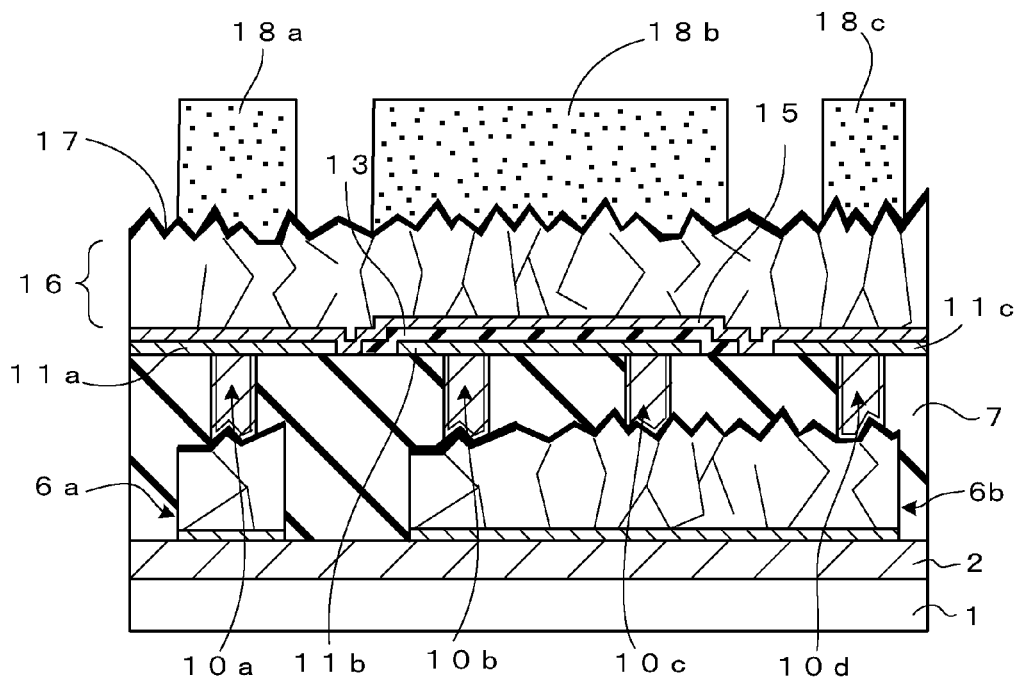
Figure 2J:
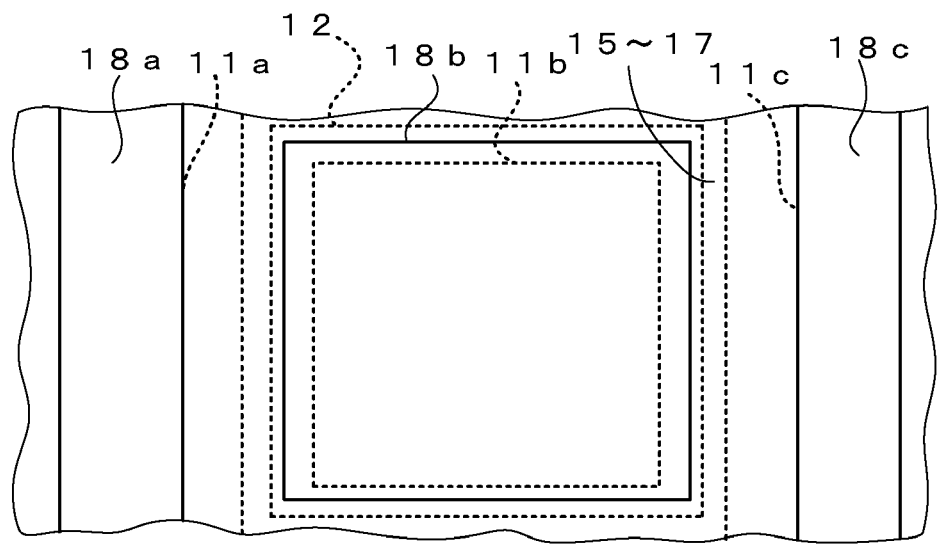

A photoresist is then coated on the fifth barrier metal film 17. As illustrated in FIG. 1J and FIG. 2J, resist patterns 18a and 18c for wirings, and a resist pattern 18b for an upper electrode are then formed by exposing and developing the photoresist.

The upper electrode resist pattern 18b has a shape that overlaps with the capacitor lower electrode 11b and the dielectric film 13. Also, the upper electrode resist pattern 18b is adapted to have at least a part of its outer periphery lie at a lateral position between the outer periphery of the dielectric film 13 and the outer periphery of the capacitor lower electrode 11b. The edge portion of the upper electrode resist pattern 18b has dimensions protruding or extending by about 0.3 μm to about 1.0 μm, for example, from the edge portion of the capacitor lower electrode 11b in the lateral direction.

In this arrangement, the anisotropic etching is applied to respective films from the fifth barrier metal film 17 to the fourth barrier metal film 15 and the lower wiring barrier metal films 11a and 11c, by the RIE method using the resist patterns 18a to 18c as a mask. A chlorine-based gas may be used as the etching gas. After the etching, the resist patterns 18a to 18c are removed.

However, the silicon oxide film may be additionally formed between the resist patterns 18a to 18c and the fifth barrier metal film 17, and then the silicon oxide film may be patterned so that the patterned silicon oxide film are employed as a hard mask.

Figure 1K:
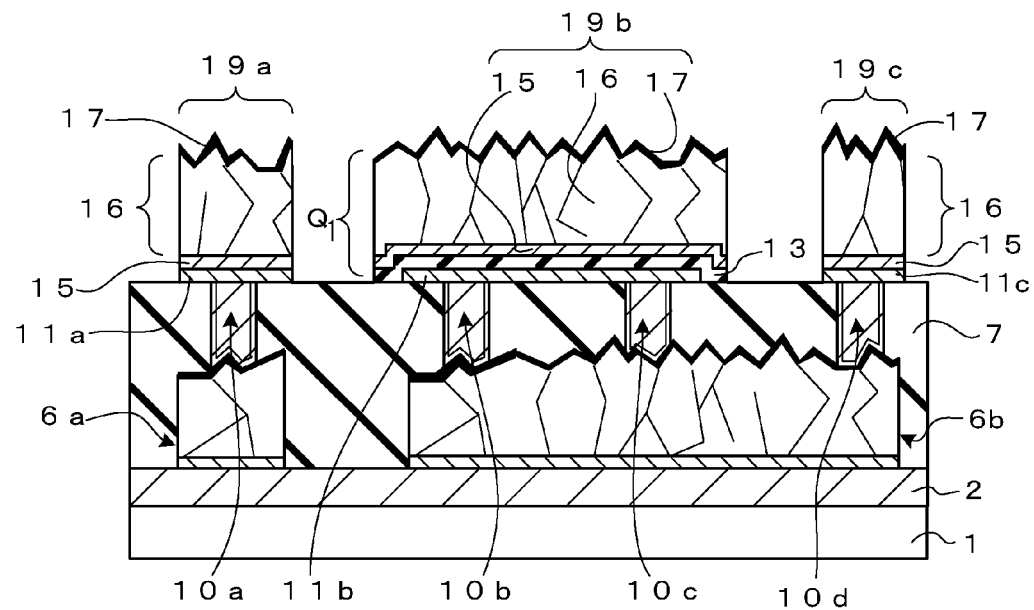
Figure 2K:
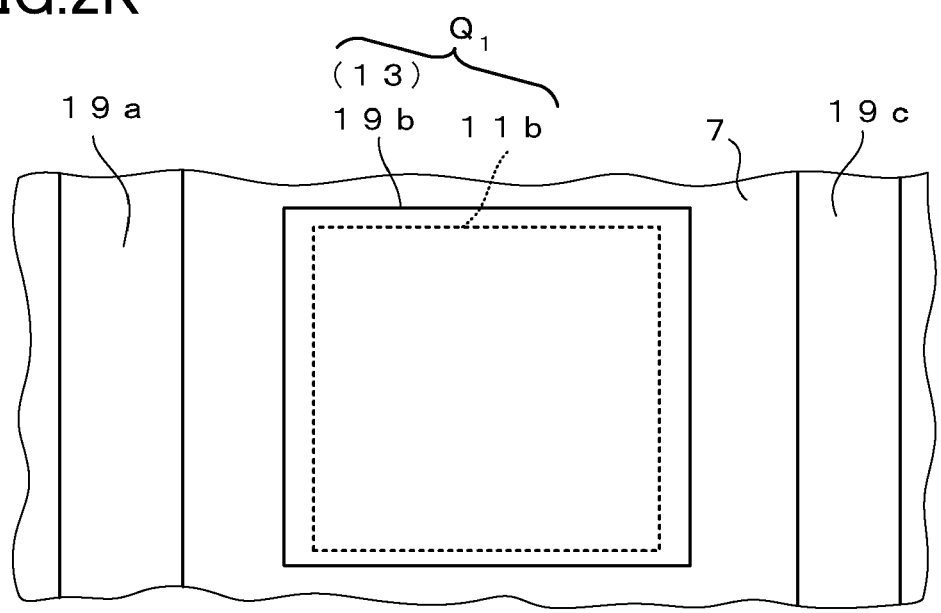

As illustrated in FIG. 1K and FIG. 2K, a capacitor upper electrode 19b is thus formed, and is composed of the fourth barrier metal film 15, the second main conductive film 16, and the fifth barrier metal film 17 which are left under the upper electrode resist pattern 18b. Thus, an MIM capacitor element $Q_1$ is composed of the capacitor upper electrode 19b, the dielectric film 13, and the capacitor lower electrode 11b.

Second-layer wirings 19a and 19c are thus formed, and are composed of the respective lower wiring barrier metal films 11a and 11c, the fourth barrier metal films 15, the second main conductive films 16, and the fifth barrier metal films 17 which are left under the respective wiring resist patterns 18a and 18c.

A film thickness of the second main conductive film 16 for the capacitor upper electrode 19b is made thick, and the conditions of etching the second main conductive film 16 are arranged so as to accelerate an etching rate. Thus, the underlying dielectric film 13 is also etched successively.

Accordingly, an outer periphery of the capacitor upper electrode 19b is substantially aligned with an outer periphery of the dielectric film 13. However, side surfaces of the capacitor lower electrode 11b are covered with the dielectric film 13, and also the edge portion of the capacitor upper electrode 19b is located in the upper position oblique to the edge portion of the capacitor lower electrode 11b, with the dielectric film 13 interposed between the upper and lower electrodes 19b and 11b. As a result, a distance between the upper and lower electrodes 19b and 11b at the edge portions can be adapted to be larger than a film thickness of the dielectric film 13.

A distance between the edge portion of the capacitor lower electrode 11b and the edge portion of the capacitor upper electrode 19b can be adjusted by changing a shape of the capacitor upper electrode 19b. This facilitates suppression of a leakage current which tends to occur at the edge portions of the MIM capacitor element $Q_1$.

Figure 1L:
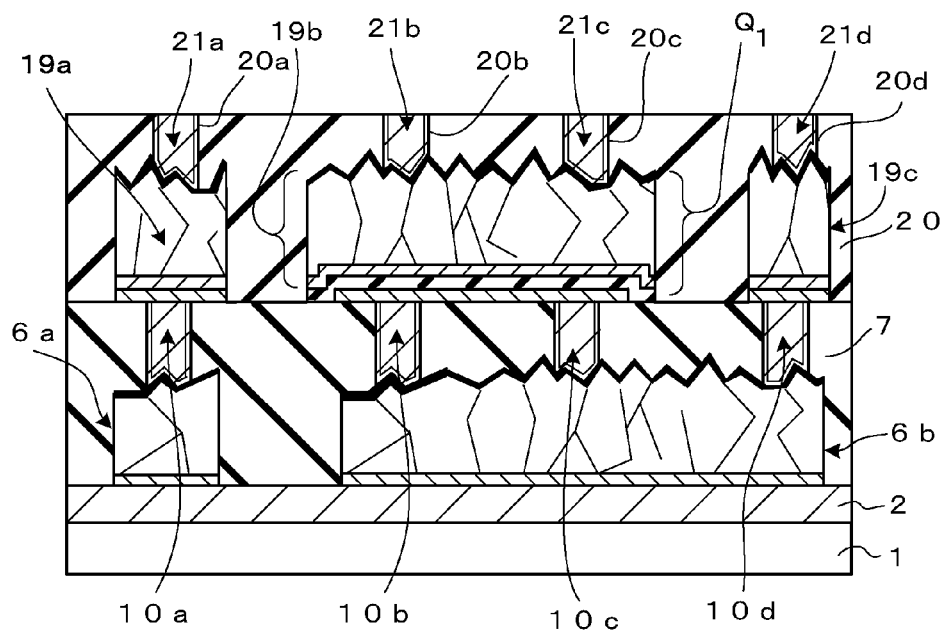

As illustrated in FIG. 1L, a third interlayer insulating film 20 is then formed by the CVD method so as to cover the MIM capacitor element $Q_1$ and the second-layer wirings 19a and 19c on the second interlayer insulating film 7. The third interlayer insulating film 20 is formed of the silicon oxide film, for example, and is grown by using a gas such as TEOS, silane, or the like.

Second-layer via holes 20a to 20d are then formed in the third interlayer insulating film 20 on the second-layer wirings 19a and 19c and the capacitor upper electrode 19b, respectively. Second-layer via plugs 21a to 21d are then formed in the second-layer via holes 20a to 20d, respectively.

Similarly to the formation of the first-layer via holes 7a to 7d and the via plugs 10a to 10d, the second-layer via holes 20a to 20d and the second-layer via plugs 21a to 21d are formed by applying the metal film formation, the photolithography method, and the CMP process.

Figure 1M:
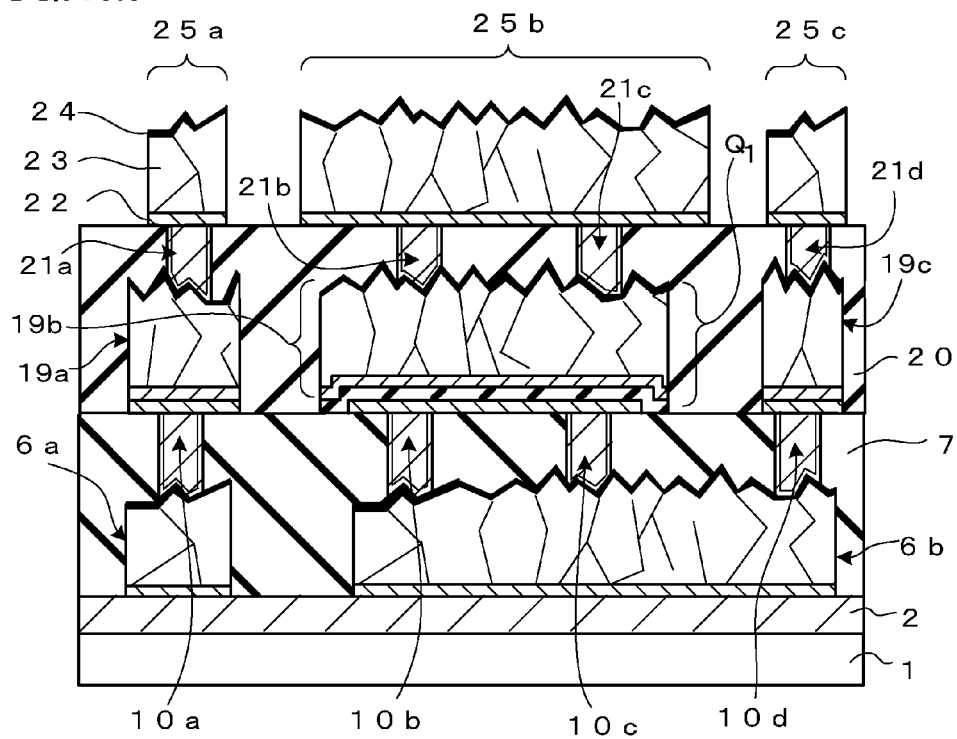

As illustrated in FIG. 1M, third-layer wirings 25a to 25c are then formed on the third-layer interlayer insulating film 20. The third-layer wirings 25a to 25c each have a stacked layer structure composed of a sixth barrier metal film 22, a third main conductive film 23, and a seventh barrier metal film 24. The third-layer wirings 25a to 25c are formed by patterning the stacked layer structure by means of the photolithography method, similarly to the formation of the first-layer wirings 6a and 6b.

A two-layered structure composed of a Ti film with a thickness of 40 nm and a TiN film with a thickness of 100 nm, for example, may be formed as each of the sixth and seventh barrier metal films 22 and 24. As the third main conductive film 23, an AlCu film with a thickness of 1 μm, for example, may be formed.

After that, an interlayer insulating film, wirings, and the like may be formed further thereon (not illustrated).

In the MIM capacitor element $Q_1$ structured as described above, the edge portion of the capacitor upper electrode 19b, which is formed of the second main conductive film 16 and the other elements, similarly to the second-layer wirings 19a and 19c, is patterned successively with the edge portion of the underlying dielectric film 13.

Accordingly, the capacitor upper electrode 19b and the dielectric film 13 have the same planar shape, but the dielectric film 13 has the planar shape to cover the capacitor lower electrode 11b and its periphery. Thus, the edge portions of the capacitor upper electrode 19b and of the capacitor lower electrode 11b can be distanced from each other by a desired distance in the lateral direction. This suppresses occurrence of a leakage current between the upper and lower electrodes 19b and 11b at the edge portion of the MIM capacitor element $Q_1$.

(Second Embodiment)

FIGS. 3A to 3D are an example of sectional views illustrating steps of forming a semiconductor device according to a second embodiment of the invention. FIGS. 4A to 4C are an example of plan views illustrating the steps of forming the semiconductor device according to the second embodiment of the invention. In FIGS. 3A to 3D and FIGS. 4A to 4C, the same reference symbols and numerals as those in FIGS. 1A to 1M and FIGS. 2A to 2K denote similar elements.

Figure 3A:
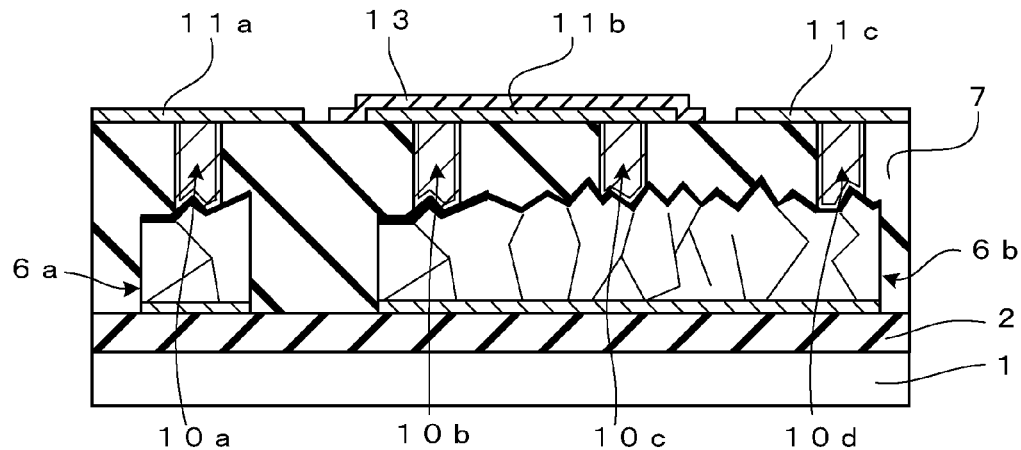
FIGS. 3A to 3D are an example of sectional views illustrating a semiconductor device and steps of forming the same, according to a second embodiment of the invention.
Figure 4A:
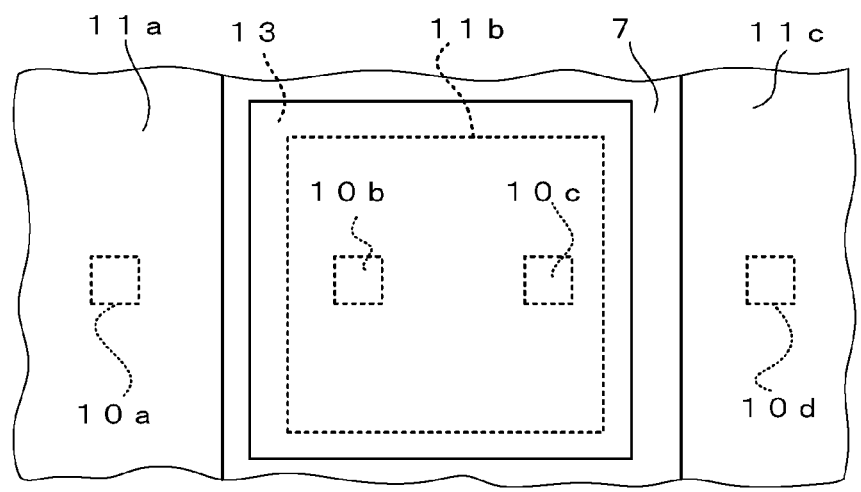
FIGS. 4A to 4C are an example of plan views illustrating the semiconductor device and the steps of forming the same, according to the second embodiment of the invention.
Figure 4B:
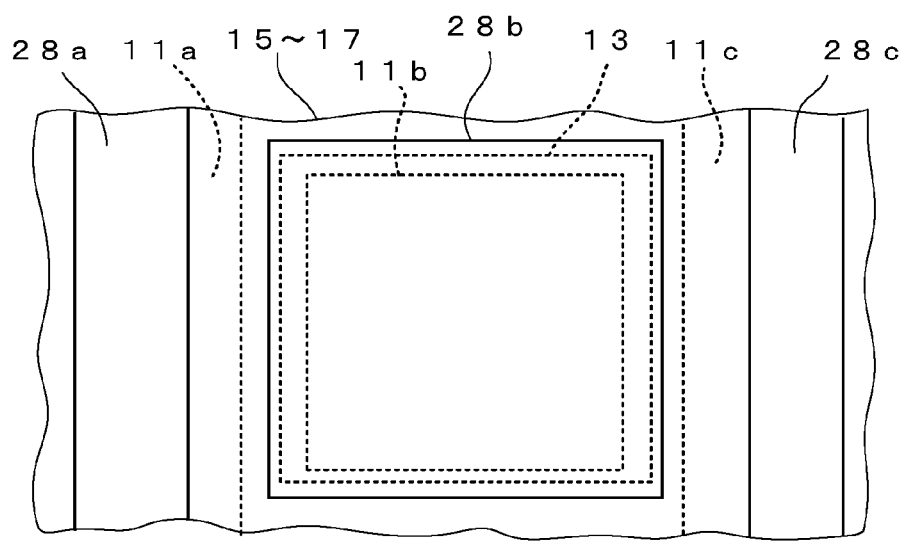
Figure 4C:
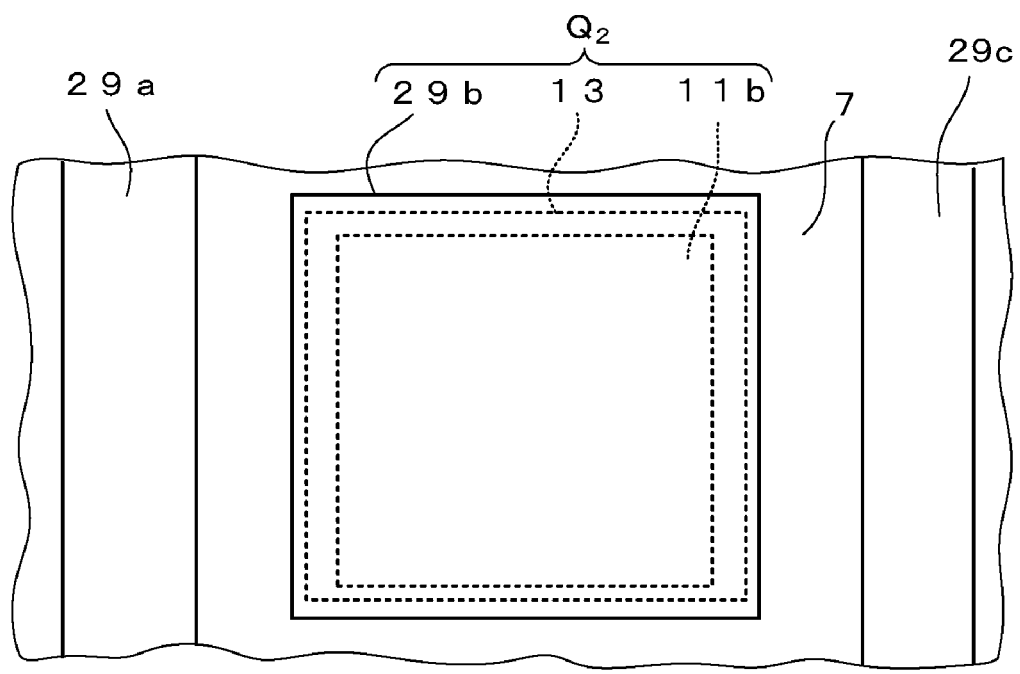

First, as illustrated in FIG. 3A and FIG. 4A, and similarly to the first embodiment, the first-layer wirings 6a and 6b are formed on the first interlayer insulating film 2, and then the second interlayer insulating film 7 is formed on the first-layer wirings 6a and 6b and the first interlayer insulating film 2. The first-layer via plugs 10a to 10d are then formed on the first-layer wirings 6a and 6b. The lower wiring barrier metal films 11a and 11c and the capacitor lower electrode 11b are then formed on the second interlayer insulating film 7 by the same method as that used in the first embodiment. The dielectric film 13 is then formed and shaped to cover the capacitor lower electrode 11b and its periphery.

Figure 3B:
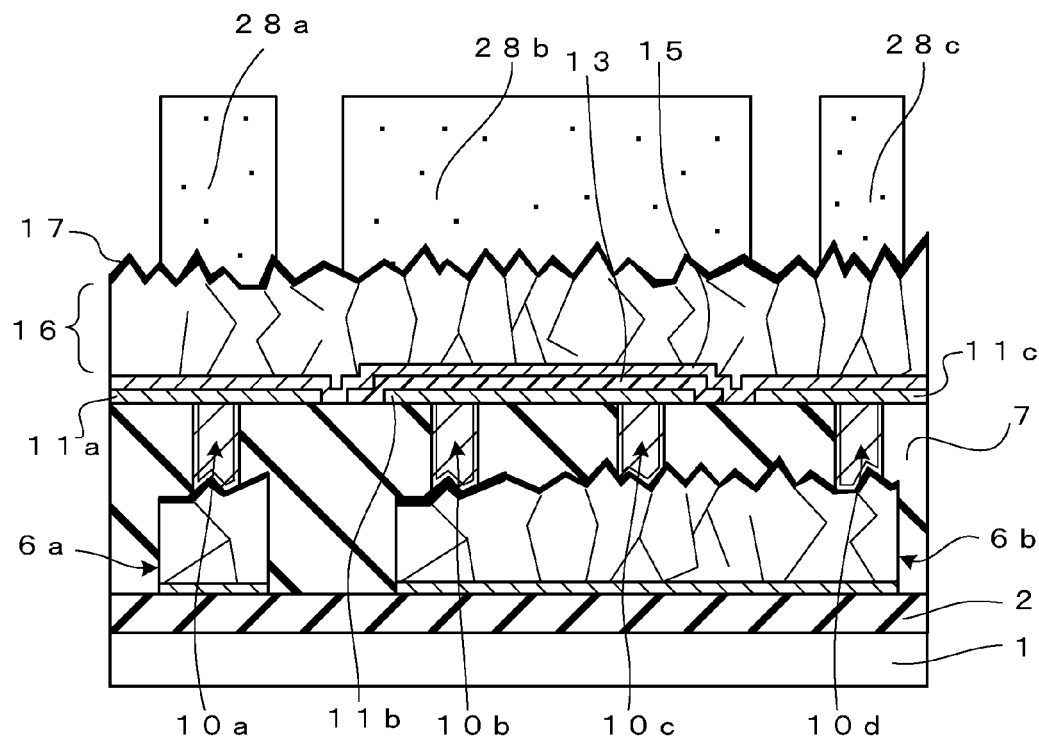

As illustrated in FIG. 3B and FIG. 4B, the fourth barrier metal film 15, the second main conductive film 16, and the fifth barrier metal film 17 are then formed in this order over the whole upper exposed surface of the combination of the dielectric film 13, the lower wiring barrier metal films 11a and 11c, and the second interlayer insulating film 7 by the sputtering.

A photoresist is then coated on the fifth barrier metal film 17. Wiring resist patterns 28a and 28c, and a capacitor upper electrode resist pattern 28b are then formed by exposing and developing the photoresist.

The capacitor upper electrode resist pattern 28b has the planar shape that overlaps with the capacitor lower electrode 11b and the dielectric film 13. Also, the capacitor upper electrode resist pattern 28b is adapted to have at least a part of its outer periphery protruding or extending by about 0.3 μm to about 1.0 μm toward the side area of the outer periphery of the dielectric film 13. Thus, the capacitor upper electrode resist pattern 28b is made wider than the dielectric film 13.

In this arrangement, respective films from the fifth barrier metal film 17 to the fourth barrier metal film 15 and the lower wiring barrier metal films 11a and 11c are anisotropically etched by the RIE method or the sputtering, while using the resist patterns 28a to 28c as a mask. In application of the RIE method, a chlorine-based gas may be employed as the etching gas. After the etching, the resist patterns 28a to 28c are removed.

Figure 3C:
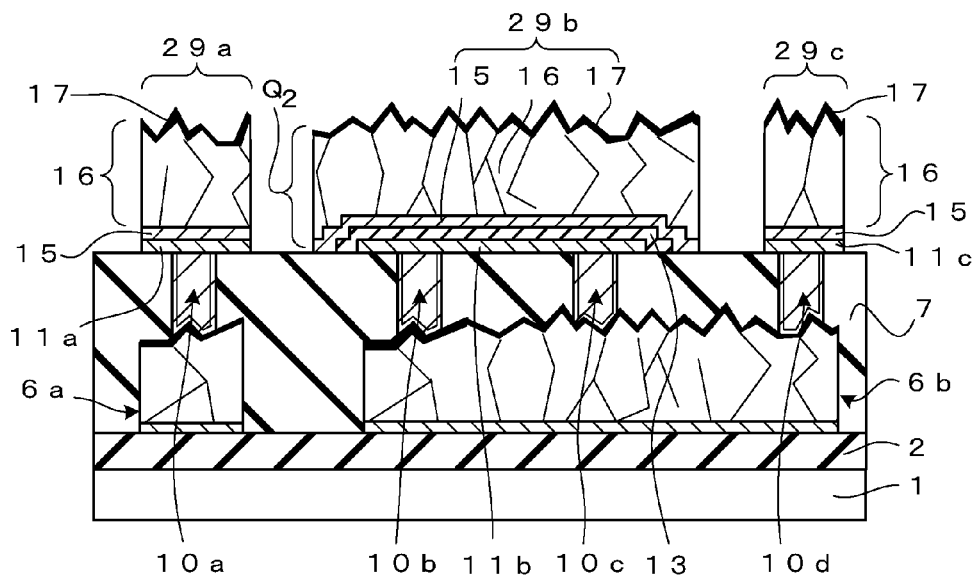

Accordingly, as illustrated in FIG. 3C and FIG. 4C, second-layer wirings 29a and 29c are thus formed, and are composed of the respective lower wiring barrier metal films 11a and 11c, the fourth barrier metal films 15, the second main conductive films 16, and the fifth barrier metal films 17 which are left under the respective wiring resist patterns 28a and 28c.

A capacitor upper electrode 29b is thus formed, and is composed of the fourth barrier metal film 15, the second main conductive film 16, and the fifth barrier metal film 17 which are left under the capacitor upper electrode resist pattern 28b. An MIM capacitor element $Q_2$ is thus formed, and is composed of the capacitor upper electrode 29b, the dielectric film 13, and the capacitor lower electrode 11b.

The capacitor upper electrode resist pattern 28b is shaped such that its periphery protrudes or extends from the dielectric film 13. Thus, a size of the dielectric film 13 becomes equal to an intended pattern profile, when the fourth barrier metal film 15, the second main conductive film 16, and the fifth barrier metal film 17 are to be etched.

Figure 3D:
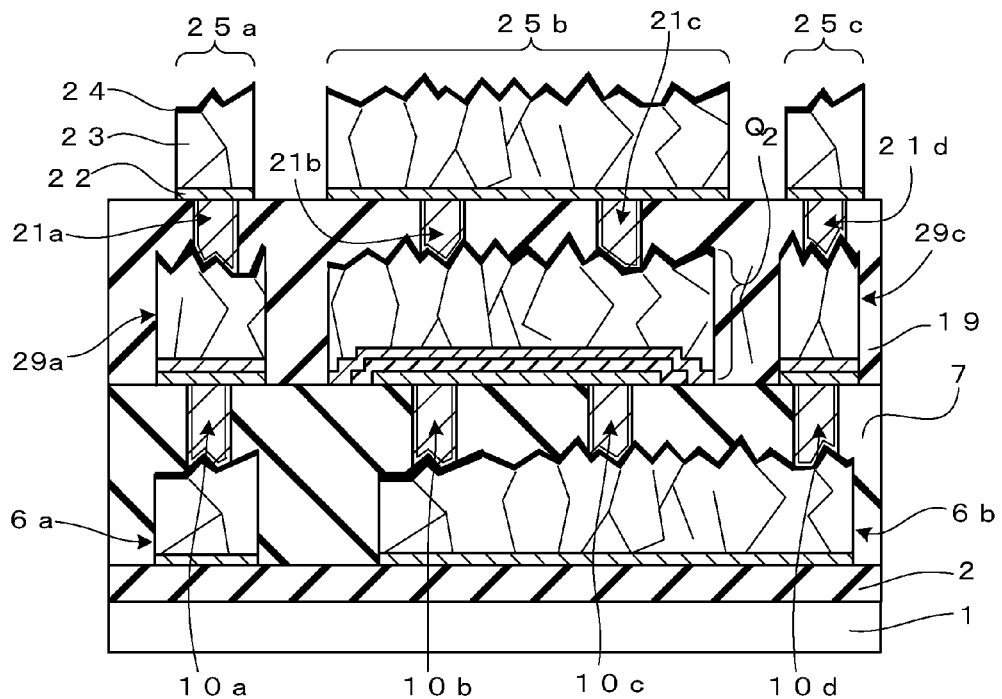

As illustrated in FIG. 3D, the third-layer interlayer insulating film 19, the second-layer via plugs 21a to 21d, and the third-layer wirings 25a to 25c are then formed by the same process as that of the first embodiment.

In the MIM capacitor element $Q_2$ as described above, the capacitor upper electrode 29b is made wider than the underlying dielectric film 13. Thus, a distance between outer peripheries of the capacitor lower electrode 11b and of the capacitor upper electrode 29b may become equal to and is determined by a width of the dielectric film 13 that protrudes or extends outwards from the capacitor lower electrode 11b.

As a result, when a protruding width of the dielectric film 13 is determined to be sufficiently large, a leakage current can be prevented from occurring between the capacitor lower electrode lib and the capacitor upper electrode 29b at their respective edge portions.

(Third Embodiment)

FIGS. 5A to 5J are an example of sectional views illustrating steps of forming a semiconductor device according to a third embodiment of the invention. FIG. 6 is an example of a plan view illustrating an MIM capacitor element and a wiring layout in its surrounding area in the semiconductor devices according to the third embodiment of the invention.

Figure 5A:
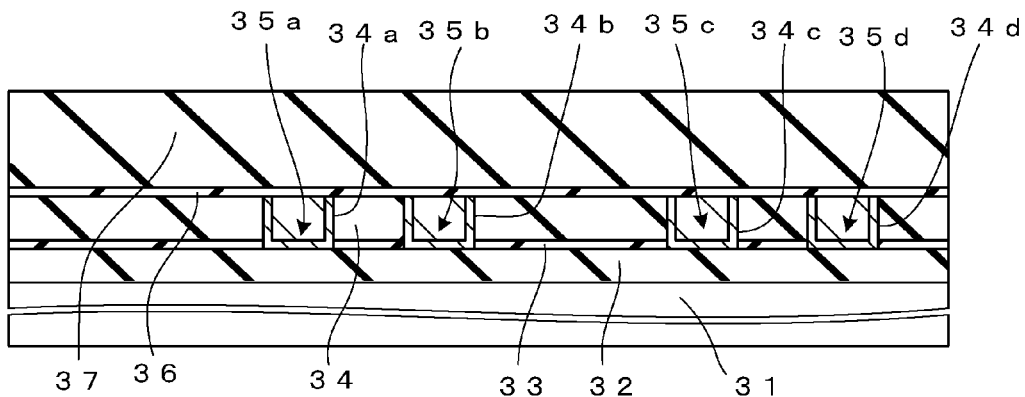
FIGS. 5A to 5J are an example of sectional views illustrating a semiconductor device and steps of forming the same, according to a third embodiment of the invention.

As illustrated in FIG. 5A, a first silicon oxide film 32 is formed on a semiconductor substrate 31 such as a silicon substrate by the plasma CVD method to have a thickness of several hundreds nm to 1000 nm, for example, 500 nm. As a reaction gas used to grow the first silicon oxide film 32, a gas containing TEOS or a silane-based gas is employed.

A first silicon nitride film 33 with a thickness of 30 nm to 50 nm is formed on the first silicon oxide film 32 by the CVD method. As a reaction gas used to grow the silicon nitride film, for example, ammonia and silane are employed.

Also, a second silicon oxide film 34 is formed on the first silicon nitride film 33. Recesses 34a to 34d for wirings are then formed in the second silicon oxide film 34 and the first silicon nitride film 33 by the photolithography method using a resist (not illustrated). The wiring recesses 34a and 34b as a part of wiring recesses are formed in the route that passes through under a capacitor element forming area.

First-layer copper wirings 35a to 35d are then formed in the wiring recesses 34a to 34d. The first-layer copper wirings 35a to 35d are formed as described below.

Thus, a barrier metal film and a seed film are formed on inner surfaces and bottom surfaces of the wiring recesses 34a to 34d by the sputtering. The wiring recesses 34a to 34d are then filled with respective copper films by the electroplating. The barrier metal film, the seed film, and the copper film formed on an upper surface of the second silicon oxide film 34 are then removed by the CMP method. Accordingly, the copper film left in the wiring recesses 34a to 34d forms the respective first-layer copper wirings 35a to 35d.

As the barrier metal film, a tantalum (Ta) film with a thickness of 30 nm to 50 nm, for example may be formed. As the seed film, a copper film with a thickness of about 100 nm, for example, by the sputtering may be formed.

A second silicon nitride film 36 is then formed on the second silicon oxide film 34 and the first-layer copper wirings 35a to 35d by the CVD method to have a thickness of 30 nm to 50 nm, for example. A third silicon oxide film 37 is then formed on a second silicon nitride film 35 by the plasma CVD method.

The second silicon nitride film 36 serves as a copper diffusion preventing film for the first-layer copper wirings 35a to 35d.

Figure 5B:
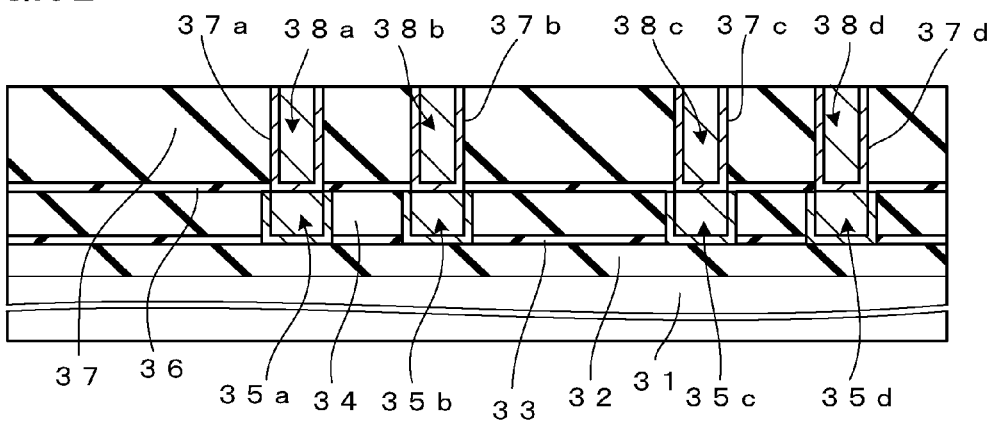

In this arrangement, as illustrated in FIG. 5B, via holes 37a to 37d, depths of which reach respective portions of the respective first-layer copper wirings 35a to 35d, are formed in the third silicon oxide film 37 and the second silicon nitride film 36. In this case, the via holes 37a and 37b are also formed on the first-layer copper wirings 35a and 35b respectively that exist under the capacitor element forming area.

First-layer via plugs 38a to 38d are then formed in the respective via holes 37a to 37d. For this purpose, a titanium (Ti) film is formed as a glue (adhesive) film in the via holes 37a to 37d. A tungsten (W) film is then buried in the via holes 37a to 37d by the CVD method using tungsten hexafluoride ($WF_6$) as a source gas. The glue film and the W film are then removed from an upper surface of the third silicon oxide film 37 by the CMP method. Accordingly, the W film left in the via holes 37a to 37d forms the respective first-layer via plugs 38a to 38d.

Figure 5C:
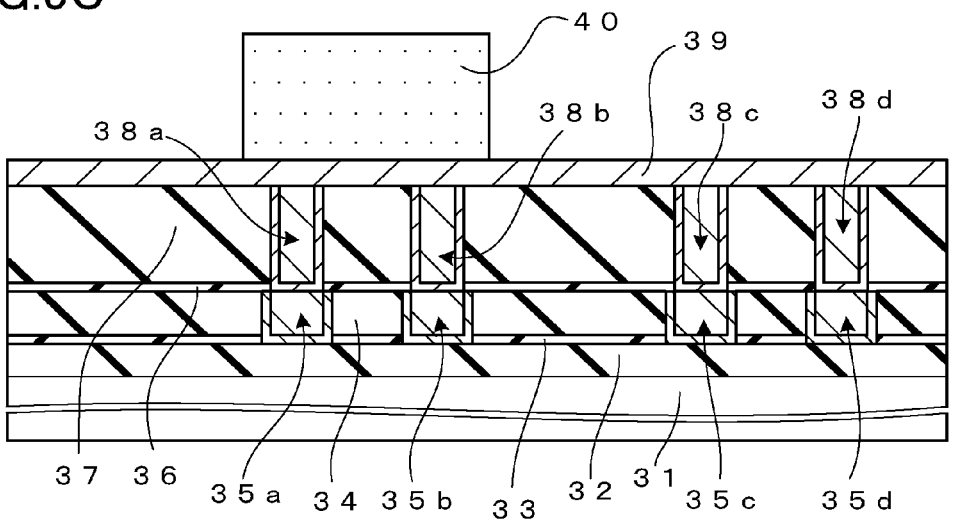

As illustrated in FIG. 5C, a lower electrode film 39 is then formed on the first-layer via plugs 38a to 38d and the third silicon oxide film 37. As the lower electrode film 39, a TiN film, for example, that also serves as a barrier metal may be formed by the sputtering to have a thickness of 50 nm to 100 nm.

A photoresist is then coated on the lower electrode film 39. A capacitor lower electrode resist pattern 40 having a planar shape for the capacitor lower electrode is then formed by exposing and developing the photoresist.

Figure 5D:
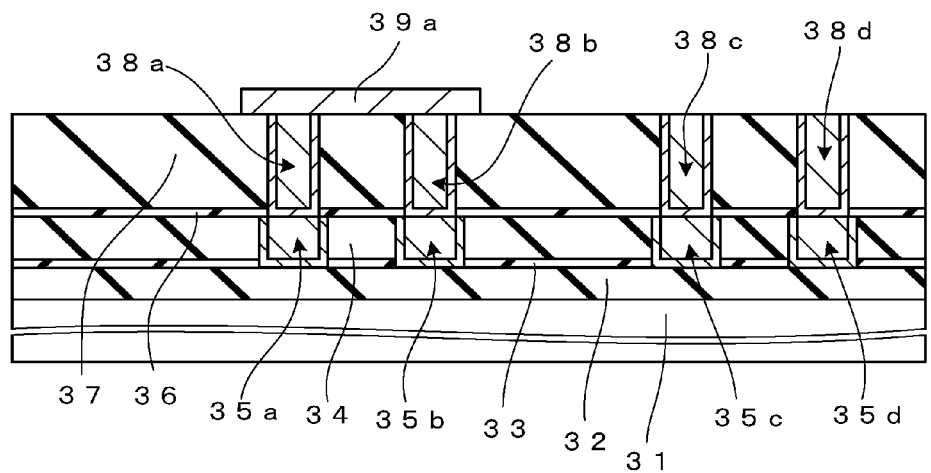

The lower electrode film 39 is then etched by using the resist pattern 40 as a mask. As illustrated in FIG. 5D, the lower electrode film 39 being left after the resist pattern 40 is removed, forms a capacitor lower electrode 39a.

The lower electrode film 39 may be formed on the first-layer via plugs 38c and 38d in an isolated state, for example, by forming a resist pattern (not illustrated) over the via plugs 38c and 38d except the capacitor element forming area. Accordingly, the via plugs 38c and 38d formed of tungsten (W) can be prevented from being damaged by later steps.

Figure 5E:
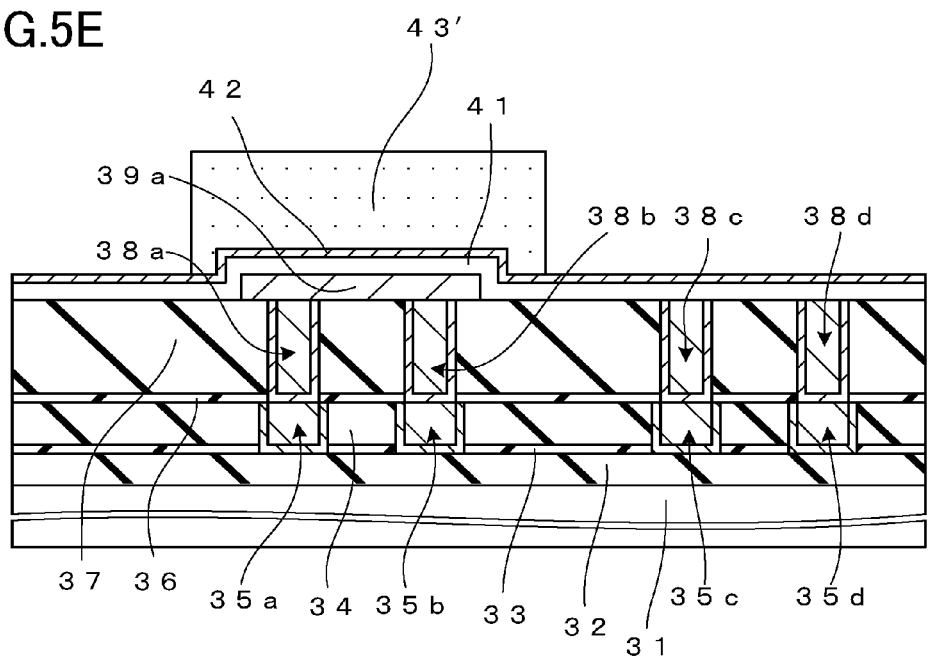

As illustrated in FIG. 5E, a dielectric film 41 and a conductive protection film 42 are then formed in this order on the capacitor lower electrode 39a and the third silicon oxide film 37. As the dielectric film 4, a silicon oxide film with a thickness of about 40 nm, for example, may be formed by the plasma CVD method using TEOS. As the conductive protection film 42, a TiN film with a thickness of about 30 nm, for example, may be formed by the sputtering.

A photoresist is then coated on the conductive protection film 42. A capacitor dielectric film resist pattern 43' having a shape that overlaps with the capacitor lower electrode 39a and protrudes from its outer periphery is then formed by exposing and developing the photoresist. The capacitor dielectric film resist pattern 43' is shaped to cover and overlap with top portions of the via plugs 38a and 38b located in the capacitor element forming area.

The conductive protection film 42 and the dielectric film 41 are then etched by using the resist pattern 43' as a mask. After the etching, the dielectric film 41 is still kept left as this dielectric film 41 is formed on the upper surface and the side surfaces of the capacitor lower electrode 39a.

Figure 5F:
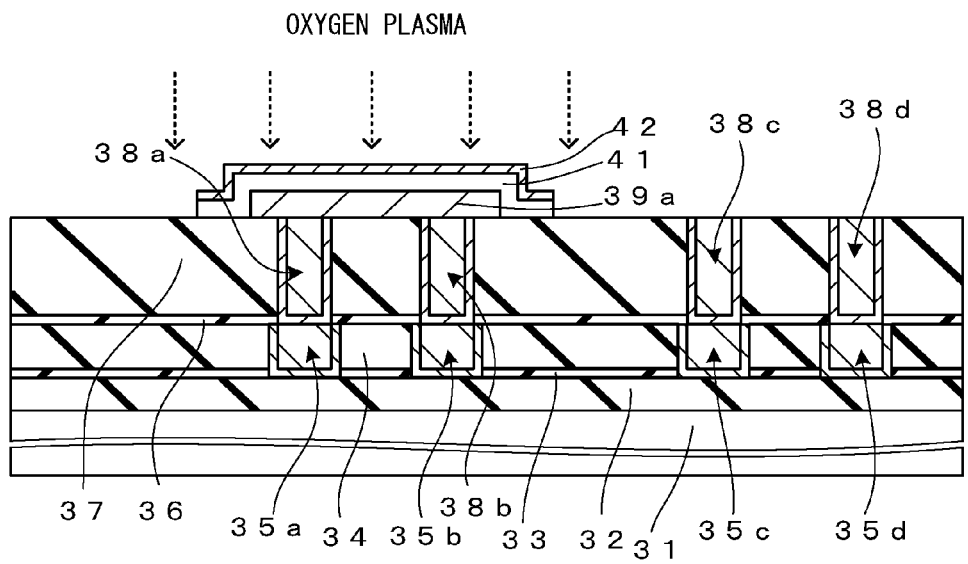

As illustrated in FIG. 5F, the resist pattern 43' is then removed by the ashing using the oxygen plasma, for example. In this case, the conductive protection film 42 prevents the plasma or the ions from entering into the dielectric film 41.

Figure 5G:
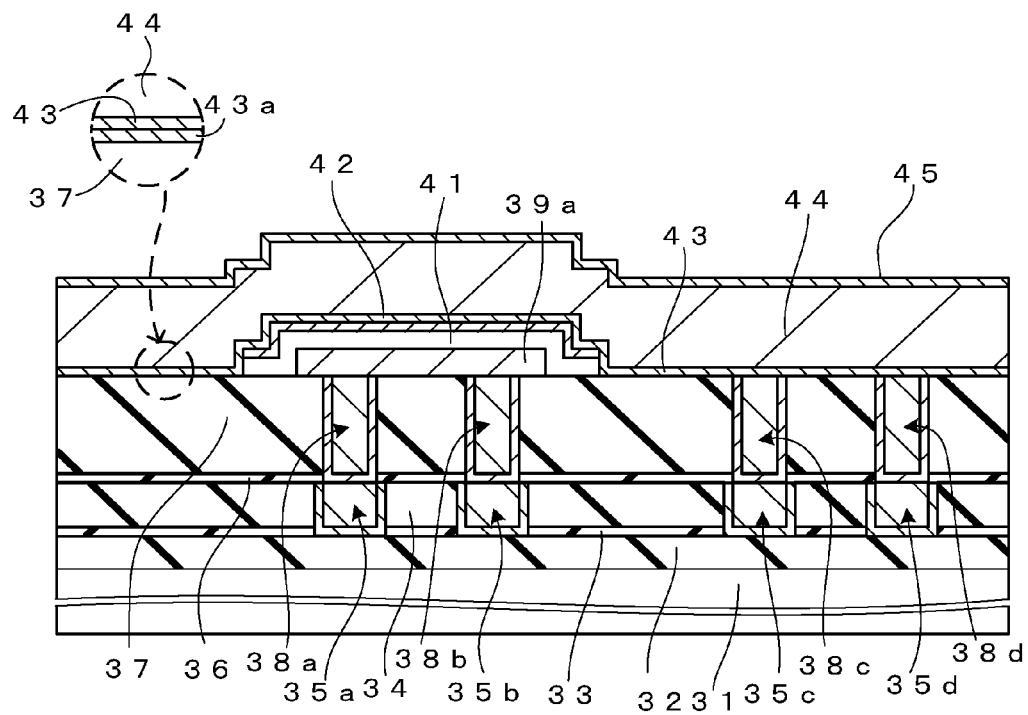

As illustrated in FIG. 5G, a lower barrier metal film 43, a main conductive film 44, and an upper barrier metal film 45 are then formed in this order on the conductive protection film 42, the third silicon oxide film 37, and the via plugs 38c and 38d.

As the lower barrier metal film 43 a TiN film with a thickness of about 40 nm, for example, may be formed by the sputtering. As the main conductive film 44, an AlCu film with a thickness of about 1 μm, for example, may be formed. As the upper barrier metal film 45, a stacked layer structure may be formed by forming a Ti film with a thickness of 5 nm and a TiN film with a thickness of 100 nm in this order, for example.

As indicated within a broken line enclosure in FIG. 5G, a Ti adhesive film 43a may be additionally formed as the underlying film for the lower barrier metal film 43. The Ti adhesive film 43a is formed to improve the adhesion between the third silicon oxide film 37 and the upper TiN film. The formation of the Ti adhesive film 43a may be applied similarly to embodiments described below.

A Ta film may be formed as an alternative to the Ti film. A TaN film may be formed as an alternative to the TiN film. An AlSi film, an AlSiCu film, or the like may be formed as an alternative to the AlCu film.

Figure 5H:
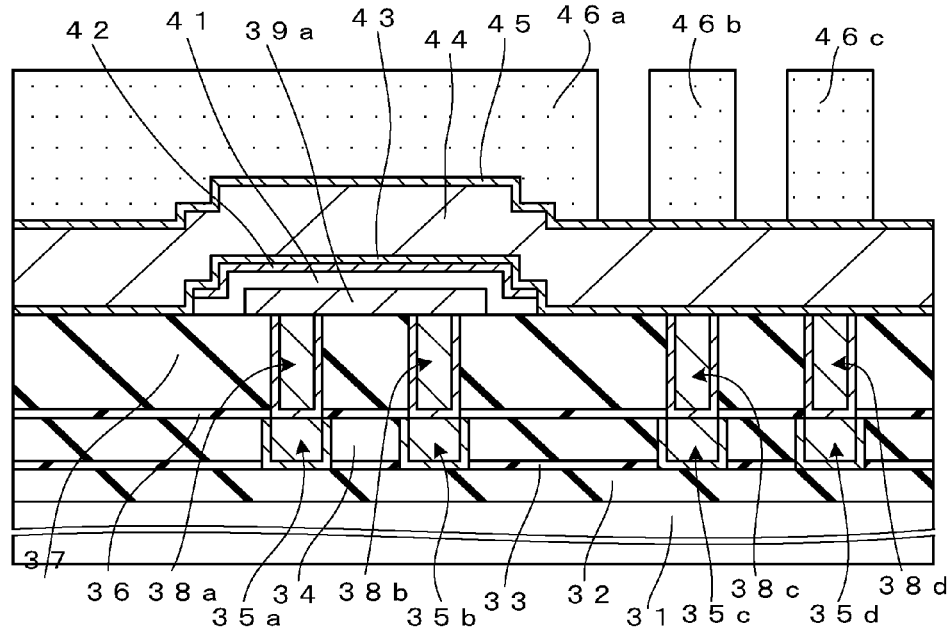

As illustrated in FIG. 5H, a photoresist is then coated on the upper barrier metal film 45. Then, an upper electrode resist pattern 46a and wiring resist patterns 46b and 46c are formed by exposing and developing the photoresist. The upper electrode resist pattern 46a is shaped to overlap with the dielectric film 41 and to protrude laterally toward its outer periphery.

The wiring resist patterns 46b and 46c are shaped to overlap with the respective first-layer via plugs 38c and 38d except the capacitor element forming area.

The upper barrier metal film 45, the main conductive film 44, and the lower barrier metal film 43 are then etched by the RIE method, while using the resist patterns 46a, 46b and 46c as a mask. In this case, for example, a chlorine-based gas may be employed as a reaction gas.

A silicon oxide film may be formed between the resist patterns 46a to 46c and the upper barrier metal film 45, and then this silicon oxide film may be patterned and employed as a hard mask. The hard mask may also be employed in embodiments described below.

Figure 5I:
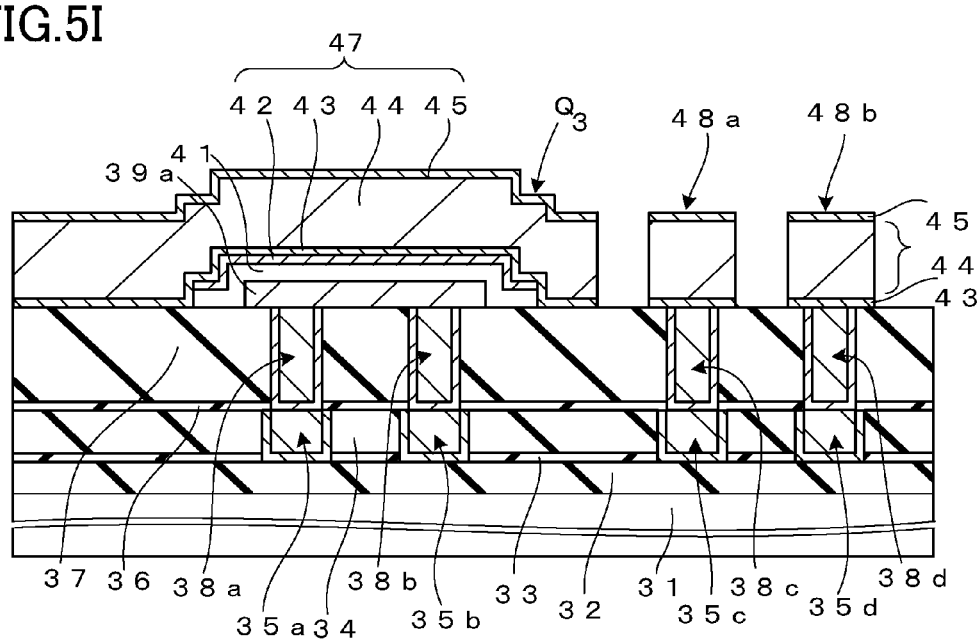

The resist patterns 46a, 46b and 46c are then removed. Thus, as illustrated in FIG. 5I, a capacitor upper electrode 47 is thus formed, and is composed of the upper barrier metal film 45, the main conductive film 44, the lower barrier metal film 43, and the conductive protection film 42 left on the capacitor lower electrode 39a and the dielectric film 41. Thus, an MIM capacitor element $Q_3$ is thus formed, and is composed of the capacitor upper electrode 47, the dielectric film 41, and the capacitor lower electrode 39a.

Other portions of the upper barrier metal film 45, the main conductive film 44, and the lower barrier metal film 43 left on the first-layer via plugs 38c and 38d in the area except the capacitor lower electrode 39a are employed as second-layer wirings 48a, 48b, and the like.

The MIM capacitor element $Q_3$, the wirings 48a, 48b, and the like may have a planar shape as illustrated in FIG. 6, for example.

Figure 5J:
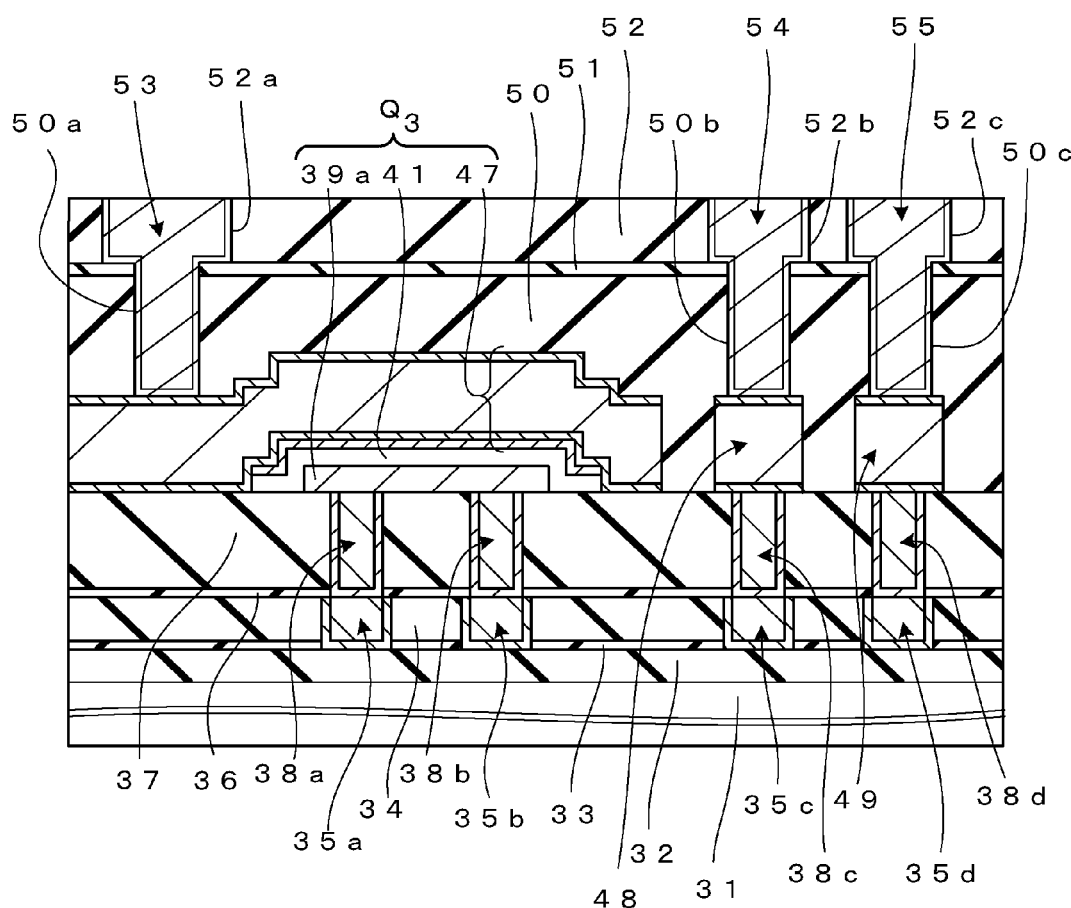

As illustrated in FIG. 5J, a fourth silicon oxide film 50, a third silicon nitride film 51, and a fifth silicon nitride film 52 are then formed in this order on the MIM capacitor element $Q_3$, the wirings 48a and 48b, and the third silicon oxide film 37, by the CVD method. After the fourth silicon oxide film 50 is formed, its surface is planarized by the CMP method.

The fifth silicon nitride film 52, the third silicon nitride film 51, and the fourth silicon oxide film 50 are then patterned by the photolithography method using the resist pattern. Via holes 50a to 50c are then formed on the capacitor upper electrode 47 of the MIM capacitor element $Q_3$ and on the wirings 48a and 48b, respectively.

Wiring recesses 52a to 52c, which partially overlaps with the via holes 50a to 50c, are then formed by patterning the fifth silicon nitride film 52 by means of the photolithography method. In this case, the plasma etching process using a CF-based gas, for example, may be used to etch the fifth silicon nitride film 52, while the third silicon nitride film 51 acts as the etching stopper, which facilitates depth control of the wiring recesses 52a to 52c. The third silicon nitride film 51 exposed from the wiring recesses 52a to 52c is then removed selectively by adjusting a gas seed or plasma conditions, so that the wiring recesses 52a to 52c are deepened.

A TaN film with a thickness of 30 to 50 nm and a copper seed film with a thickness of 100 nm are then formed in order in the wiring recesses 52a to 52c by the sputtering, and then these wiring recesses are filled with a copper film by the electroplating. The TaN film, the copper seed film, and the copper film formed on an upper surface of the fifth silicon nitride film 52 are removed by the CMP method.

Accordingly, wirings with a dual damascene structure and via films 53 to 55 are formed in the wiring recesses 52a to 52c and the underlying via holes 50a to 50c, respectively.

Multi-layer wirings composed of silicon oxide films, copper wirings, vias, and the like may be then formed (not illustrated).

The dielectric film 41 of the MIM capacitor element $Q_3$ with the above structure, as well as the conductive protection film 42 formed thereon is patterned. Thus, the conductive protection film 42 prevents the dielectric film 41 from contacting directly the plasma, the ion, or the solution in the removing process of the resist pattern 46a and the subsequent rinsing process.

On the contrary, when the oxygen plasma generated for the ashing is irradiated directly onto the dielectric film 41, the dielectric film 41 is damaged, so that a film thickness of the dielectric film 41 may be possibly varied, or a withstand voltage may be possibly lowered.

However, according to this embodiment, as illustrated in FIG. 5F, the upper side of the dielectric film 41 is covered with the conductive protection film 42, and hence has such a structure that is hardly subject to possible variations in film thickness or possible deterioration of a withstand voltage thereof which may be caused due to the damage by the oxygen plasma or the ion irradiation.

Figure 7:
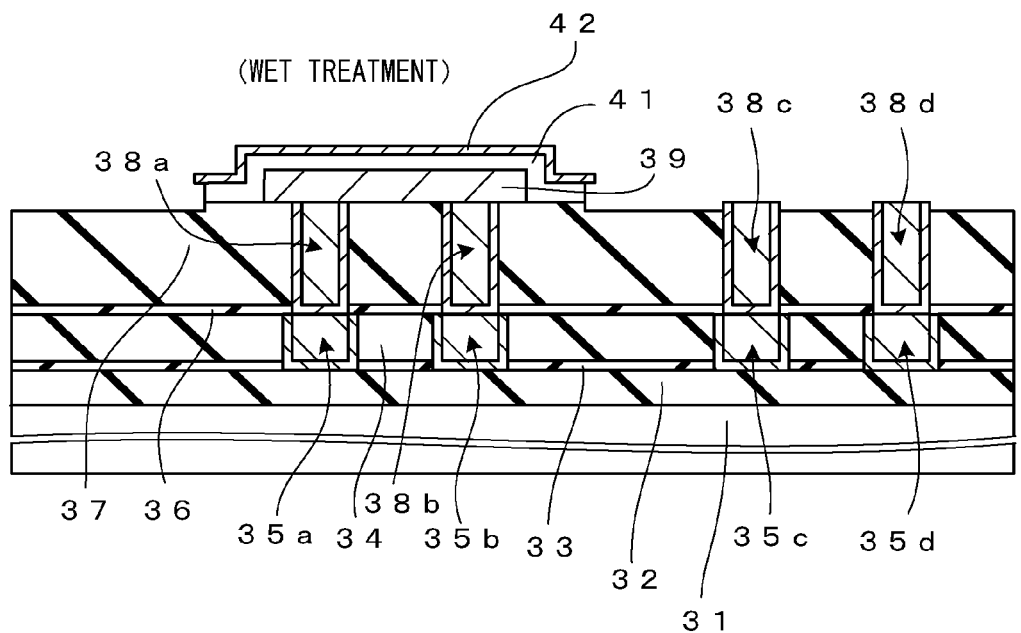
FIG. 7 is an example of a sectional view illustrating a state that a dielectric film of a capacitor element in the semiconductor device according to the third embodiment of the invention is patterned and then subject to a wet-surface treatment.

At the later step, a hydrofluoric acid solution or an ammonium fluoride solution is supplied to a surface of the third silicon oxide film 37 to remove the etching residue, and the like. In this case, as illustrated in FIG. 7, the outer periphery of the dielectric film 41 that is not covered with the conductive protection film 42 is etched by the solution and is slightly shrunk. This, however, does not cause a variation in film thickness of the dielectric film 41.

The shrinkage of the dielectric film 41 does not cause any trouble if the dielectric film 41 is patterned wider previously in view of the wet surface treatment. In this case, however, after the wet surface treatment, the dielectric film 41 covers the capacitor lower electrode 39a so as not to expose its outer periphery. Thus, it is desirable to control a retreat width of the edge portion of the dielectric film 41 caused by the wet surface treatment.

As describe above, according to this embodiment, the patterned dielectric film 41 is prevented from being damaged, and deterioration of film quality of the dielectric film 41 is suppressed.

When the Ti film is formed under the capacitor dielectric film resist pattern 43, a diffusion of Ti into the dielectric film 41 is prevented because the conductive protection film 42 is formed of the TiN film.

A part of the TiN film diffuses into the third silicon oxide film 37 to improve its adhesion, while a part of the TiN film that is diffused into the dielectric film 41 may cause a withstand voltage of the MIM capacitor element $Q_3$ to be lowered, and cause fixed charges to occur. However, according to this embodiment, the conductive protection film 42 made of TiN is formed between the dielectric film 41 and the lower barrier metal film 43. This prevents Ti from diffusing into the dielectric film 41, and prevents the capacitor characteristics from being deteriorated.

Figure 8A:
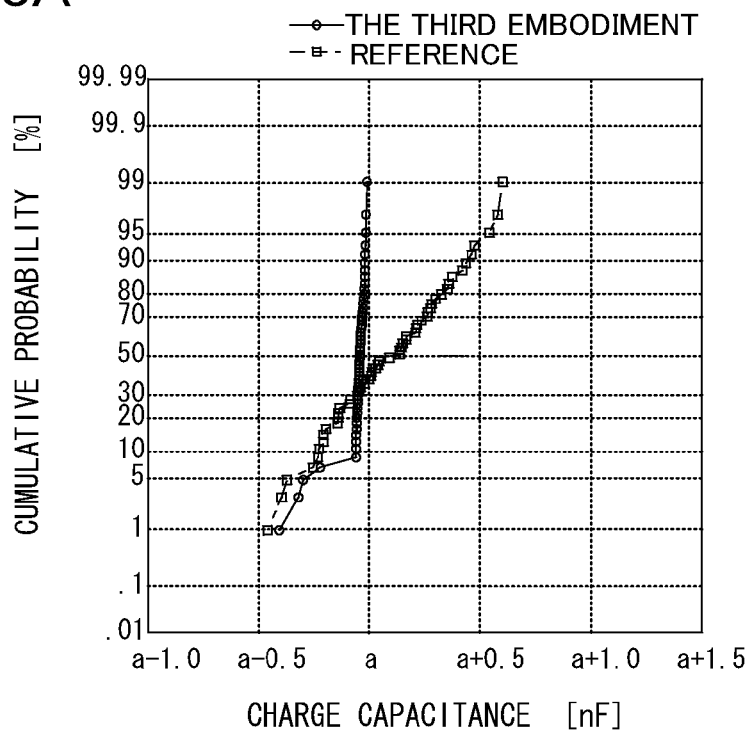
FIG. 8A illustrates an example of respective charge capacitances of a capacitor element of the semiconductor device according to the third embodiment of the invention, and of a capacitor element for reference.
Figure 8B:
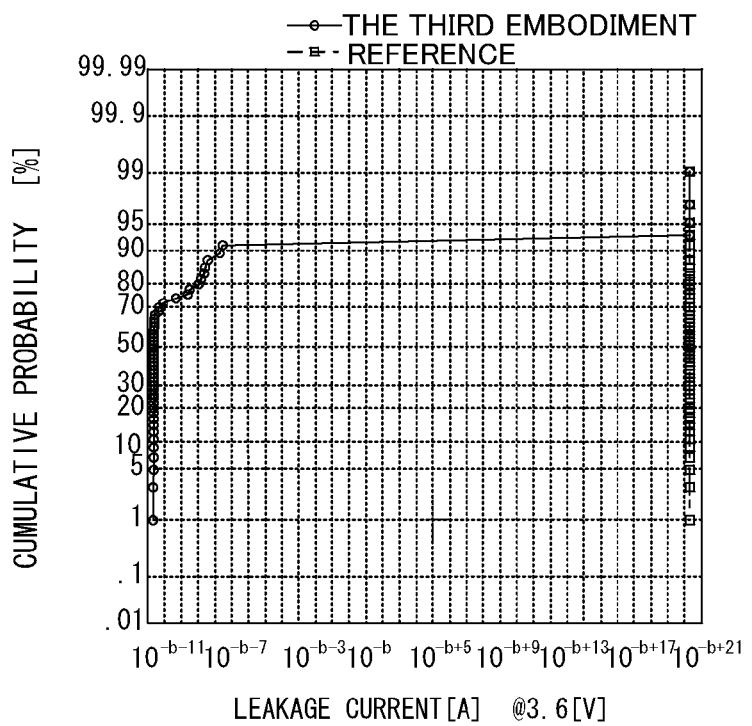
FIG. 8B illustrates an example of respective leakage current characteristics of the capacitor element of the semiconductor device according to the third embodiment of the invention, and of the capacitor element for the reference.

Tests to measure the charge capacity and the leakage current were conducted for the MIM capacitor element $Q_3$, in which the conductive protection film 42 is formed on the dielectric film 41, and for the MIM capacitor element for reference, in which the conductive protection film 42 is not formed on the dielectric film 41, respectively. Results of the tests are indicated in FIGS. 8A and 8B. As can be seen from these results, it is appreciated that deterioration of the capacitor element characteristics is suppressed by protecting the dielectric film 41 with the conductive protection film 42.

In the MIM capacitor element for the reference, the capacitor element characteristics may be further improved by adjusting the forming conditions.

The test elements used in FIGS. 8A and 8B have such an arrangement that a number of the MIM capacitor elements are formed in a square area of about 2 mm×2 mm. Each MIM capacitor element has such a structure that a size of the capacitor lower electrode is defined as about 90 μm×90 μm and also a distance between the edge of the capacitor lower electrode and the edge of the dielectric film is defined as 0.5 μm.

(Fourth Embodiment)

FIGS. 9A to 9G are an example of sectional views illustrating steps of forming a semiconductor device according to a fourth embodiment of the invention. In FIGS. 9A to 9G, the same reference symbols and numerals as those in FIGS. 5A to 5J denote similar elements.

Figure 9A:
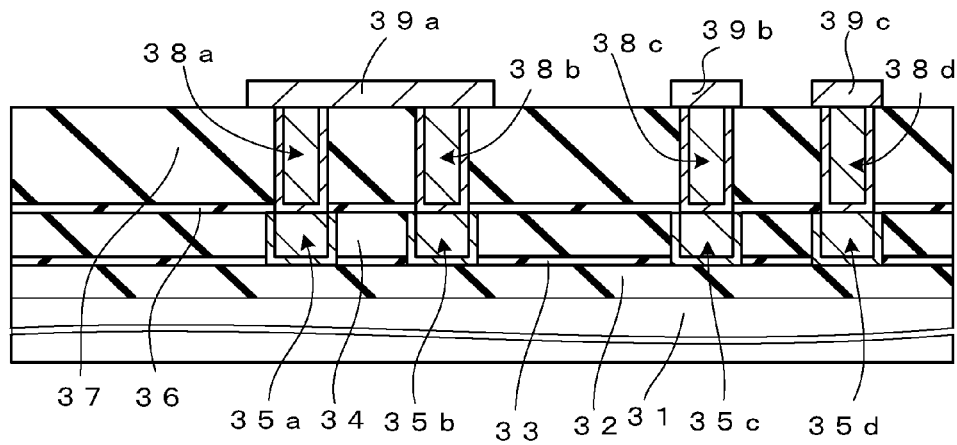
FIGS. 9A to 9G are an example of sectional views illustrating a semiconductor device and steps of forming the same, according to a fourth embodiment of the invention.

As illustrated in FIG. 9A, similarly to the third embodiment, the first silicon oxide film 32, the first silicon nitride film 33, and the second silicon oxide film 34 are formed in this order on the semiconductor substrate 31. The first-layer copper wirings 35a to 35d are formed in the second silicon oxide film 34 and the first silicon nitride film 33.

The second silicon nitride film 36 and the third silicon oxide film 37 are formed in this order on the second silicon oxide film 34 and the first-layer copper wirings 35a to 35d. The first-layer via plugs 38a to 38d to be connected to the first-layer copper wirings 35a to 35d are then formed in the third silicon oxide film 37 and the second silicon nitride film 36.

In this arrangement, as the lower electrode film 39, a TiN film with a thickness of 50 to 100 nm, for example, may be formed on the third silicon oxide film 37 and the first-layer via plugs 38a to 38d by the sputtering. The capacitor lower electrode 39a is then formed by patterning the lower electrode film 39 by the same method as that of the third embodiment.

In this embodiment, portions of the lower electrode film 39 are left on the respective via plugs 38c and 38d as well as the via plugs 38a and 38b located under the capacitor lower electrode 39a, and these lower electrode film portions are used as conductive pads 39b and 39c. Accordingly, the via plugs 38c and 38d made of W are prevented from being damaged in the later steps.

Figure 9B:
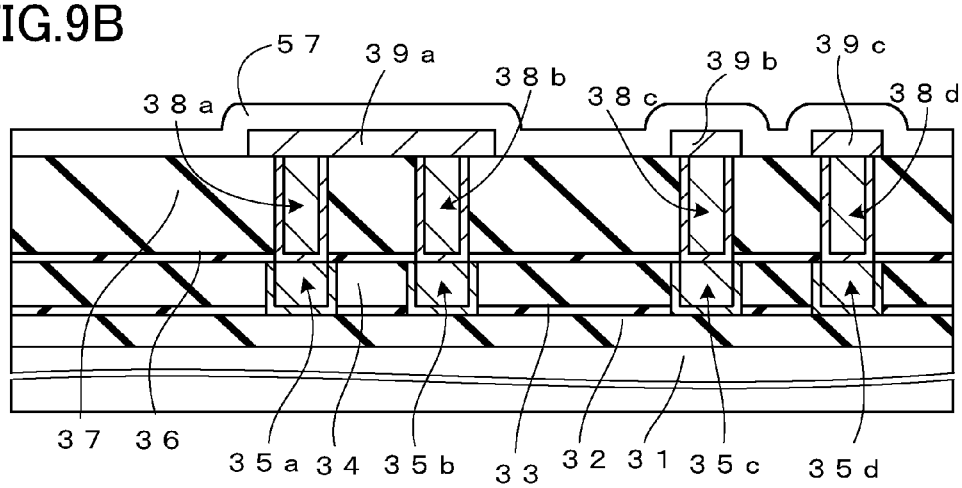

As illustrated in FIG. 9B, an insulating film 57 with a thickness of 100 nm to 150 nm, for example, may be formed on the capacitor lower electrode 39a, the conductive pads 39b and 39c, and the third silicon oxide film 37.

The insulating film 57 may be a silicon oxide film formed by the plasma CVD method using a reaction gas containing silane or TEOS, for example, or may be a silicon nitride film formed by the CVD method using a reaction gas containing silane and ammonia, for example.

Figure 9C:
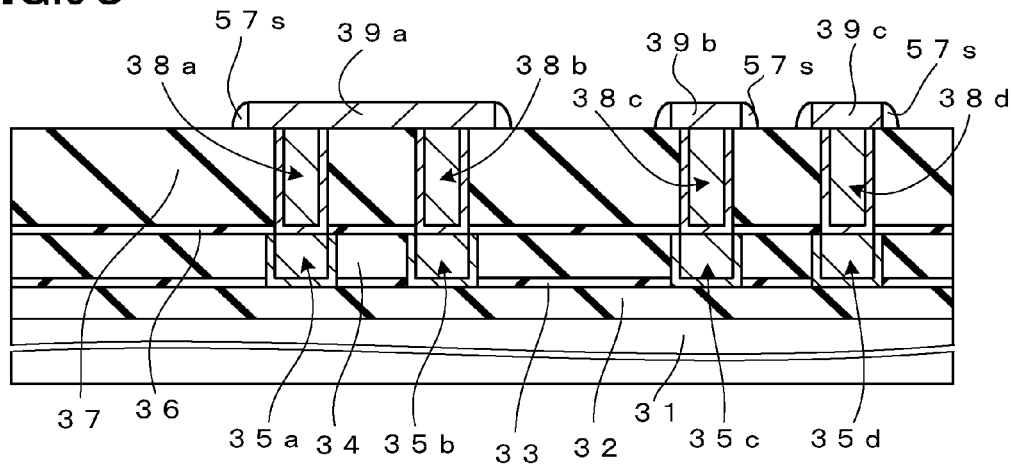

As illustrated in FIG. 9C, the insulating film 57 is then anisotropically etched by the sputtering, the RIE method, or the like. Thus, portions of the insulating film 57 are left as insulating sidewalls 57s on side surfaces of the capacitor lower electrode 39a and of the conductive pads 39b and 39c, respectively. In this case, the film thickness of the insulating sidewall 57s is reduced gently and continuously from the side surfaces of the capacitor lower electrode 39a and the conductive pads 39b and 39c to the outward, so that each of exposed surfaces of the insulating sidewalls 57s forms an inclined surface.

Figure 9D:
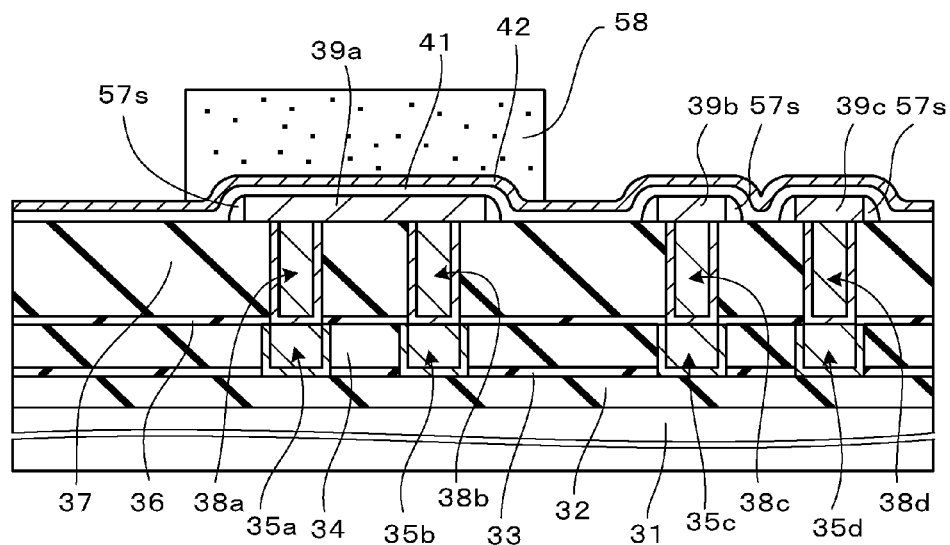

As illustrated in FIG. 9D, the dielectric film 41 and the conductive protection film 42 are then formed in this order on the capacitor lower electrode 39a, the conductive pads 39b and 39c, the insulating sidewalls 57s, and the third silicon oxide film 37. In this case, as the dielectric film 41, a silicon oxide film with a thickness of about 40 nm may be formed by the plasma CVD method using TEOS. As the conductive protection film 42, a TiN film with a thickness of about 30 nm may be formed by the sputtering.

The dielectric film 41 and the conductive protection film 42 have a gentle exposed inclined or sloping surface on the side portions of the capacitor lower electrode 39a respectively. A film thickness of the dielectric film 41 and the conductive protection film 42 formed on the insulating sidewall 57s becomes substantially uniform respectively.

A photoresist is then coated on the conductive protection film 42. A capacitor dielectric film resist pattern 58 is then formed over the capacitor lower electrode 39a and the area of a portion protruding from its outer periphery by exposing and developing the photoresist. The conductive protection film 42 and the dielectric film 41 are then etched by using the resist pattern 58 as a mask.

Accordingly, the dielectric film 41 is patterned into a shape that covers the upper surface and side surfaces of the capacitor lower electrode 39a, and the conductive protection film 42 is patterned into a shape that covers the upper surface of the dielectric film 41. A chlorine-based gas, for example, may be employed in etching the conductive protection film 42, and also a fluorine-based gas, for example, may be employed in etching the dielectric film 41.

In this case, the etching conditions are set such that at least the conductive protection film 42 is not left on the insulating sidewalls 57s on the side portions of the conductive pads 39b and 39c.

Figure 9E:
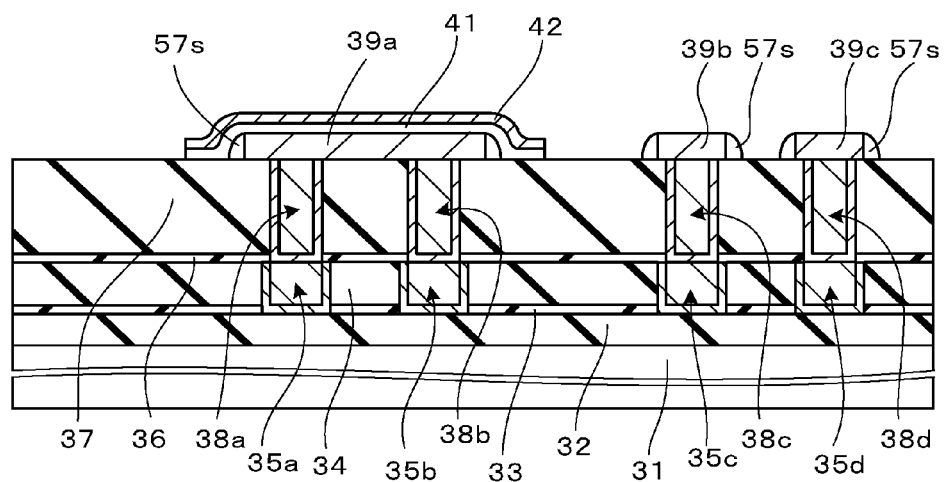

As illustrated in FIG. 9E, the resist pattern 58 is then removed, after the dielectric film 41 and the conductive protection film 42 are etched. The removing method may be the ashing using the oxygen plasma, for example. In this case, the conductive protection film 42 prevents the dielectric film 41 from being adversely affected by the plasma. In cleaning the surface of the third silicon oxide film 37 using a hydrofluoric acid or the like after the ashing, the dielectric film 41 is slightly etched at its sides. However, a film thickness of the dielectric film 41 is not reduced, because it is protected by the conductive protection film 42.

Figure 9F:
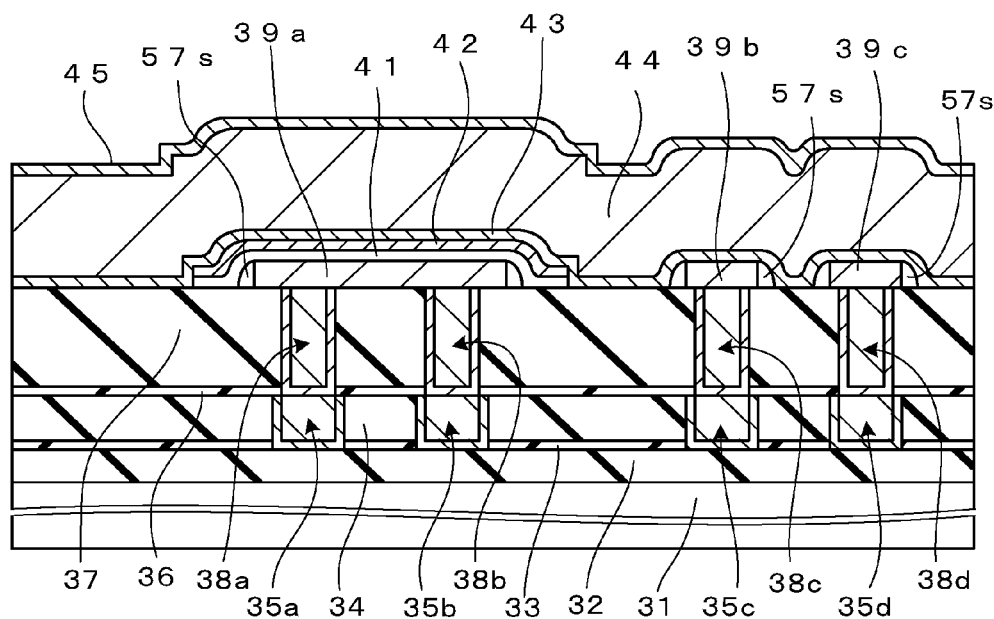

As illustrated in FIG. 9F, the lower barrier metal film 43, the main conductive film 44, and the upper barrier metal film 45 are then formed on the conductive protection film 42, the third silicon oxide film 37, and the conductive pads 39b and 39c by a method similar to that in the third embodiment.

Similarly to the third embodiment, a resist pattern (not illustrated) is then formed on the upper barrier metal film 45. The upper barrier metal film 45, the main conductive film 44, and the lower barrier metal film 43 are then etched by using the resist pattern as a mask.

Figure 9G:
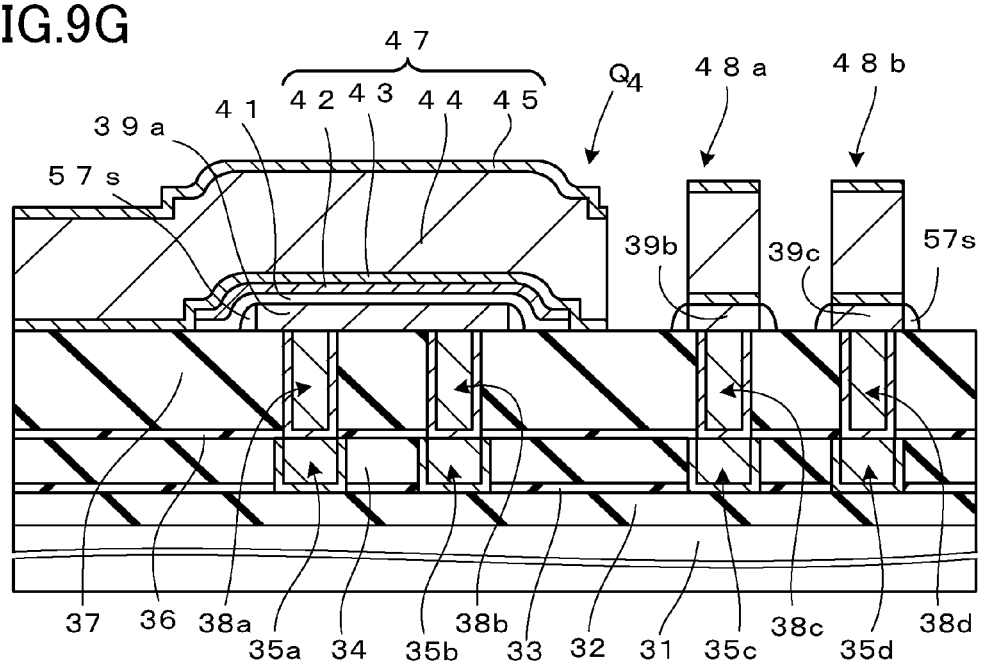

The resist pattern is then removed. Thus, as illustrated in FIG. 9G, the capacitor upper electrode 47 is composed of the upper barrier metal film 45, the main conductive film 44, and the lower barrier metal film 43 left on the capacitor lower electrode 39a and the dielectric film 41 and their peripheries. The conductive protection film 42 on the dielectric film 41 becomes a part of the capacitor upper electrode 47.

An MIM capacitor element $Q_4$ is thus formed, and is composed of the capacitor upper electrode 47, the dielectric film 41, and the capacitor lower electrode 39a.

The upper barrier metal film 45, the main conductive film 44, and the lower barrier metal film 43 left on the conductive pads 39b and 39c in the area except the capacitor lower electrode 39a are used as the second-layer wirings 48a and 48b, and the like.

The MIM capacitor element $Q_4$, the wirings 48a and 48b, and the like have a planar shape, which may be the same shape as that illustrated in FIG. 6, for example.

Although not particularly illustrated, similarly to the third embodiment, the fourth silicon oxide film, the third silicon nitride film, and the like may be then formed. The third silicon nitride film 51 and the fifth silicon nitride film 52 may be formed in order by the CVD method.

In the MIM capacitor element $Q_4$ as described above, the insulating sidewall 57s, a film thickness of which is changed gently toward the outside, is formed on the side walls of the capacitor lower electrode 39a and the conductive pads 39b and 39c, respectively. Thus, a sharp step-wise level difference is eliminated on each of side surfaces of the capacitor lower electrode 39a and the conductive pads 39b and 39c.

Accordingly, even when the dielectric film 41 and the conductive protection film 42 are formed under or within a large amount or thickness of deposition in the vertical direction over the substrate surface, film thicknesses of the dielectric film 41 and of the conductive protection film 42 in the side surfaces of the capacitor lower electrode 39a and the conductive pads 39b and 39c may become relatively uniform.

The dielectric film 41 and the conductive protection film 42 are formed on the insulating sidewalls 57s on the sides of the capacitor lower electrode 39a and the conductive pads 39b and 39c, respectively, to have relatively uniform film thicknesses. Thus, the characteristics of the MIM capacitor element $Q_4$ can be prevented from being deteriorated. Also, the insulating sidewall 57s is effective to substantially provide an increased distance between the side portion of the capacitor lower electrode 39a and the side portion of the capacitor upper electrode 47. Thus, a leakage current occurring between the electrodes 39a and 47 at their edge portions can be suppressed.

On the contrary, when the dielectric film 41 and the conductive protection film 42 are formed under or within a large amount or thickness of deposition in the vertical direction over the substrate surface while a level difference at the side portion of the capacitor lower electrode 39a exhibits a sharp step-wise form, coverage of the side walls by the dielectric film 41 and the conductive protection film 42 may become poor, and the dielectric film 41 and the conductive protection film 42 may be thinned locally at upper corners of the step-wise level difference. Thus, the leakage current may tend to flow through the dielectric film 41 at those thinned portions, and hence desirable capacitor element characteristics for the MIM capacitor element $Q_4$ may not be obtained.

Similarly to the third embodiment, the dielectric film 41 of the MIM capacitor element $Q_4$ is patterned successively together with the conductive protection film 42 formed thereon. Thus, the dielectric film 41 is prevented from contacting directly the plasma, the ion, or the solution, in the removing process of the resist pattern 46a serving as a mask in the patterning and in the subsequent rinsing process. This patterned structure can contribute an improvement of the capacitor element characteristics.

Figure 10A:
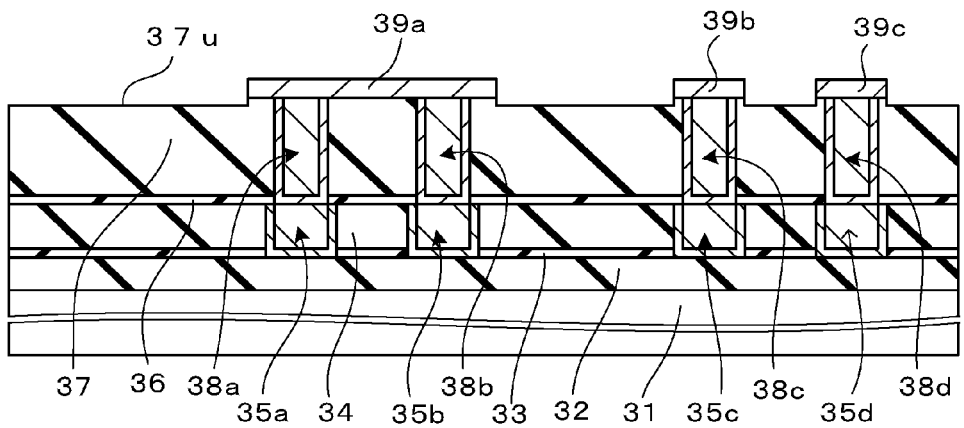
FIGS. 10A to 10C are an example of sectional views illustrating another example of the semiconductor device and steps of forming the same, according to the fourth embodiment of the invention.

In forming the capacitor lower electrode 39a and the conductive pads 39b and 39c by patterning the lower electrode film 39, the overetching is applied. As illustrated in FIG. 10A, a concave portion 37u is formed on the third silicon oxide film 37 in the areas except the capacitor lower electrode 39a and the conductive pads 39b and 39c.

The concave portion 37u increases a step-wise level difference at the side portions of the capacitor lower electrode 39a and the conductive pads 39b and 39c. Thus, improvement is desired for further coverage of the increased step-wise level difference.

Figure 10B:
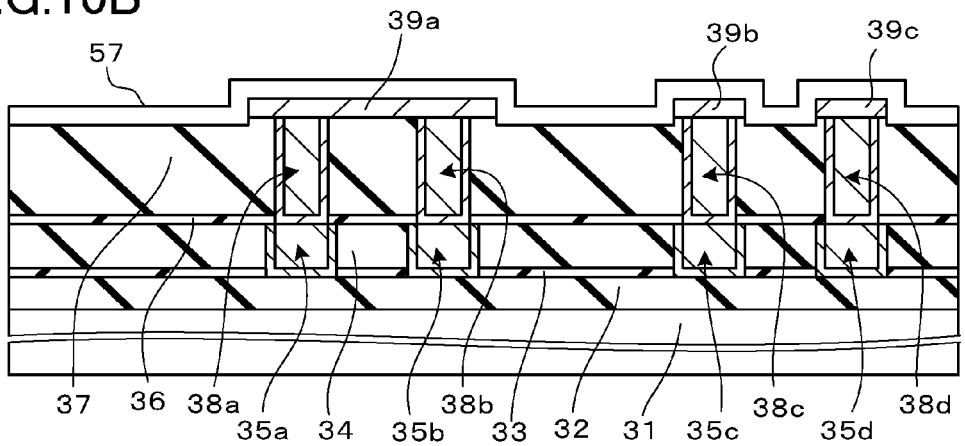

Thus, as illustrated in FIG. 10B, the insulating film 57 is formed thicker on the capacitor lower electrode 39a, the conductive pads 39b and 39c, and the concave portions 37u, and then the insulating sidewalls 57s are formed by applying the anisotropic etching in the vertical direction.

Figure 10C:
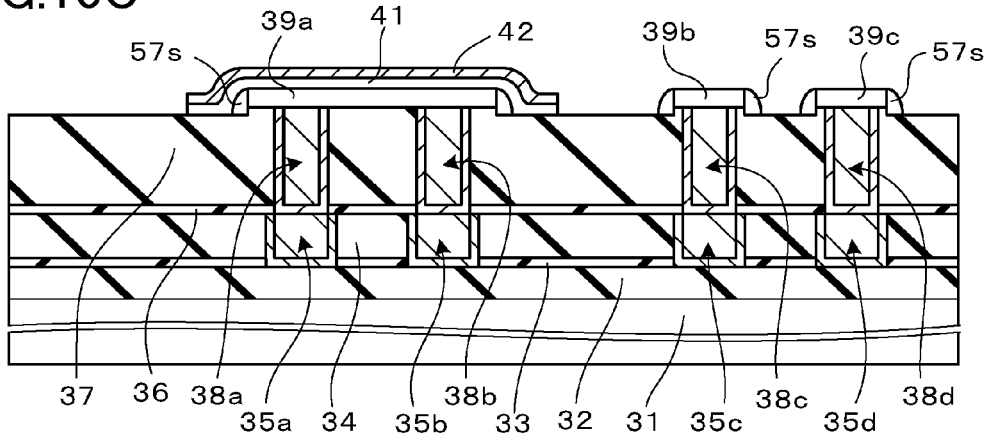

According to this improvement, as illustrated in FIG. 10C, even when the surrounding step-wise level difference portion is increased due to the factors other than the thickness of the capacitor lower electrode 39a and the conductive pads 39b and 39c, the film thicknesses of the dielectric film 41 and the conductive protection film 42 can be made substantially uniform by the insulating sidewalls 57s.

(Fifth Embodiment)

FIGS. 11A to 11H are an example of sectional views illustrating steps of forming a semiconductor device according to a fifth embodiment of the invention. In FIGS. 11A to 11H, the same reference symbols and numerals as those in FIGS. 5A to 5J denote similar elements.

Figure 11A:
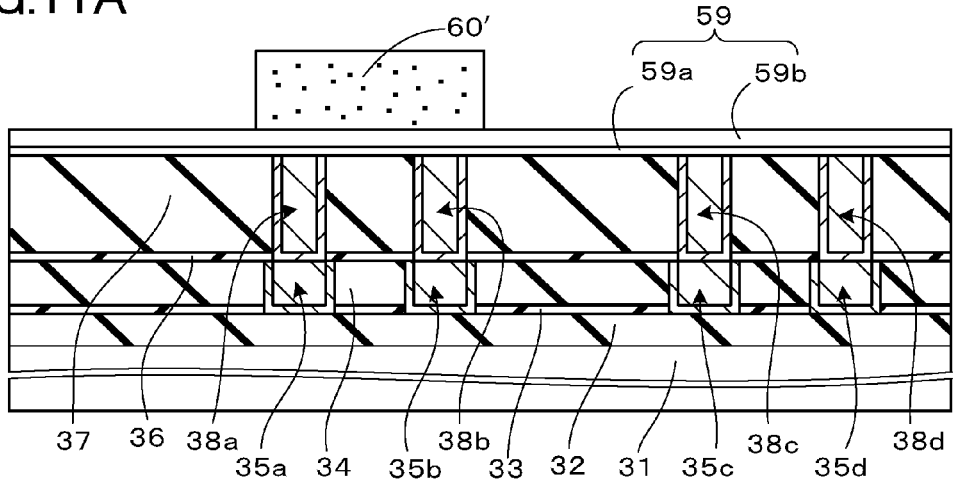
FIGS. 11A to 11H are an example of sectional views illustrating a semiconductor device and steps of forming the same, according to a fifth embodiment of the invention.

In FIG. 11A, similarly to the third embodiment, the first silicon oxide film 32, the first silicon nitride film 33, and the second silicon oxide film 34 are formed in this order on the semiconductor substrate 31. The first-layer copper wirings 35a to 35d are formed in the second silicon oxide film 34 and the first silicon nitride film 33.

The second silicon nitride film 36 and the third silicon oxide film 37 are formed in this order on the second silicon oxide film 34 and the first-layer copper wirings 35a to 35d. The first-layer via plugs 38a to 38d connected to the first-layer copper wirings 35a to 35d are then formed in the third silicon oxide film 37 and the second silicon nitride film 36.

In this arrangement, a first TiN film 59a with a thickness of 30 to 50 nm and a first W film 59b with a thickness of 150 to 200 nm, for example, are formed in this order on the third silicon oxide film 37 and the first-layer via plugs 38a to 38d for the lower electrode film by the sputtering.

A photoresist is then coated on the first W film 59b. A capacitor lower electrode resist pattern 60' having a planar shape of the capacitor lower electrode is then formed by exposing and developing the photoresist.

Figure 11B:
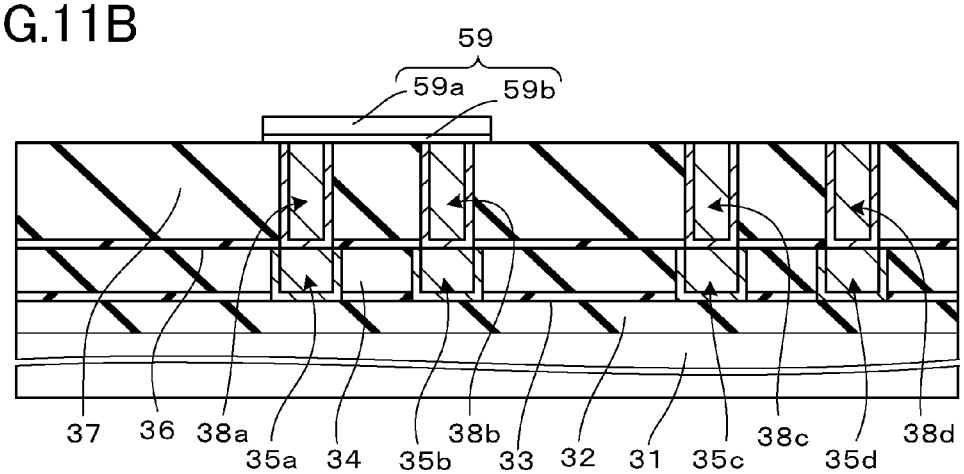

The first TiN film 59*a* and the first W film 59*b* are then etched by the RIE method using a chlorine-based gas, for example, while using the resist pattern 60' as a mask. As illustrated in FIG. 11B, the first TiN film 59*a* and the first W film 59*b* left after the resist pattern 60' is removed are used as a capacitor lower electrode 59.

Figure 11C:
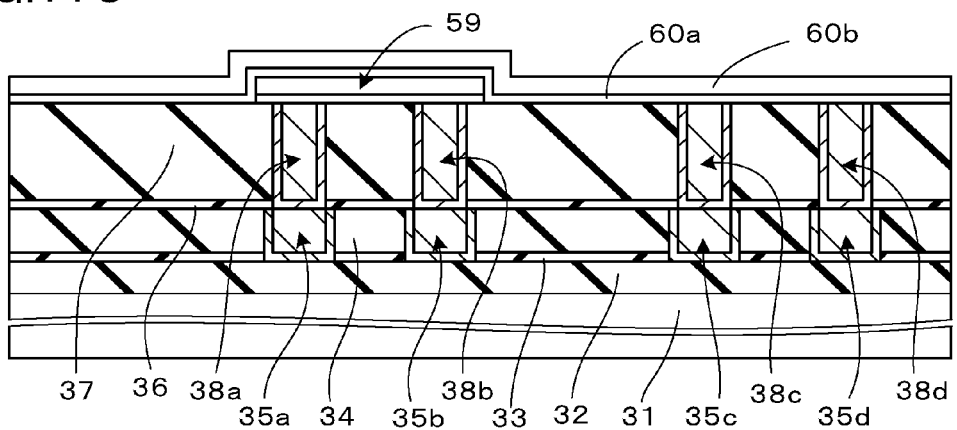

As illustrated in FIG. 11C, a second TiN film 60*a* with a thickness of 30 to 50 nm and a second W film 60*b* with a thickness of 150 to 200 nm, for example, are then formed in this order as the conductive film on the capacitor lower electrode 59 and the third silicon oxide film 37 by the sputtering.

Figure 11D:
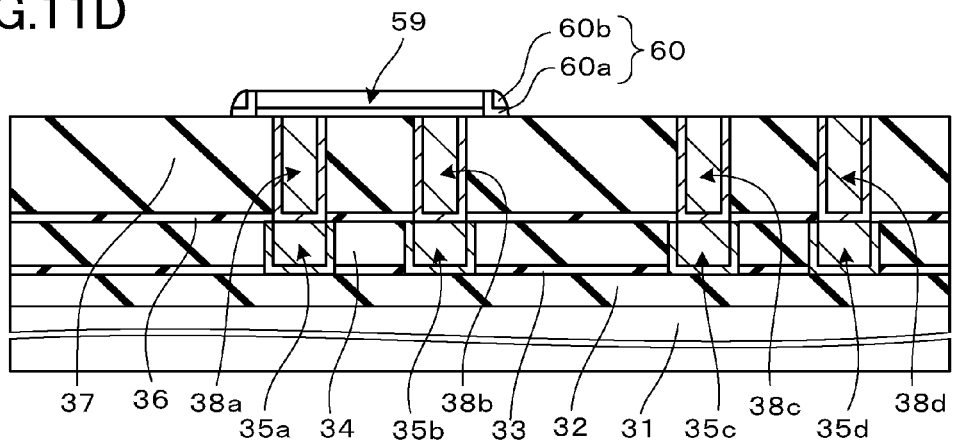

As illustrated in FIG. 11D, the second TiN film 60*a* and the second W film 60*b* are then anisotropically etched by the sputtering, the RIE method, or the like, and are left as a conductive sidewall 60 so as to form a part of the capacitor lower electrode 59. In this case, a film thickness distribution of the sidewall 60 changes or slopes gently from the side surface of the capacitor lower electrode 59 to the outer side, and thus its exposed surface forms an inclined surface. The conductive sidewall 60 forms a part of the capacitor lower electrode 59.

The materials of the capacitor lower electrode 59 and the sidewall 60 are not limited to TiN and W, and may be other metals or metallic compounds. The capacitor lower electrode 59 and the sidewall 60 are not limited to the double-layer structure, and may be a single-layer structure, or a multi-layer structure composed of three or more layers.

Figure 11E:
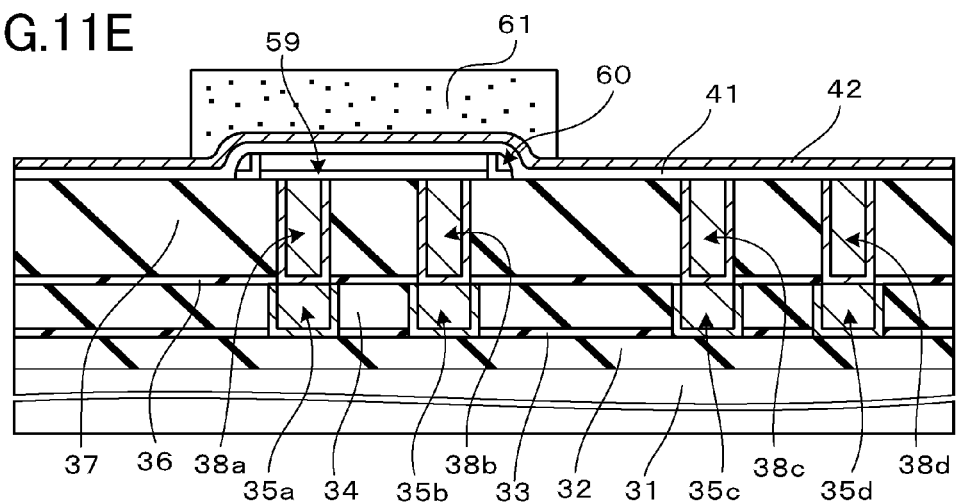

As illustrated in FIG. 11E, the dielectric film 41 and the conductive protection film 42 are then formed in this order over the capacitor lower electrode 59, the sidewall 60, and the third silicon oxide film 37. In this case, as the dielectric film 41, a silicon oxide film with a thickness of about 40 nm may be formed by the plasma CVD method using TEOS. As the conductive protection film 42, a TiN film with a thickness of about 30 nm may be formed by the sputtering.

The dielectric film 41 and the conductive protection film 42 on the side portion of the capacitor lower electrode 59 are formed on the sidewall 60 having a gentle slope. Thus, the film thickness of these films becomes substantially uniform over the entire upper substrate surface.

Similarly to the third embodiment, a photoresist is then coated on the conductive protection film 42. A capacitor dielectric film resist pattern 61 is then formed on the capacitor lower electrode 59 and the area of a portion protruding from the outer periphery, by exposing and developing the photoresist. The dielectric film 41 and the conductive protection film 42 are then etched by using the resist pattern 61 as a mask.

Accordingly, the dielectric film 41 is patterned into a shape to cover the upper surface and side surfaces of the capacitor lower electrode 59, and the conductive protection film 42 is patterned into a shape to cover the upper surface of the dielectric film 41. A chlorine-based gas, for example, may be employed in etching the conductive protection film 42, and a fluorine-based gas, for example, may be employed in etching the dielectric film 41.

Figure 11F:
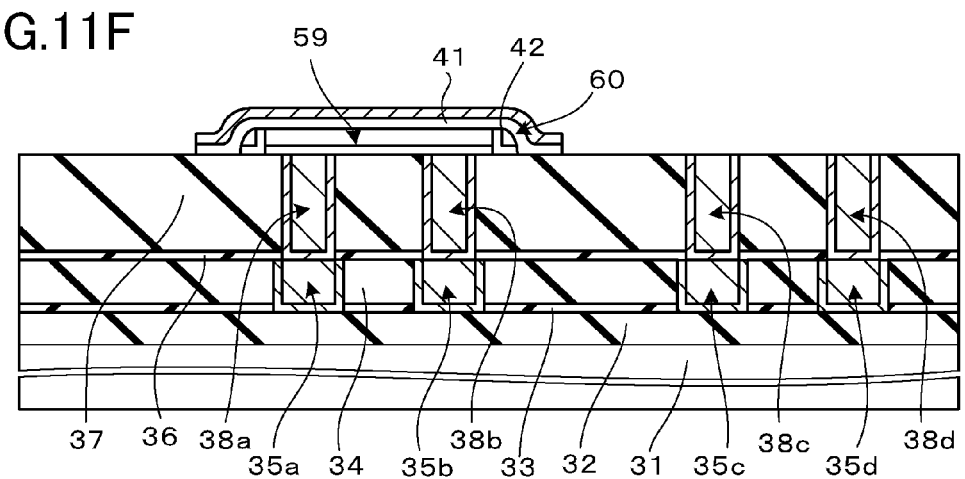

As illustrated in FIG. 11F, the capacitor dielectric film resist pattern 61 is then removed, after the etching of the dielectric film 41 and the conductive protection film 42. As the removing method, the ashing using the oxygen plasma, for example, may be employed. In this case, the conductive protection film 42 prevents the dielectric film 41 from being adversely affected by the plasma. In cleaning the surface of the third silicon oxide film 37 by a hydrofluoric acid or the like after the ashing, the dielectric film 41 is slightly etched at its lateral sides. However, a film thickness of the dielectric film 41 is not reduced, because it is protected by the conductive protection film 42.

Figure 11G:
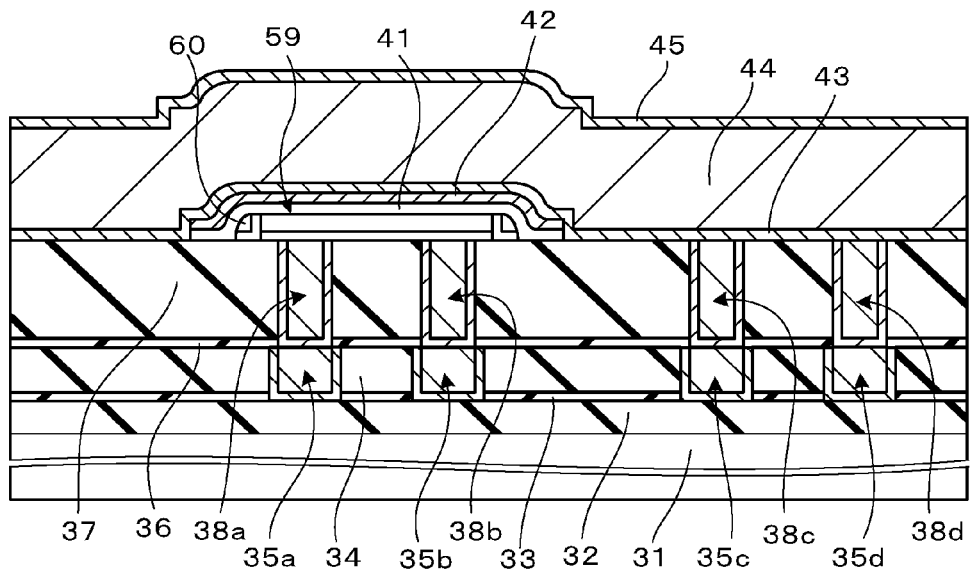

As illustrated in FIG. 11G, the lower barrier metal film 43, the main conductive film 44, and the upper barrier metal film 45 are then formed on the conductive protection film 42, the third silicon oxide film 37, and the via plugs 38*c* and 38*d* by a method similar to that in the third embodiment.

Similarly to the third embodiment, a resist pattern (not illustrated) is then formed on the upper barrier metal film 45. The upper barrier metal film 45, the main conductive film 44, and the lower barrier metal film 43 are then etched by using the resist pattern as a mask.

Figure 11H:
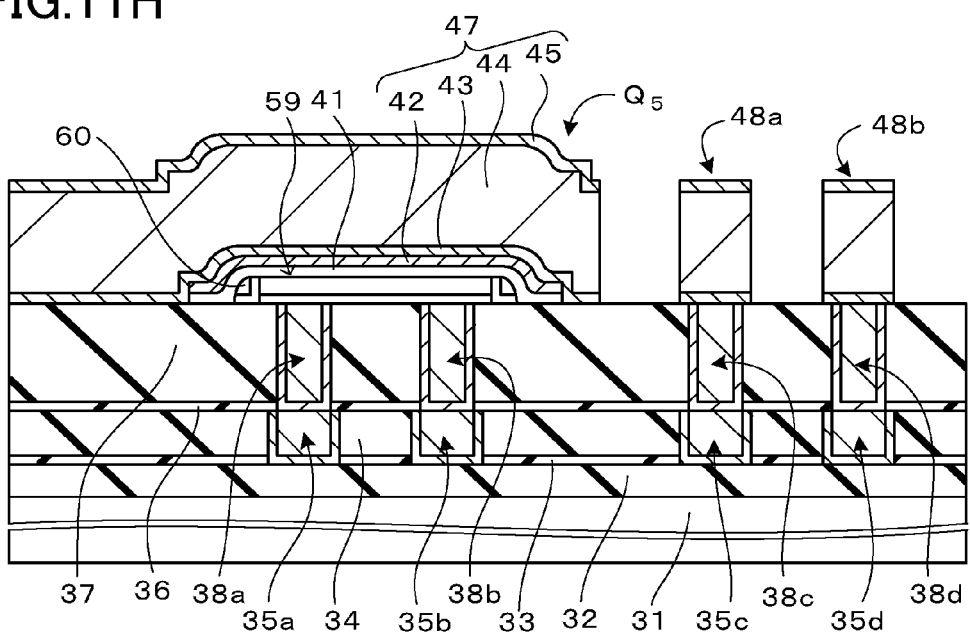

The resist pattern is then removed. Thus, as illustrated in FIG. 11H, the capacitor upper electrode 47 is composed of the upper barrier metal film 45, the main conductive film 44, and the lower barrier metal film 43 left over the capacitor lower electrode 59 and the dielectric film 41. The conductive protection film 42 on the dielectric film 41 forms a part of the capacitor upper electrode 47.

An MIM capacitor element $Q_5$ is thus formed, and is composed of the capacitor upper electrode 47, the dielectric film 41, and the capacitor lower electrode 59.

The upper barrier metal film 45, the main conductive film 44, and the lower barrier metal film 43 left on the route passing over the via plugs 38*c* and 38*d* in the area except the capacitor upper electrode 47 are used as the second-layer wirings 48*a* and 48*b*, and the like.

The planar shapes of the MIM capacitor element $Q_5$, the wirings 48*a* and 48*b*, and the like are substantially similar to the shape of the MIM capacitor element $Q_3$ as illustrated in FIG. 6, for example.

Although not particularly illustrated, similarly to the third embodiment, the fourth silicon oxide film, the third silicon nitride film, and the like are then formed. The third silicon nitride film 51 and the fifth silicon nitride film 52 are formed in order by the CVD method.

In the MIM capacitor element $Q_5$ as described above, the side portion of the capacitor lower electrode 59 is provided with the sidewall 60. Thus, a sharp step-wise level difference is eliminated on each of side surfaces of the capacitor lower electrode 59 on which the dielectric film 41 is formed.

Accordingly, even when the dielectric film 41 and the conductive protection film 42 are formed under or within a large amount or thickness of deposition in the vertical direction over the substrate surface, film thicknesses of the dielectric film 41 and the conductive protection film 42 in the side surfaces of the capacitor lower electrode 59 may become relatively uniform.

Thus, the film thicknesses of the dielectric film 41 and the conductive protection film 42 may become relatively uniform on the side surface of the capacitor lower electrode 59. Thus, the characteristics of the MIM capacitor element $Q_5$ can be prevented from being deteriorated.

Similarly to the third embodiment, the dielectric film 41 of the MIM capacitor element $Q_5$ as well as the conductive protection film 42 formed thereon is patterned successively. Thus, the dielectric film 42 is prevented from being deteriorated due to the plasma, the ion, or the solution in the removing process of the resist pattern 61 as a mask for patterning and in the subsequent rinsing process.

(Sixth Embodiment)

FIG. 12 is an example of a plan view illustrating a semiconductor device according to a sixth embodiment of the invention. FIGS. 13A to 13J are sectional views illustrating steps of forming the semiconductor device according to the sixth embodiment of the invention, when viewed from a I-I line in FIG. 12. FIGS. 14A to 14I are sectional views illustrating steps of forming the semiconductor device according to the sixth embodiment of the invention, when viewed from a II-II line in FIG. 12. In FIG. 12, FIGS. 13A to 13J, and FIGS. 14A to 14I, the same reference symbols and numerals as those in FIGS. 5A to 5J denote similar elements.

In FIG. 12, the semiconductor device has a capacitor element area A, a wiring area B, a fuse area C, a moisture resistant ring area D, and other areas. An MIM capacitor element $Q_6$, a wiring 71, a blowout fuse 67, and a moisture resistant ring 80 are formed in these areas A to D according to the steps described below. The moisture resistant ring 80 is formed into an annular form to surround the semiconductor circuit along the outer peripheral edge of the semiconductor device chip.

A structure of the semiconductor device will be described below along with steps of forming the semiconductor device.

First, as illustrated in FIG. 13A, similarly to the third embodiment, the first silicon oxide film 32, the first silicon nitride film 33, and the second silicon oxide film 34 are formed in this order on the semiconductor substrate 31. The copper wirings 35a and 35c are formed in the capacitor element area A and the wiring area B in the second silicon oxide film 34 and the first silicon nitride film 33 respectively.

In the moisture resistant ring area D, a first ring recess or groove 32g reaching the inside of the semiconductor substrate 31 is formed in the first silicon oxide film 32. Also, a second ring recess or groove 34g, which overlaps with the first ring recess 32g and is formed wider than the first ring recess 32g, is formed in the second silicon oxide film 34 and the first silicon nitride film 33. The first and second ring recesses 32g and 34g are formed into an annular form to surround the semiconductor circuit.

A first ring 63 of a dual damascene structure, which is formed simultaneously with the copper wirings 35a and 35c, is formed in the first and second ring recesses 32g and 34g. The first ring 63 has a stacked layer structure composed of a TiN barrier film and a copper film.

Figure 14A:
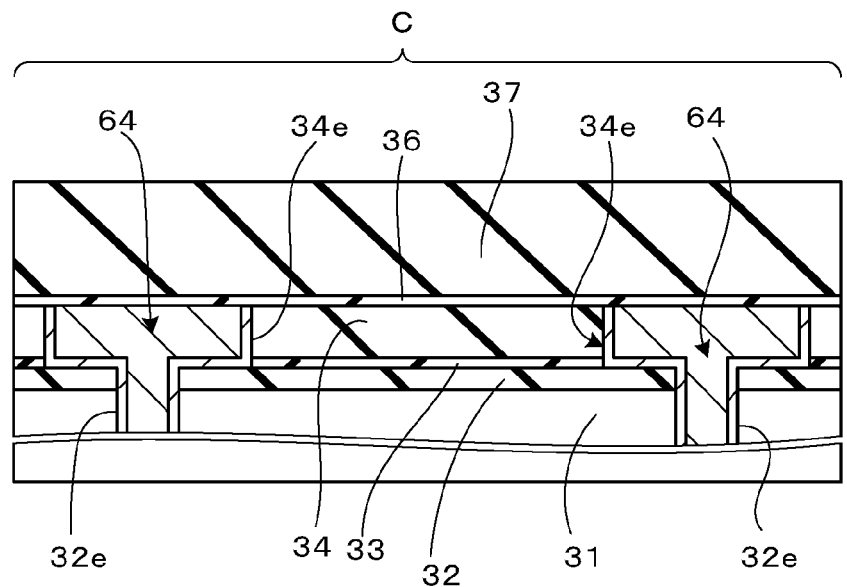
FIGS. 14A to 14I are an example of sectional views illustrating the semiconductor device and steps of forming the same, according to the sixth embodiment of the invention, when viewed from a II-II line in FIG. 12.

In the fuse area C, as illustrated in FIG. 14A, two first crack stopper recesses or grooves 32e having a depth that reaches the inside of the semiconductor substrate 31 are formed in the first silicon oxide film 32 at a distance between the two recesses of about 4 μm. Also, a second crack stopper recess or groove 34e, which overlaps with the first crack stopper recess 32e and is made wider than the first crack stopper recess 32e, is formed in the second silicon oxide film 34 and the first silicon nitride film 33.

First crack stoppers 64 of a dual damascene structure that are formed simultaneously with the copper wirings 35a and 35c are formed in the first and second crack stopper recesses 32e and 34e. The first crack stopper 64 has a stacked layer structure composed of a TiN barrier film and a copper film.

Also, the second silicon nitride film 36 and the third silicon oxide film 37 are formed in this order on the first ring 63, the first crack stoppers 64, the copper wirings 35a and 35c, and the second silicon oxide film 34 by the CVD method.

In this arrangement, as illustrated in FIG. 13B, the third silicon oxide film 37 and the second silicon nitride film 36 are patterned by the photolithography method. Thus, the via holes 37a and 37c are formed on portions of the copper wirings 35a and 35c located in the capacitor element area A and the wiring area B, and also a third ring recess or groove 37g is formed on the first ring 63 in the moisture resistant ring area D.

Figure 14B:
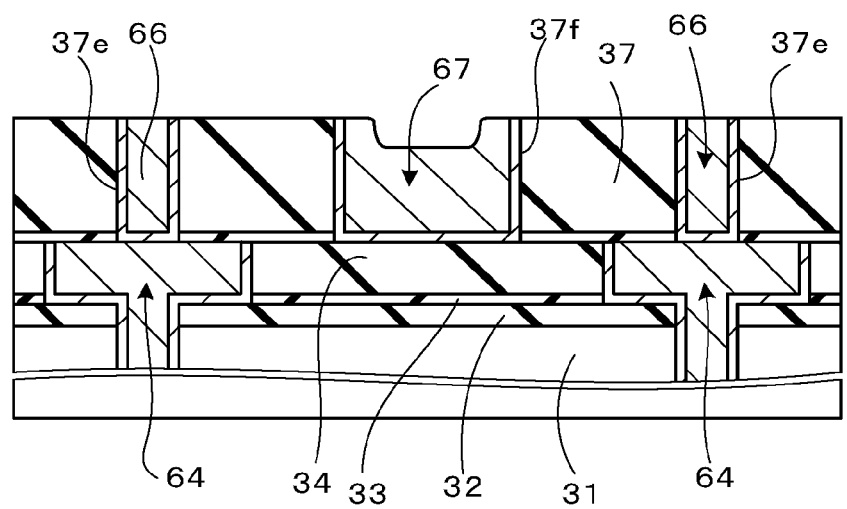

Simultaneously, as illustrated in FIG. 14B, in the fuse area C, two third crack stopper recesses or grooves 37e, each recess being wider than the first crack stopper 64, are formed on the respective first crack stoppers 64, and a fuse recess or groove 37f is formed in the area between the two third crack stopper recesses 37e. The fuse recess 37f has a length of 1.5 μm to 50 μm and a width of about 0.5 μm.

A TiN barrier film and a W film are then formed in the via holes 37a and 37c, the third crack stopper recesses 37e, the third ring recess 37g, and the fuse recess 37f, by the sputtering and the plasma CVD method, respectively.

The TiN barrier film and the W film on the upper surface of the third silicon oxide film 37 are then removed by the CVD method. The TiN barrier film and the W film left in the via holes 37a and 37c, the third ring recess 37g, the third crack stopper recesses 37e, and the fuse recess 37f are used as the via plugs 38a and 38c, a second ring 65, second crack stoppers 66, and the fuse 67, respectively. A dent is produced at the center of the fuse 67 due to the CMP. A form of the dent depends on a width of the fuse to be used. As the width is larger, the depth tends to be deeper.

Figure 13E:
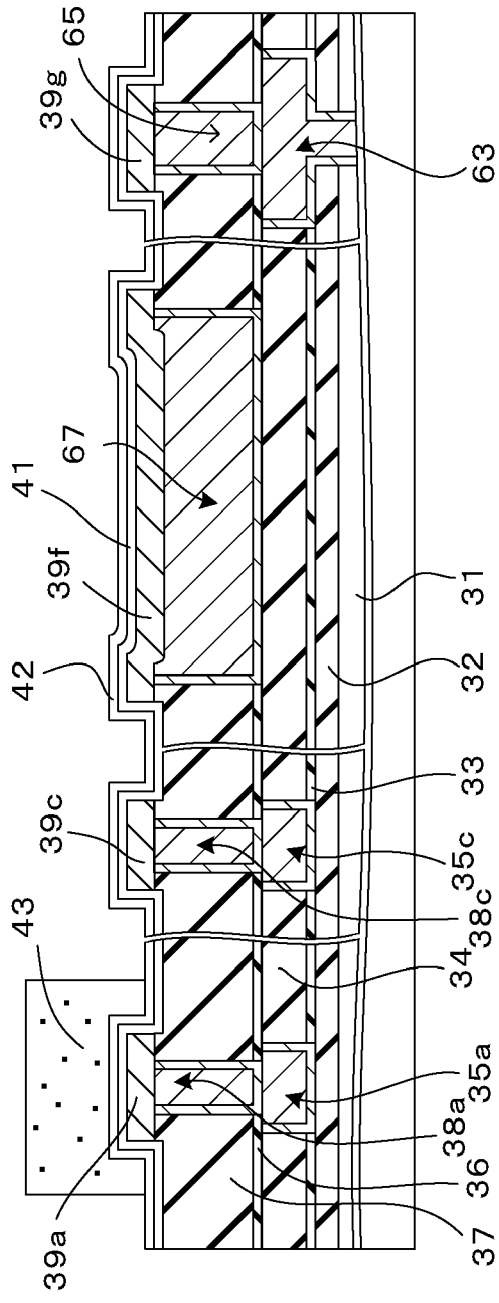
Figure 14C:
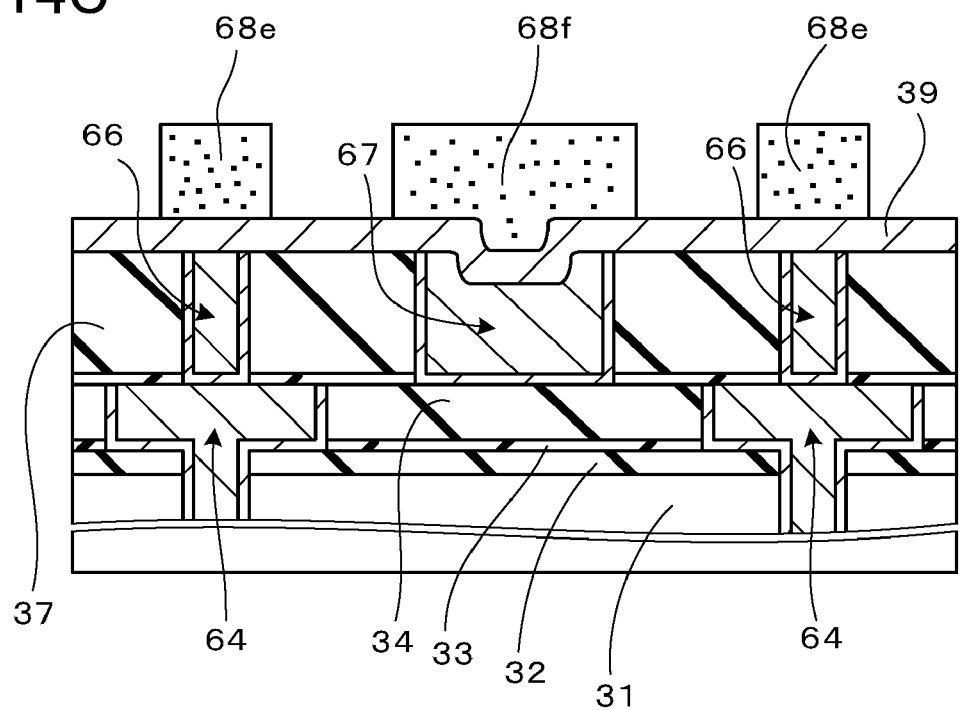

As illustrated in FIG. 13C and FIG. 14C, the lower electrode film 39 for covering the via plugs 38a and 38c, the second ring 65, the second crack stoppers 66, and the fuse 67 is then formed on the third silicon oxide film 37 by the sputtering.

A photoresist is then coated on the lower electrode film 39. Resist patterns are then formed by exposing and developing the photoresist. The thus formed resist patterns include a lower electrode resist pattern 69a for covering the area containing the via plug 38a in the capacitor element area A, a pad resist pattern 68c for covering the via plug 38c in the wiring area B, a fuse resist pattern 68f and crack stopper resist patterns 68e for covering the fuse 67 and the second crack stoppers 66 in the fuse area C respectively, and a ring resist pattern 68g for covering the second ring 65 in the moisture resistant ring area D.

The lower electrode film 39 is then etched by the sputtering, the RIE method, or the like, while using the resist patterns 68a, 68c, 68a, 68f and 68g as a mask. The resist patterns 68a, 68c, 68a, 68f and 68g are then removed.

Figure 14D:
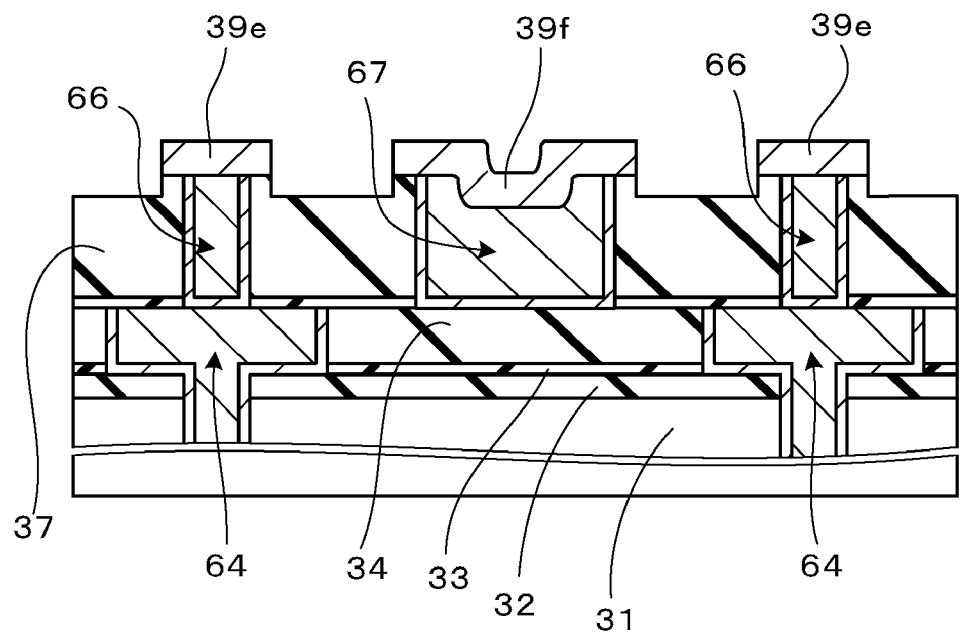

As illustrated in FIG. 13D and FIG. 14D, the lower electrode film 39 patterned in this manner provides the capacitor lower electrode 39a connected to the via plug 38a in the capacitor element area A, the conductive pad 39c for separately covering the via plug 38c in the wiring area B, protection film 39f and third crack stoppers 39e for covering the fuse 67 and the second crack stoppers 66 respectively in the fuse area C, and a conductive pad or third ring 39g for covering the second ring 65 in the moisture resistant ring area D.

In patterning the lower electrode film 39, the lower electrode film 39 is overetched or etched excessively, so that the concave portions 37u are formed on surfaces of the third silicon oxide film 37 that are exposed from the resist patterns 68a, 68c, 68a, 68f and 68g. The overetching is performed to remove unnecessary remaining portions of the lower electrode film 39 other than the desired conductive material portions from the surface of the third silicon oxide film 37 to thereby prevent the leakage current.

Figure 14E:
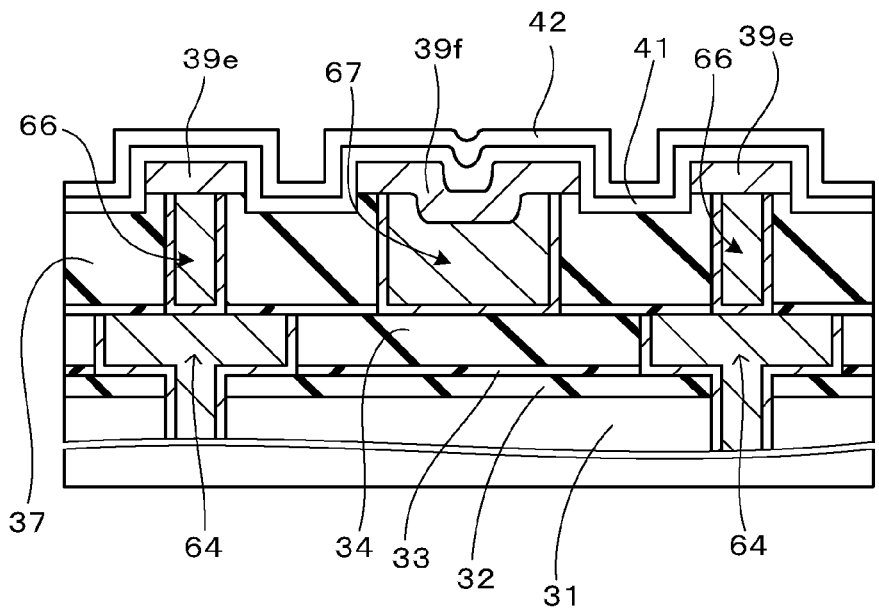

As illustrated in FIG. 13E and FIG. 14E, the dielectric film 41 and the conductive protection film 42 are then formed in this order on the capacitor lower electrode 39a, the conductive pads 39b and 39c, and the like. The dielectric film 41 and the conductive protection film 42 may be formed of a silicon oxide film and a TiN film respectively, for example, similarly to the third embodiment.

A photoresist is then coated on the conductive protection film 42. The capacitor dielectric film resist pattern 43 is then formed on the capacitor lower electrode 39a and the area of portions protruding from its periphery, by exposing and developing the photoresist.

The conductive protection film 42 and the dielectric film 41 are then etched by the sputtering, the RIE method, or the like, for example, while using the resist pattern 43 as a mask. The conductive protection film 42 and the dielectric film 41 are overetched so as to prevent any portion of the material of the conductive protection film 42 from remaining on the surface of the third silicon oxide film 37. The concave portions 37u that are formed on the third silicon oxide film 37 are deepened by this overetching.

Figure 13F:
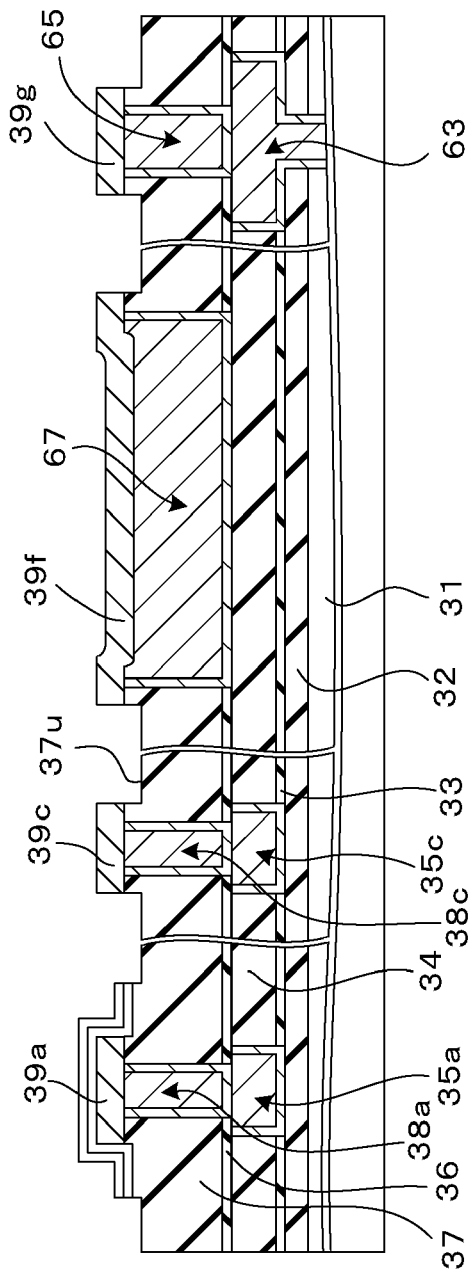
Figure 14F:
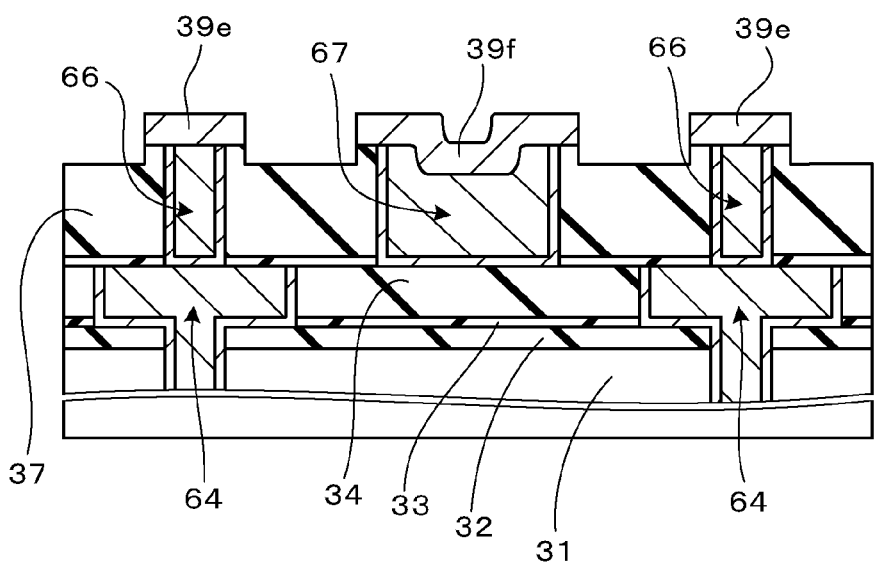

As illustrated in FIG. 13F and FIG. 14F, the resist pattern 43 is then removed by the ashing using the oxygen plasma, for example. In this case, the dielectric film 41 is protected from the plasma, the ion, or the solution by the conductive protection film 42.

Figure 13G:
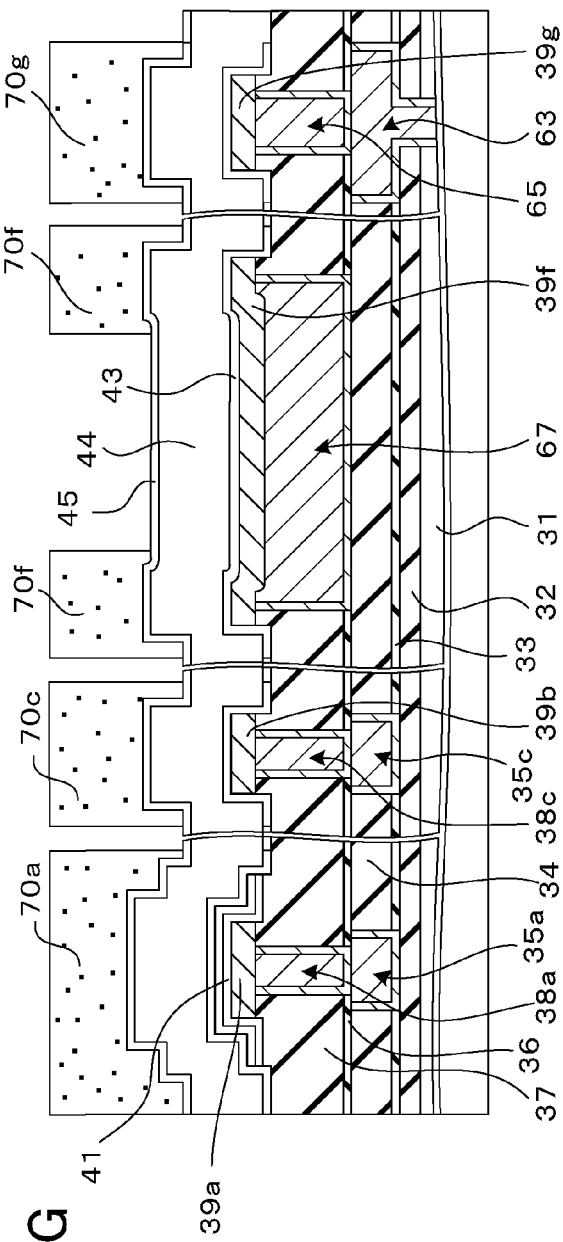
Figure 14G:
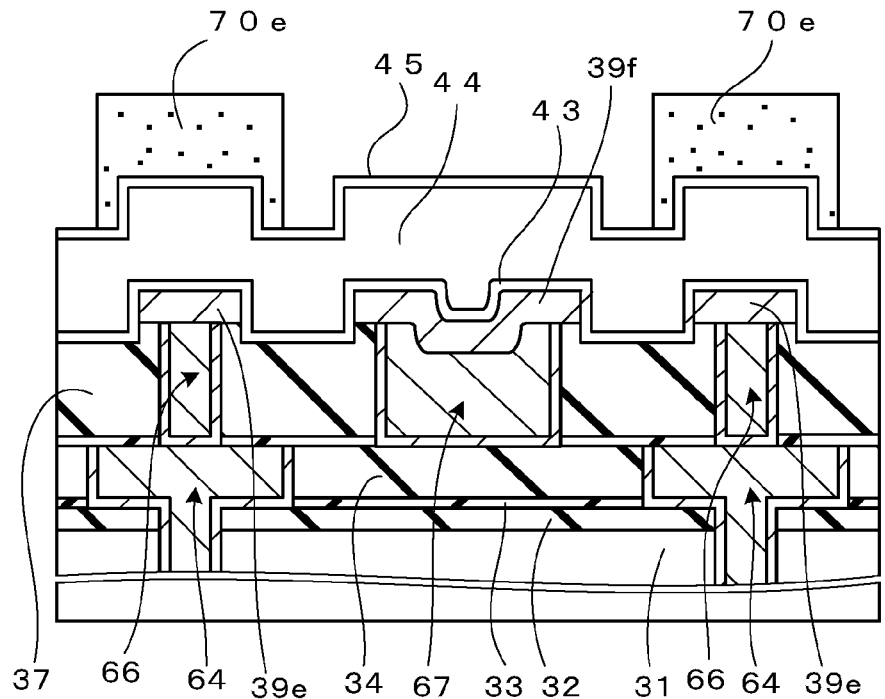

As illustrated in FIG. 13G and FIG. 14G, the lower barrier metal film 43, the main conductive film 44, and the upper barrier metal film 45 are then formed in this order over the conductive protection film 42, the third silicon oxide film 37, and the elements 39b, 39e, 39f and 39g. A Ti adhesive film may be formed as an underlying film of the lower barrier metal film 43.

A photoresist is then coated on the upper barrier metal film 45. Resist patterns are then formed by exposing and developing the photoresist. The thus formed resist patterns include an upper electrode resist pattern 70a, a wiring resist pattern 70c, a fuse electrode resist pattern 70f, crack stopper resist patterns 70e, and a guard ring resist pattern 70g.

In the capacitor element area A, the upper electrode resist pattern 70a has a sized shape that overlaps with the dielectric film 41 and the conductive protection film 42 and protrudes toward their surrounding areas. In the wiring area B, the wiring resist pattern 70c has a shape that overlaps with the via plug 38c. In the fuse area C, the fuse electrode resist pattern 70f is formed in a position that that overlaps with both opposite ends of the fuse 67. Also, the crack stopper resist patterns 70e are formed in ranges that cover the respective second crack stoppers 66. Further, in the moisture resistant ring area D, the guard ring resist pattern 70g is shaped to form an annular frame that overlaps with a third ring 39g.

The lower barrier metal film 43, the main conductive film 44, and the upper barrier metal film 45 are then anisotropically etched by the sputtering, the RIE method, or the like, while using these resist patterns 70a, 70c, 70f, 70e and 70g as a mask. The resist patterns 70a, 70c, 70f, 70e and 70g are then removed.

Figure 13H:
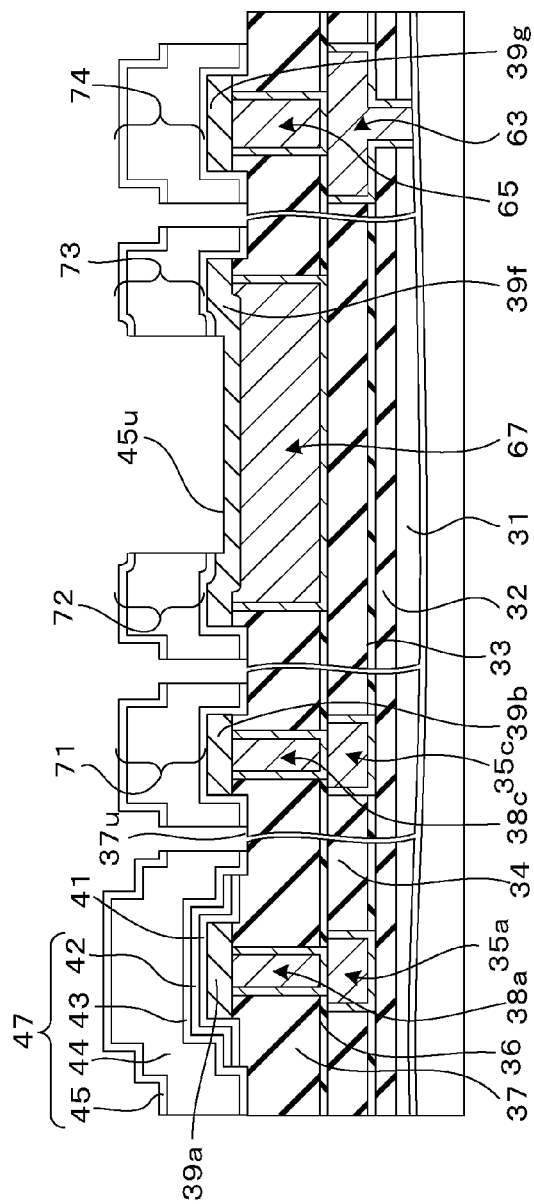
Figure 14H:
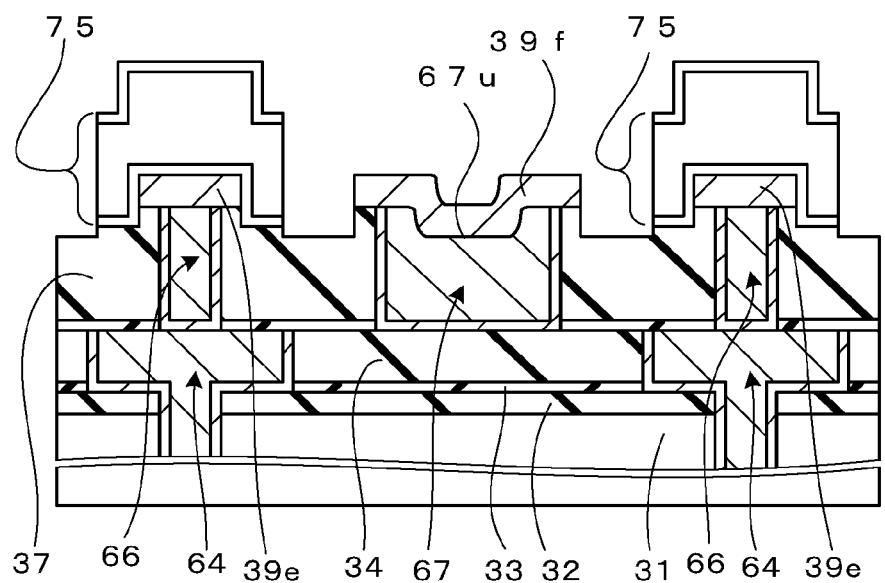

After the lower barrier metal film 43, the main conductive film 44, and the upper barrier metal film 45 are thus patterned, as illustrated in FIG. 13H and FIG. 14H, the capacitor upper electrode 47 is formed in the capacitor element area A, and the wiring 71 connected to the via plug 38c via the conductive pad 39c is formed in the wiring area B. In the fuse area C, electrodes 72 and 73 connected to both opposite ends of the blowout fuse 67 respectively are formed, and fourth crack stoppers 75 are formed on both sides of the blowout fuse 67. A fourth ring 74 is then formed in the moisture resistant ring area D.

Accordingly, in the capacitor element area A, the MIM capacitor element $Q_6$ is composed of the capacitor upper electrode 47, the dielectric film 41, and the capacitor lower electrode 39a. Similarly to the third embodiment, in the MIM capacitor element $Q_6$, the conductive protection film 42 located on the dielectric film 41 becomes a part of the capacitor upper electrode 47, and also acts as a Ti diffusion preventing film when the Ti adhesive film is formed under the dielectric film 41.

The moisture resistant ring 80 is composed of the first to fourth rings 63, 65, 39g and 74. The moisture resistant ring 80 is shaped to form an annular frame along the outer periphery of the substrate, and can prevent the moisture or the like from entering from the outside through boundaries of respective films. Also, the first to fourth crack stoppers 64, 66, 39e and 75 are formed by stacking successively metals or metallic compounds in the vertical, film thickness direction. When the blowout fuse 67 is cut down by the laser irradiation, cracks may be produced by the impact of the laser irradiation. However, these crack stoppers can prevent the cracks from extending outwards.

In patterning the lower barrier metal film 43, the main conductive film 44, and the upper barrier metal film 45, the overetching is used to prevent the metal material from being left on the surface of the third silicon oxide film 37. Accordingly, portions of the concave portions 37u on the surface of the third silicon oxide film 37 is further deepened.

The protection film 39f exposed from the electrodes 72 and 73 in the fuse area C is also thinned due to the overetching with an etchant. Thus, when the blowout fuse 67 is cut down by the laser irradiation, the protection film 39f does not block the laser from cutting down the blowout fuse 67. The protection film 39f exposed from the electrodes 72 and 73 may be removed by the etching it, as illustrated in FIG. 13I. This facilitates the fusion-cutting of the blowout fuse 67.

The material of the mask used in patterning the main conductive film 44 and the like is not limited to the photoresist. Alternatively, for example, a silicon oxide film (not illustrated) may be formed on the photoresist and the upper barrier metal film 45, and then this silicon oxide film may be patterned by using the resist patterns 70a, 70c, 70f, 70e and 70g as a mask. This patterned silicon oxide film may be employed as a hard mask.

Figure 14I:
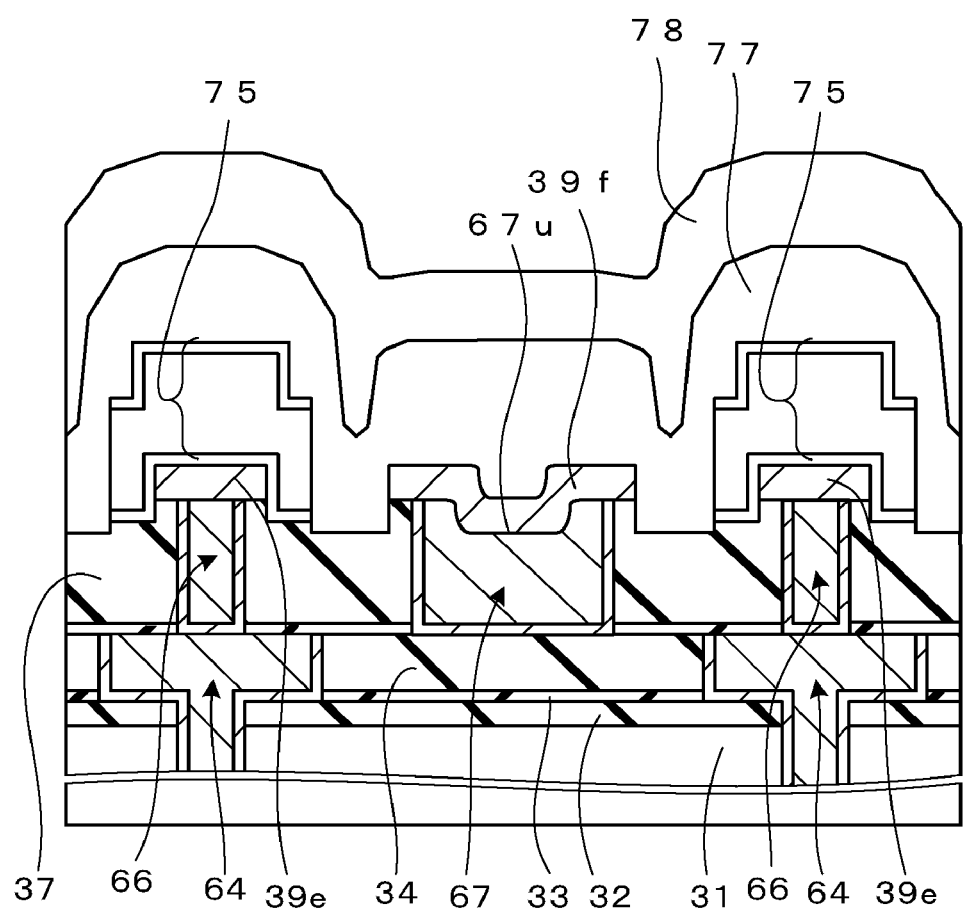

As illustrated in FIG. 13J and FIG. 14I, a fourth silicon oxide film 77 and a third silicon nitride film 78 are then formed.

In the embodiment described above, in forming the capacitor lower electrode 39a by patterning the lower electrode film 39, the lower electrode film 39 is simultaneously patterned in a shape to cover individually the via plug 38c, the blowout fuse 67, and the second crack stoppers 66 and the second ring 65 formed in the wiring area B, the fuse area C, and the moisture resistant ring area D, respectively. In this case, the via plug 38c, the blowout fuse 67, and the second crack stoppers 66 and the second ring 65 are composed of the TiN barrier film and the W film.

The W film may be easily etched depending on the chemicals, liquids or the processing conditions applied to remove the etching residue from the surface of the third silicon oxide film 37. However, the via plug 38c, the blowout fuse 67, and the second crack stoppers 66 and the second ring 65 are covered with the pattern of the lower electrode film 39, and hence are not damaged by the chemicals or the like used in the process.

Figure 15:
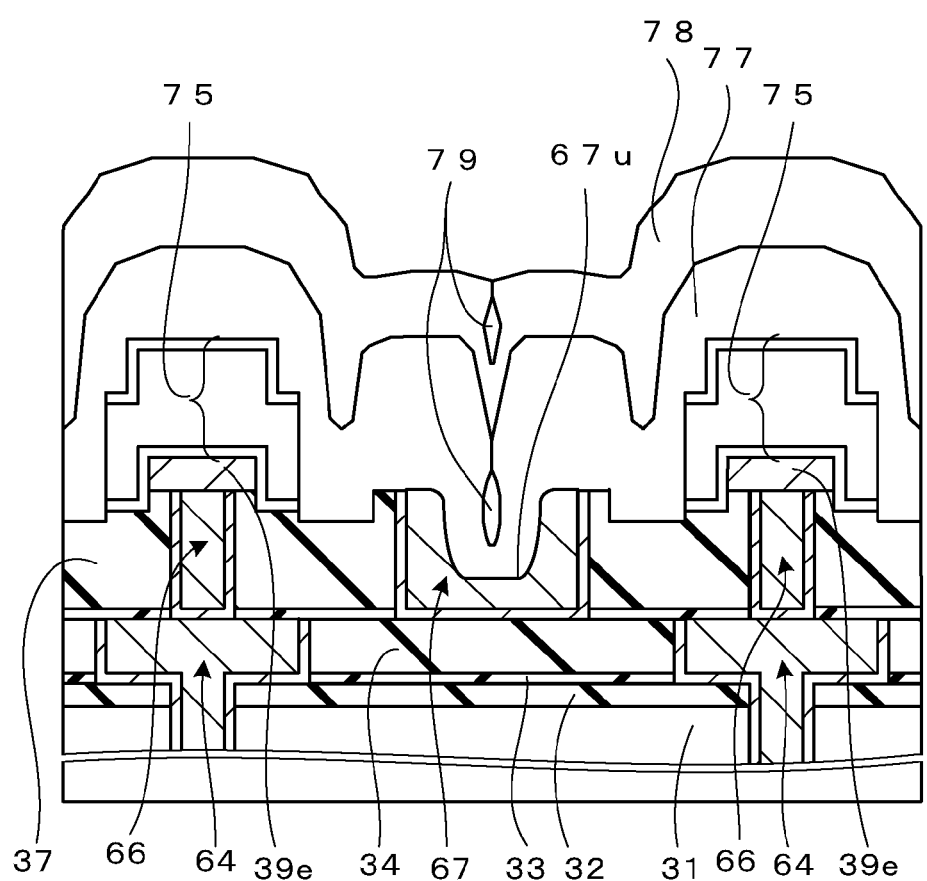
FIG. 15 is a sectional view illustrating a semiconductor device for reference.

When the wet treatment using the chemicals or the like is applied to the surface of the third silicon oxide film 37 in a condition such that the W film of the blowout fuse 67 is not covered with the protection film 39f, the blowout fuse 67 is etched by the chemicals so that a concave portion 67u tends to be further deepened, as illustrated in FIG. 15. As a result, it is assumed that a cavity 79 may tend to easily appear in the fourth silicon oxide film 77 and the third silicon nitride film 78 over the blowout fuse 67. Due to variations of thicknesses and shapes of the upper insulating films, the fusion cutting of the blowout fuse 67 by the laser becomes unstable.

Thus, according to this embodiment, the approach of covering the blowout fuse 67 with the metal film which forms the capacitor lower electrode 39a is effective in preventing a reduction in thickness of the blowout fuse 67.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
    a semiconductor substrate;
    an insulating film formed over the semiconductor substrate;
    a first conductive plug formed in the insulating film;
    a second conductive plug formed in the insulating film;
    a capacitor element comprising a capacitor lower electrode connected to one end of the first conductive plug and formed on the insulating film, a dielectric film formed on an upper surface and side surfaces of the capacitor lower electrode, and a capacitor upper electrode formed on the dielectric film, the capacitor lower electrode comprising a first barrier film, the capacitor upper electrode comprising a second barrier metal film that is wider than the capacitor lower electrode;
    a wiring connected to one end of the second conductive plug and formed on the insulating film, the wiring comprising a first layer and a second layer formed on the first layer, the first layer comprising the first barrier metal film, the second layer comprising the second barrier metal film;
    a fuse formed in the insulating film off to a side of the capacitor element; and
    a protection pattern that covers at least a port of the fuse, the protection pattern comprising a conductive film that is same as that of the capacitor lower electrode.

2. A semiconductor device according to claim 1, wherein an outer periphery of the capacitor upper electrode extends toward outside of an outer periphery of the dielectric film.

3. A semiconductor device according to claim 1, further comprising:
    a conductive protection film formed on an upper surface of the dielectric film and having upper surface and side surfaces joined to a lower surface of the capacitor upper electrode.

4. A semiconductor device according to claim 1, further comprising:
    a sidewall formed on a side surface of the capacitor lower electrode and having an outward and downward sloping surface.

5. A semiconductor device according to claim 1, wherein the second barrier metal film has an adhesive film formed on a surface of the insulating film.

6. A semiconductor device according to claim 1, further comprising:
    a third conductive plug formed in the insulating film off to a side of the capacitor element; and
    a metal pattern that covers the third conductive plug metal pattern, the metal pattern comprising the second metal film of the capacitor upper electrode.

7. A semiconductor device according to claim 1, further comprising:
    a multi-layer metal pattern, a part of which is formed in the insulating film, wherein other parts of the multi-layer metal pattern are formed successively on and under the insulating film respectively, and one of the other parts of the multilayer metal pattern comprises at least one of the first barrier metal film and the second barrier metal film.

8. A semiconductor device, comprising:
    a semiconductor substrate;
    an insulating film formed over the semiconductor substrate;
    a first conductive plug formed in the insulating film;
    a second conductive plug formed in the insulating film;
    a capacitor element comprising a capacitor lower electrode connected to one end of the first conductive plug and formed on the insulating film, a dielectric film formed on an upper surface and side surfaces of the capacitor lower electrode, and a capacitor upper electrode formed on the dielectric film, the capacitor lower electrode comprising a first barrier film, the capacitor upper electrode comprising a second barrier metal film that is wider than the capacitor lower electrode;
    a wiring connected to one end of the second conductive plug and formed on the insulating film, the wiring comprising a first layer and a second layer formed on the first layer, the first layer comprising the first barrier metal film, the second layer comprising the second barrier metal film; and
    a main conductive film formed over the second barrier metal film.

* * * * *